US012567543B2

(12) United States Patent
Yamamoto et al.

(10) Patent No.: US 12,567,543 B2
(45) Date of Patent: Mar. 3, 2026

(54) PHOTOELECTRIC CONVERSION ELEMENT AND SOLAR CELL MODULE

(71) Applicants: Satoshi Yamamoto, Shizuoka (JP); Yuuji Tanaka, Shizuoka (JP)

(72) Inventors: Satoshi Yamamoto, Shizuoka (JP); Yuuji Tanaka, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 18/292,764

(22) PCT Filed: Jun. 30, 2022

(86) PCT No.: PCT/JP2022/026247

§ 371 (c)(1),
(2) Date: Jan. 26, 2024

(87) PCT Pub. No.: WO2023/008085

PCT Pub. Date: Feb. 2, 2023

(65) Prior Publication Data

US 2024/0357919 A1 Oct. 24, 2024

(30) Foreign Application Priority Data

Jul. 29, 2021 (JP) ................................ 2021-124609
Mar. 31, 2022 (JP) ................................ 2022-058731

(51) Int. Cl.
*H01G 9/20* (2006.01)
*H10K 85/10* (2023.01)
(Continued)

(52) U.S. Cl.
CPC ......... *H01G 9/2059* (2013.01); *H10K 85/111* (2023.02); *H10K 85/50* (2023.02);
(Continued)

(58) Field of Classification Search
None
See application file for complete search history.

(56) References Cited

U.S. PATENT DOCUMENTS 3,542,547 A 11/1970 Wilson
3,824,099 A 7/1974 Champ et al.
(Continued)

FOREIGN PATENT DOCUMENTS

CN 112563422 A 3/2021
EP 0892411 A2 1/1999
(Continued)

OTHER PUBLICATIONS

Ghoreishi et al., "Enhanced performance of CH3NH3PbI3 perovskite solar cells via interface modification using phenyl ammonium iodide derivatives", Journal of Power Sources, 473, 2020, All Pages. (Year: 2020).*

(Continued)

*Primary Examiner* — Daniel P Malley, Jr.
(74) *Attorney, Agent, or Firm* — Grüneberg Global IP, PLLC

(57) ABSTRACT

A photoelectric conversion element includes a first electrode, a photoelectric conversion layer, where the photoelectric conversion layer has a perovskite structure, a hole-transporting layer, a second electrode, and a film including a compound represented by General Formula (2) disposed between the photoelectric conversion layer and the hole-transporting layer. In General Formula (2), A is a cationic amino compound represented by General Formula (6) or General Formula (7), a cationic pyridinium compound, a cationic imidazolinium compound, or a cationic pyrrolidinium compound. In General Formula (6), $R_1$ is —H, —F,
(Continued)

—$CF_3$, or —$OCH_3$, n is 1 or 2, and X is Br or I. In General Formula (7), n is an integer of 5 or greater but 12 or less, and X is Br or I.

15 Claims, 5 Drawing Sheets

(51) Int. Cl.

| | |
|---|---|
| ***H10K 85/50*** | (2023.01) |
| *H10K 30/30* | (2023.01) |
| *H10K 30/86* | (2023.01) |
| *H10K 39/10* | (2023.01) |

(52) U.S. Cl.
CPC ............ *H10K 30/30* (2023.02); *H10K 30/86* (2023.02); *H10K 39/10* (2023.02)

(56) References Cited

U.S. PATENT DOCUMENTS

| | | | | |
|---|---|---|---|---|
| 4,123,269 | A | 10/1978 | Von Hoene et al. | |
| 4,150,987 | A | 4/1979 | Anderson et al. | |
| 5,463,057 | A | 10/1995 | Graetzel et al. | |
| 6,028,265 | A | 2/2000 | Ono et al. | |
| 6,153,824 | A | 11/2000 | Takada et al. | |
| 6,278,056 | B1 | 8/2001 | Sugihara et al. | |
| 9,312,495 | B2 | 4/2016 | Pflumm et al. | |
| 2004/0099306 | A1 | 5/2004 | Hara et al. | |
| 2004/0256002 | A1 | 12/2004 | Horiuchi et al. | |
| 2007/0085051 | A1 | 4/2007 | Sohn et al. | |
| 2011/0291082 | A1 | 12/2011 | Terao et al. | |
| 2012/0264343 | A1 | 10/2012 | Wienke et al. | |
| 2015/0279573 | A1 | 10/2015 | Horiuchi et al. | |
| 2016/0218302 | A1 | 7/2016 | Hermes et al. | |
| 2018/0019358 | A1 | 1/2018 | Ahn | |
| 2018/0019360 | A1 | 1/2018 | Mishima et al. | |
| 2018/0019361 | A1 | 1/2018 | Mishima et al. | |
| 2018/0114874 | A1 | 4/2018 | Aranami | |
| 2018/0158976 | A1 | 6/2018 | Ahn | |
| 2018/0218845 | A1 | 8/2018 | Tan et al. | |
| 2018/0226529 | A1 | 8/2018 | Uzu et al. | |
| 2019/0044016 | A1 | 2/2019 | Uzu et al. | |
| 2019/0081189 | A1 | 3/2019 | Mishima et al. | |
| 2020/0058819 | A1 | 2/2020 | Kirner | |
| 2020/0194701 | A1 | 6/2020 | Kirov et al. | |
| 2021/0167287 | A1 | 6/2021 | Horiuchi et al. | |
| 2021/0366662 | A1 | 11/2021 | Horiuchi et al. | |
| 2022/0029114 | A1* | 1/2022 | Ke | H10K 30/80 |
| 2022/0285639 | A1* | 9/2022 | Matsui | H10K 30/86 |
| 2023/0189540 | A1 | 6/2023 | Horiuchi et al. | |
| 2023/0352250 | A1 | 11/2023 | Horiuchi et al. | |

FOREIGN PATENT DOCUMENTS

| | | | |
|---|---|---|---|
| EP | 0911841 | A2 | 4/1999 |
| EP | 1049117 | A2 | 11/2000 |
| EP | 1052661 | A2 | 11/2000 |
| EP | 1083582 | A2 | 3/2001 |
| EP | 4064355 | A1 | 9/2022 |
| JP | 34-005466 | | 6/1959 |
| JP | 45-000555 | | 1/1970 |
| JP | 52-004188 | | 2/1977 |
| JP | 54-058445 | | 5/1979 |
| JP | 55-042380 | | 10/1980 |
| JP | 56-123544 | | 9/1981 |
| JP | 58-065440 | | 4/1983 |
| JP | 60-098437 | | 6/1985 |
| JP | 02-250881 | | 10/1990 |
| JP | 07-500630 | | 1/1995 |
| JP | 09-199744 | | 7/1997 |
| JP | 10-092477 | | 4/1998 |
| JP | 10-093118 | | 4/1998 |
| JP | 10-233238 | | 9/1998 |
| JP | 11-086916 | | 3/1999 |
| JP | 11-204821 | | 7/1999 |
| JP | 11-214730 | | 8/1999 |
| JP | 11-214731 | | 8/1999 |
| JP | 11-238905 | | 8/1999 |
| JP | 11-265738 | | 9/1999 |
| JP | 11-273754 | | 10/1999 |
| JP | 11-273755 | | 10/1999 |
| JP | 2000-026487 | | 1/2000 |
| JP | 2000-106224 | | 4/2000 |
| JP | 2000-323191 | | 11/2000 |
| JP | 2001-052766 | | 2/2001 |
| JP | 2001-059062 | | 3/2001 |
| JP | 2001-076773 | | 3/2001 |
| JP | 2001-076775 | | 3/2001 |
| JP | 2001-257012 | | 9/2001 |
| JP | 2002-164089 | | 6/2002 |
| JP | 2003-007359 | | 1/2003 |
| JP | 2003-007360 | | 1/2003 |
| JP | 2003-031273 | | 1/2003 |
| JP | 2003-264010 | | 9/2003 |
| JP | 2004-063274 | | 2/2004 |
| JP | 2004-095450 | | 3/2004 |
| JP | 2004-115636 | | 4/2004 |
| JP | 2004-200068 | | 7/2004 |
| JP | 2004-235052 | | 8/2004 |
| JP | 2006-032260 | | 2/2006 |
| JP | 2006339199 | A * | 12/2006 |
| JP | 2007-115665 | | 5/2007 |
| JP | 2013-033868 | | 2/2013 |
| JP | 2013-211149 | | 10/2013 |
| JP | 2014-072327 | | 4/2014 |
| JP | 2015-002001 | | 1/2015 |
| JP | 2016-164915 | | 9/2016 |
| JP | 2016-539175 | | 12/2016 |
| JP | 2017-126737 | | 7/2017 |
| JP | 2017-168498 | | 9/2017 |
| JP | 2017-168499 | | 9/2017 |
| JP | 2017-168500 | | 9/2017 |
| JP | 2018-011058 | | 1/2018 |
| JP | 2018-093168 | | 6/2018 |
| JP | 2018-163959 | | 10/2018 |
| JP | 2019-195111 | | 1/2019 |
| JP | 2019-114572 | | 7/2019 |
| JP | 2019-175918 | | 10/2019 |
| JP | 2020-506548 | | 2/2020 |
| JP | 2020-508570 | | 3/2020 |
| JP | 2020-053616 | | 4/2020 |
| JP | 2020-517105 | | 6/2020 |
| JP | 2021-019203 | | 2/2021 |
| JP | 2021-022681 | | 2/2021 |
| JP | 2021-093528 | | 6/2021 |
| JP | 2021-150647 | | 9/2021 |
| JP | 2022-151688 | | 10/2022 |
| WO | WO2004/063283 | A1 | 7/2004 |
| WO | WO2011/030450 | A1 | 3/2011 |
| WO | WO2011/045321 | A1 | 4/2011 |
| WO | WO2013/042699 | A1 | 3/2013 |
| WO | WO2013/121835 | A1 | 8/2013 |
| WO | WO2016/152857 | A1 | 9/2016 |
| WO | WO2016/157979 | A1 | 10/2016 |
| WO | WO2016/158838 | A1 | 10/2016 |
| WO | WO2017/057646 | A1 | 4/2017 |
| WO | WO2017/175491 | A1 | 10/2017 |
| WO | WO2017/195722 | A1 | 11/2017 |
| WO | WO2021/131428 | A1 | 7/2021 |

OTHER PUBLICATIONS

Tsai et al., "Triarylamine-based crosslinked hole-transporting material with an ionic dopant for high-performance PEDOT:PSS-free polymer solar cells", Journal of Materials Chemistry C, All Pages. 2025. (Year: 2015).*

University of Central Florida, "Cells, Modules, Panels and Arrays", https://energyresearch.ucf.edu/consumer/solar-technologies/solar-electricity-basics/cells-modules-panels-and-arrays/, All Pages, 2008. (Year: 2008).*

English machine translation of Horiuchi (JP-2006339199-A) provided by the EPO website, 2025, All Pages. (Year: 2025).*

(56) References Cited

OTHER PUBLICATIONS

Zhang et al. "Interface Engineering of Imidazolium Ionic Liquids toward Efficient and Stable CsPbBr3 Perovskite Solar Cells", ACS Appl. Mater. Interfaces 2020, 12, 4540-4548. (Year: 2020).*
MacFarlane et al. "Pyrrolidinium Imides: A New Family of Molten Salts and Conductive Plastic Crystal Phases", J. Phys. Chem. B 1999, 103, 4164-4170. (Year: 1999).*
Shao et al., "The Role of the Interfaces in Perovskite Solar Cells", Adv. Mater. Interfaces 2020, 7, 1901469. (Year: 2020).*
Ghoreishi et al., "Enhanced Performance of CH3NH3PbI3 perovskite solar cells via interface modification using phenyl ammonium iodide derivatives", Journal of Power Sources 473, 2020, pp. 1-9. (Year: 2020).*
STN structure search conducted by the Examiner on Oct. 17, 2025, All Pages. (Year: 2025).*
Paidi Yella Reddy, et al., "Efficient Sensitization of Nanocrystalline TiO2 Films by a Near-IR-Absorbing Unsymmetrical Zinc Phthalocyanine", Angew. Chem. Int. Ed., vol. 46, published online Dec. 5, 2006, pp. 373-376.
Seung Hun Eom, et al., "Roles of Interfacial Modifiers in Hybrid Solar Cells: Inorganic/Polymer Bilayer vs Inorganic/Polymer:Fullerene Bulk Heterojunction", ACS Appl. Mater. Interfaces, vol. 6, published Dec. 18, 2013, pp. 803-810.
International Search Report Issued Sep. 21, 2022 for counterpart International Patent Application No. PCT/JP2022/026247 filed Jun. 30, 2022.
Yitian Du, et al., "Surface passivation using pyridinium iodide for highly efficient planar perovskite solar cells", Journal of Energy Chemistry, May 6, 2020 (May 6, 2020), vol. 52, pp. 84-91, XP086368563 DOI: 10.1016/J.JECHEM.2020.04.049 external link.
Henning Seim, et al., "Photoactivation of an ionic p-type dopant used in a triarylamine based hole transporting material for enhancing conductivity of solution processed films", Synthetic Metals, vol. 230, Jun. 21, 2017 (Jun. 21, 2017), pp. 105-112, XP085113771, DOI: 10.1016/J.SYNTHMET.2017.05.012 external link.
Ning Wei, et al., 5-Ammonium Valeric Acid Iodide to Stabilize $MAPbI_3$ via a Mixed-Cation Perovskite with Reduced Dimension, The Journal of Physical Chemistry Letters, 2020, vol. 11, pp. 8170-8176.
Essa A. Alharbi, et al., Atomic-level passivation mechanism of ammonium salts enabling highly efficient perovskite solar cells, Nature Communications, 2019, vol. 10, Article No. 3008, pp. 1-9.
Zhong-Sheng Wang, et al., "Thiophene-Functionalized Coumarin Dye for Efficient Dye-Sensitized Solar Cells: Electron Lifetime Improved by Coadsorption of Deoxycholic Acid", J. Phys. Chem. C, 7224-30, vol. 111 (2007).
Suyoung Hwang, et al., "A highly efficient organic sensitizer for dye-sensitized solar cells", Chem. Commun., 4887-4889 (2007).
Tamotsu Horiuchi, et al., "High Efficiency of Dye-Sensitized Solar Cells Based on Metal-Free Indoline Dyes", J. Am. Chem. Soc., 12218-12219, vol. 126 (2004).
Tamotsu Horiuchu, et al., "Highly-efficient metal-free organic dyes for ye-sensitized solar cells", Chem Commun., 3036-3037 (2003).
Daibin Kuang, et al., "Organic Dye-Sensitized Ionic Liquid Based Solar Cells: Remarkable Enhancement in Performance through Molecular Design of Indoline Sensitizers", Angew. Chem. Int. ed., 1923-1927, vol. 47 (2008).
Sanghoon Kim, et al., "Molecular Engineering of Organic Sensitizers for Solar Cell Applications", J. Am. Chem. Soc., vol. 128, No. 51, pp. 16701-16707 (2006).
Nagatoshi Koumura, et al., "Alkyl-Functionalized Organic Dyes for Efficient Molecular Photovoltaics", J. Am. Chem. Soc, vol. 128, No. 44, 14256-14257, vol. 128 (2006).
K. Kalyanasundaram, et al., "Sensitization of $TiO_2$ in the Visible Light Region Using Zinc Porphyrins", J. Phys. Chem., 2342-2347, vol. 91 (1987).
Andreas Kay and Michael Grätzel, "Artificial Photosynthesis. 1. Photosensitization of $TiO_2$ Solar Cells with Chlorophyll Derivatives and Related Natural Porphyrins", J. Phys. Chem., 6272-6277, vol. 97 (1993).
T. Ma et al., "Photoelectrochemical properties of $TiO_2$ electrodes sensitized by porphyrin derivatives with different numbers of carboxyl groups", Journal of Electroanalytical Chemistry, 31-38, vol. 537 (2002).
Journal of Porphyrins and Phthalocyanines, Efficient Near-IR Sensitization of Nanocrystalline $TiO_2$ Films by Zinc and Aluminum Phthalocyanines, vol. 3, 230-237 (1999).
Paidi Yella Reddy, et al., "Efficient Sensitization of Nanocrystalline TiO2 Films by a Near-IR-Absorbing Unsymmetrical Zinc Phthalocyanine", Angew. Chem. Int. Ed., 373-376, vol. 46 (2007).
Seung Hun Eom, et al., "Roles of Interfacial Modifiers in Hybrid Solar Cells: Inorganic/Polymer Bilayer vs. Inorganic/Polymer:Fullerene Bulk Heterojunction", ACS Appl. Mater. Interfaces 2014, 6, 803-810.
Liu, Jiang et al., Lewis-Acid Doping of Triphenylamine-Based Hole Transport Materials Improves the Performance and Stability of Perovskite Solar Cells, ACS Applied Materials & Interfaces, 2020, vol. 12, pp. 23874-23884.
Japanese Office Action mailed on Sep. 26, 2023 for the corresponding Japanese Application No. 2022-058731.
Japanese Office Action mailed on Jan. 16, 2024 for the corresponding Japanese Application No. 2022-058731.
Office Action issued in European patent application No. 22743934.6 on Nov. 21, 2025, 9 pages.
Martinez-Sarti, et al., "Efficient photoluminescent thin films consisting of anchored hybrid perovskite nanoparticles", Chemical Communications, vol. 52, No. 76, XP093336827, Jan. 1, 2016, p. 11351-11354.

* cited by examiner

[Fig. 1A]
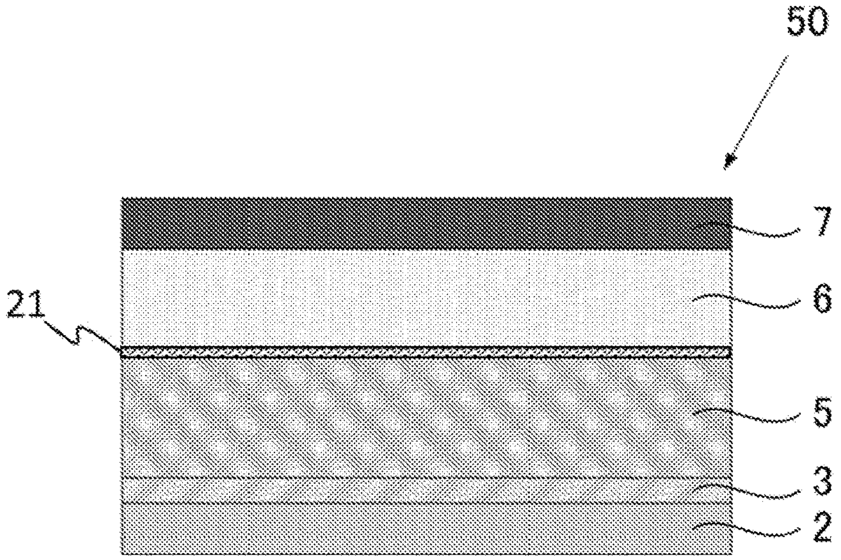
[Fig. 1B]
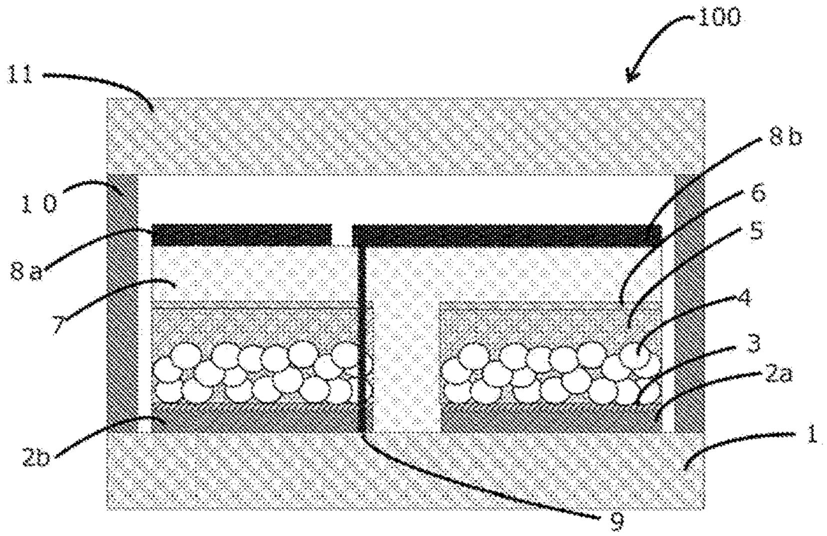
[Fig. 1C]
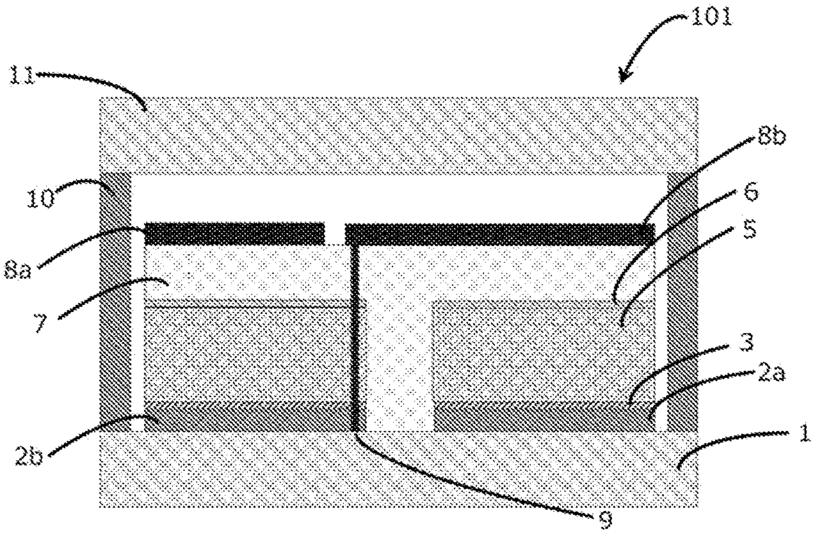

[Fig. 1D]
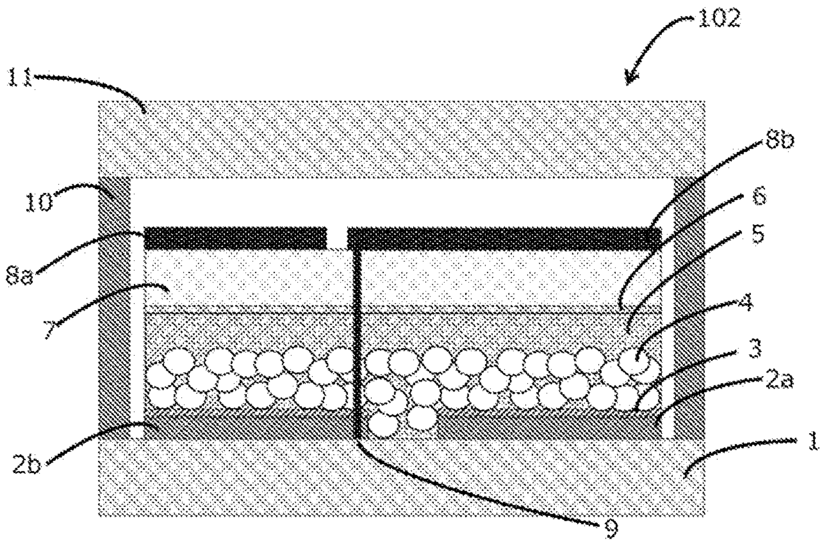
[Fig. 1E]
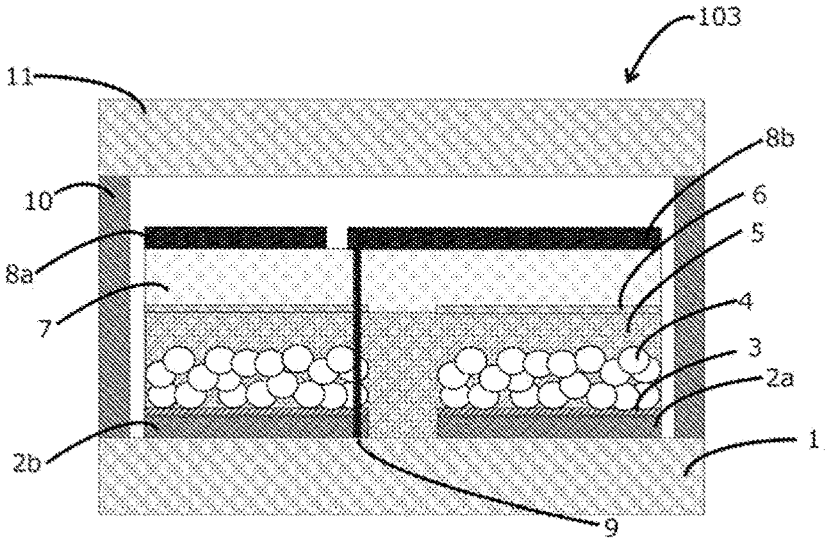
[Fig. 1F]
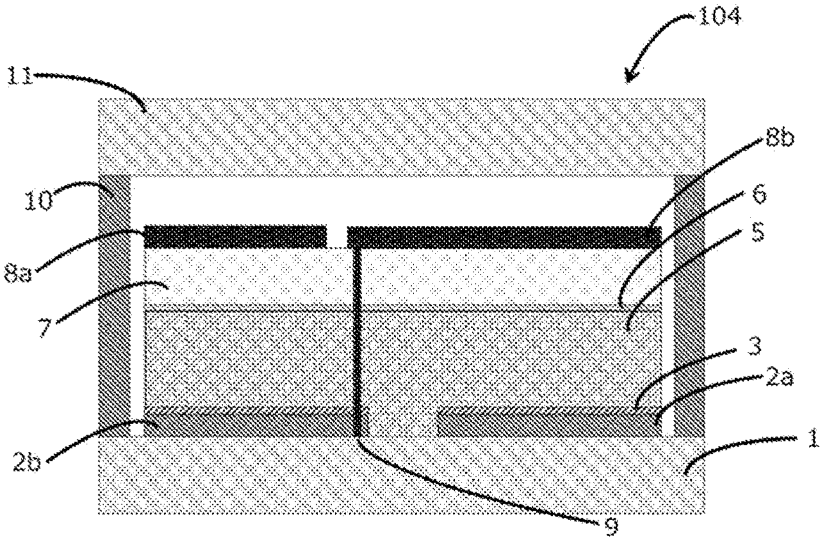

[Fig. 2]
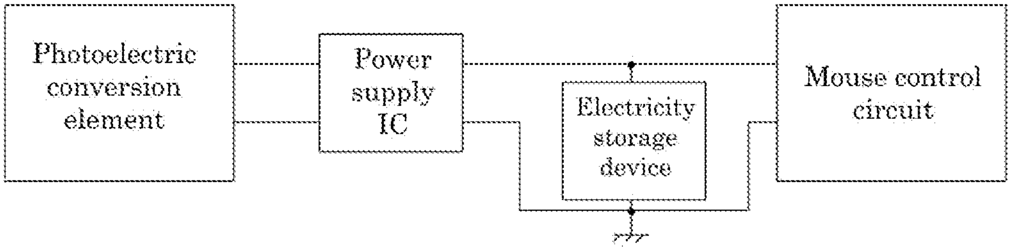
[Fig. 3]
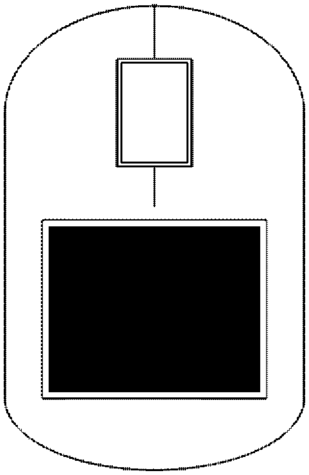
[Fig. 4]
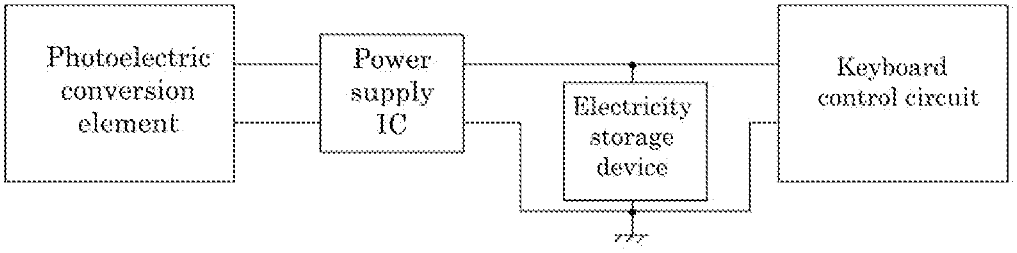
[Fig. 5]
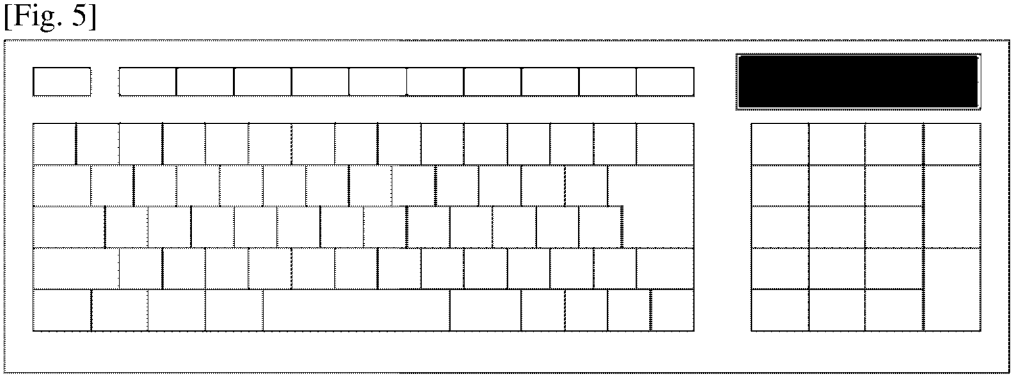

[Fig. 6]
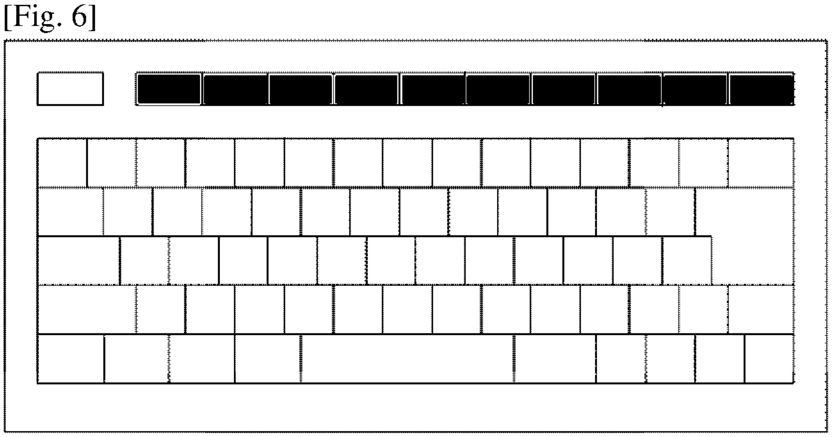
[Fig. 7]
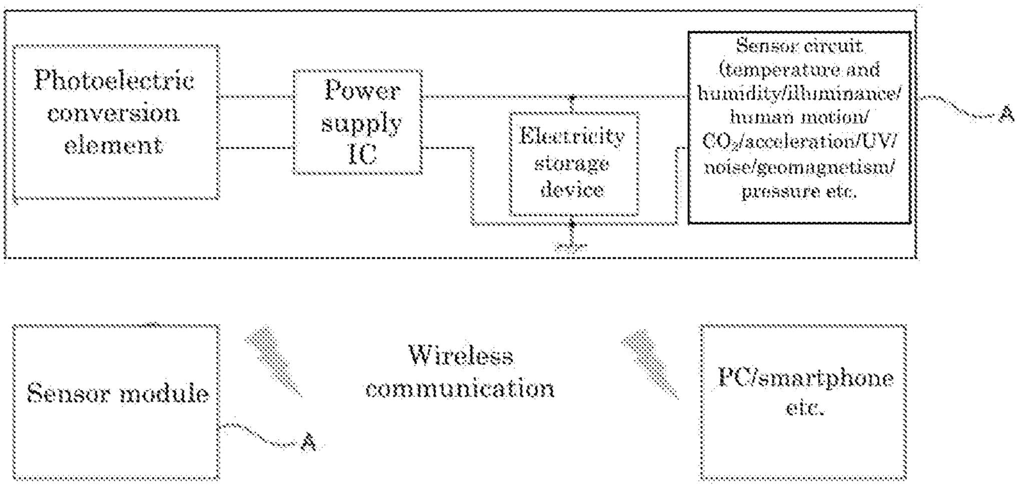
[Fig. 8]
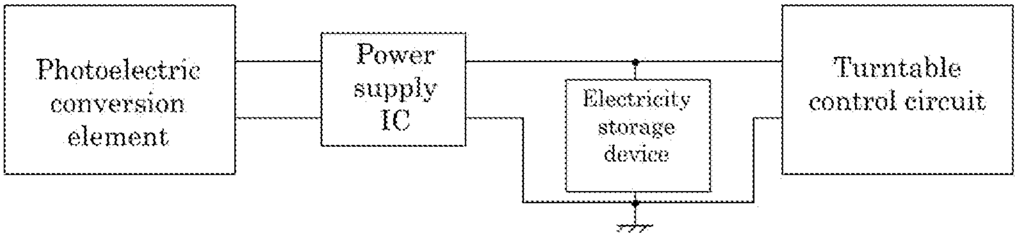
[Fig. 9]
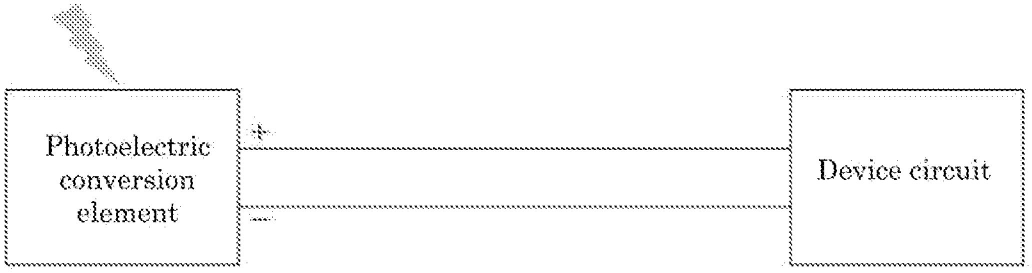

[Fig. 10]
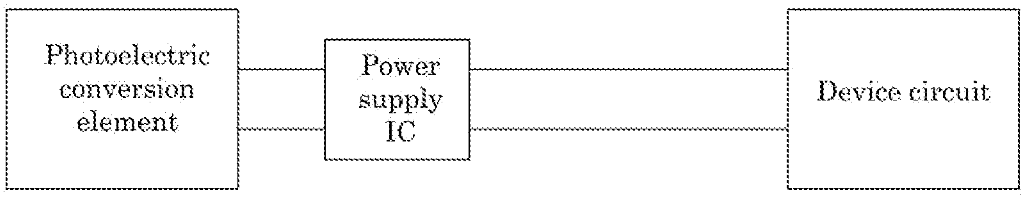
[Fig. 11]
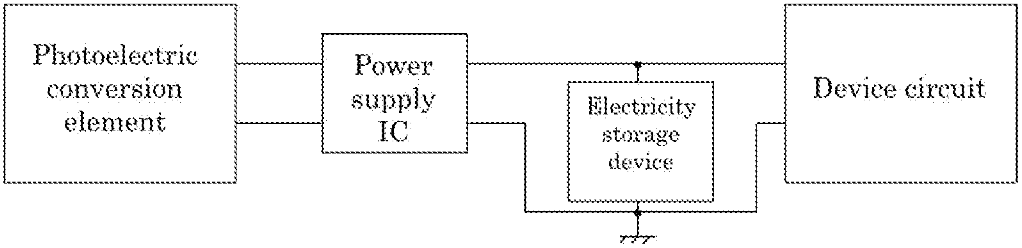
[Fig. 12]
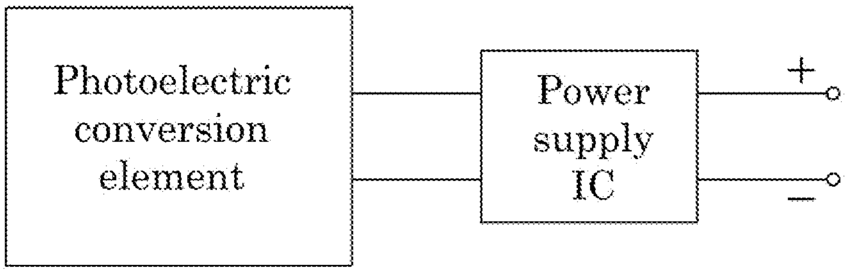
[Fig. 13]
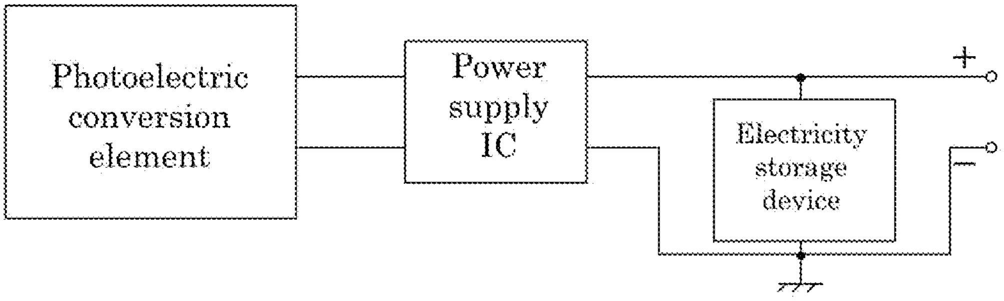

PHOTOELECTRIC CONVERSION ELEMENT AND SOLAR CELL MODULE

CROSS-REFERENCE TO RELATED APPLICATIONS

This application is the National Stage entry under § 371 of International Application No. PCT/JP2022/026247, filed on Jun. 30, 2022, and which claims the benefit of priority to Japanese Application No. 2021-124609, filed on Jul. 29, 2021, and Japanese Application No. 2022-058731 filed on Mar. 31, 2022. The content of each of these applications is hereby incorporated by reference in its entirety.

TECHNICAL FIELD

The present disclosure relates to a photoelectric conversion element, and a solar cell module.

BACKGROUND ART

In recent years, various applications of a solar cell using photoelectric conversion elements have been expected, such as a stand-alone power supply that does not need replacement of batteries or power supply circuits, as well as an alternative to fossil fuels or a countermeasure to global warming. Moreover, a solar cell serving as a stand-alone power supply has attracted strong attentions as one of energy harvesting technologies used for internet of things (IoT) derives or satellites.

As solar cells, there are organic solar cells, such as dye-sensitized solar cells, organic thin film solar cells, and perovskite solar cells, as well as inorganic solar cells using silicon, which have been widely used in the art. The perovskite solar cells have advantages, such as improved safety and low production cost, because perovskite solar cells can be produced by any printing device or method known in the art without using an electrolyte solution including an organic solvent.

Moreover, it has been known that a plurality of photoelectric conversion elements, which are specially divided, are electrically connected to form a series circuit to increase output voltage of an organic thin film solar cell or perovskite solar cell (see, for example, PTL 1).

CITATION LIST

Patent Literature

[PTL 1] Japanese Unexamined Patent Application Publication No. 2020-053616

SUMMARY OF INVENTION

Technical Problem

The present disclosure has an object to provide a photoelectric conversion element that can maintain power generation efficiency even after being exposed to light of high illuminance over a long period.

Solution to Problem

According to one aspect of the present disclosure, a photoelectric conversion element includes a first electrode, a photoelectric conversion layer, a hole-transporting layer, a second electrode, and a film including a compound represented by General Formula (2). The photoelectric conversion layer has a perovskite structure. The film including the compound represented by General Formula (2) is disposed between the photoelectric conversion layer and the hole-transporting layer.

A-X General Formula (2)

In General Formula (2), A is a cationic amino compound represented by General Formula (6) or General Formula (7), a cationic pyridinium compound, a cationic imidazolinium compound, or a cationic pyrrolidinium compound.

[Chem. 1]

General Formula (6)

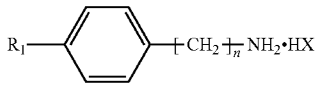

In General Formula (6), $R_1$ is —H, —F, —$CF_3$, or —$OCH_3$, n is 1 or 2, and X is Br or I,

[Chem. 2]

General Formula (7)

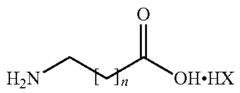

In General Formula (7), n is an integer of 5 or greater but 12 or less, and X is Br or I.

Advantageous Effects of Invention

The present disclosure can provide a photoelectric conversion element that can maintain power generation efficiency even after being exposed to light of high illuminance over a long period.

BRIEF DESCRIPTION OF DRAWINGS

FIG. 1A is a schematic view illustrating an example of a solar cell as an embodiment of a photoelectric conversion element.

FIG. 1B is a schematic view illustrating an embodiment of a solar cell module.

FIG. 1C is a schematic view illustrating another embodiment of the solar cell module.

FIG. 1D is a schematic view illustrating another embodiment of the solar cell module.

FIG. 1E is a schematic view illustrating another embodiment of the solar cell module.

FIG. 1F is a schematic view illustrating another embodiment of the solar cell module.

FIG. 2 is a block diagram of a mouse for a personal computer as an example of an electronic device of the present disclosure.

FIG. 3 is a schematic external view illustrating an example of the mouse of FIG. 2.

FIG. 4 is a block diagram of a keyboard for a personal computer as an example of the electronic device of the present disclosure.

FIG. 5 is a schematic external view illustrating an example of the keyboard of FIG. 4.

FIG. 6 is a schematic external view illustrating another example of the keyboard of FIG. 4.

FIG. 7 is a block diagram of a sensor as an example of the electronic device of the present disclosure.

FIG. 8 is a block diagram of a turntable as an example of the electronic device of the present disclosure.

FIG. 9 is a block diagram illustrating an example of the electronic device of the present disclosure.

FIG. 10 is a block diagram illustrating an example of the electronic device of FIG. 9, into which a power supply IC is incorporated.

FIG. 11 is a block diagram illustrating an example of the electronic device of FIG. 10, into which an electricity storage device is further incorporated.

FIG. 12 is a block diagram illustrating an example of a power supply module of the present disclosure.

FIG. 13 is a block diagram illustrating an example of the power supply module of FIG. 12, into which an electricity storage device is further incorporated.

DESCRIPTION OF EMBODIMENTS (Photoelectric Conversion Element)

The photoelectric conversion element of the present disclosure include a first electrode, a photoelectric conversion layer, a hole-transporting layer, a second electrode, and a film including a compound represented by General Formula (2). The photoelectric conversion layer has a perovskite structure. The film including the compound represented by General Formula (2) is disposed between the photoelectric conversion layer and the hole-transporting layer.

A-X General Formula (2)

In General Formula (2), A is a cationic amino compound represented by General Formula (6) or General Formula (7), a cationic pyridinium compound, a cationic imidazolinium compound, or a cationic pyrrolidinium compound

[Chem. 3]

General Formula (6)

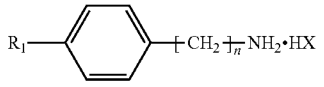

In General Formula (6), $R_1$ is —H, —F, —$CF_3$, or —$OCH_3$, n is 1 or 2, and X is Br or I,

[Chem. 4]

General Formula (7)

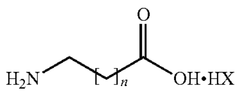

In General Formula (7), n is an integer of 5 or greater but 12 or less, and X is Br or I.

The present inventors have found that a photoelectric conversion element can maintain power generation efficiency even after being exposed to light of high illuminance over a long period, when the photoelectric conversion element includes a film including a compound represented by General Formula (2) disposed between the photoelectric conversion layer and the hole-transporting layer.

The photoelectric conversion element is an element capable of converting optical energy into electric energy, or converting electric energy into optical energy. The photoelectric conversion element is used for a solar cell or a photodiode.

The photoelectric conversion element of the present disclosure includes at least a first electrode, a photoelectric conversion layer, a hole-transporting layer, and a second electrode, and may further include a first substrate, an electron-transporting layer, a second substrate, and other members according to the necessity.

<First Substrate>

A shape, structure, and size of the first substrate are not particularly limited, and may be appropriately selected depending on the intended purpose.

A material of the first substrate is not particularly limited as long as the material has transparency and insolation properties, and may be appropriately selected depending on the intended purpose. Examples thereof include a substrate of glass, a plastic film, or ceramic. Among the above-listed examples, a substrate having heat resistance against a firing temperature is preferable when a step for firing is included in the process for forming an electron-transporting layer as described later. Moreover, the first substrate is more preferably a flexible substrate.

The substrate may be disposed at either or both of the outer sides of the photoelectric conversion element including the outer side that is the side where the first electrode is disposed and the outer side that is the side where the second electrode is disposed.

The substrate disposed at the outer side of the photoelectric conversion element where the first electrode side is disposed is referred to as a first substrate, and the substrate disposed at the outer side of the photoelectric conversion element where the second electrode is disposed is referred to as a second substrate.

The average thickness of the substrate is not particularly limited and may be appropriately selected depending on the intended purpose. For example, the average thickness of the substrate is 50 micrometers or greater but 5 mm or less.

<First Electrode>

A shape and size of the first electrode are not particularly limited, and may be appropriately selected depending on the intended purpose.

A structure of the first electrode is not particularly limited, and may be appropriately selected depending on the intended purpose. The first electrode may have a single-layer structure, or a structure in which a plurality of materials are laminated.

A material of the first electrode is not particularly limited as long as the material is conductive, and may be appropriately selected depending on the intended purpose. Examples of the material of the first electrode include transparent conductive metal oxide, carbon, and metal.

Examples of the transparent conductive metal oxide include tin-doped indium oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminium-doped zinc oxide (referred to as "AZO" hereinafter), indium zinc oxide, and niobium titanium oxide.

Examples of the carbon include carbon black, carbon nanotube, graphene, and fullerene. Examples of the metal include gold, silver, aluminum, nickel, indium, tantalum, and titanium. The above-listed examples may be used alone or in combination. Among the above-listed materials, a transparent conductive metal oxide having high transparency is preferable, and ITO, FTO, ATO, NTO, and AZO are more preferable.

The average thickness of the first electrode is not particularly limited, and may be appropriately selected depending on the intended purpose. The average thickness of the first electrode is preferably 5 nm or greater but 100 micrometers or less, and more preferably 50 nm or greater but 10 micrometers or less. When the material of the first electrode is carbon or metal, the average thickness of the first electrode is preferably the average thickness allowing the first electrode to obtain translucency or transparency.

The first electrode can be formed by any method known in the art, such as sputtering, vapor deposition, and spraying.

Moreover, the first electrode is preferably formed on a substrate. As the first electrode, a commercially available integrated product in which a first electrode has been formed on a substrate in advance can be used.

Examples of the commercially available integrated product include FTO-coated glass, ITO-coated glass, zinc oxide: aluminum-coated glass, FTO-coated transparent plastic films, and ITO-coated transparent plastic films. Examples of other commercially available integrated product include: a glass substrate provided with a transparent electrode where tin oxide or indium oxide is doped with a cation or an anion having a different atomic value; and a glass substrate provided with a metal electrode having such a structure that allows light to pass in the shape of a mesh or stripes.

The above-listed examples may be used alone, or two or more of the above-listed examples may be used together or laminated. Moreover, a metal lead wire may be used in combination for the purpose of reducing an electric resistance value of the first electrode.

In order to produce the below-described photoelectric conversion module by appropriately processing a commercially available integrated electrode, a substrate on which a plurality of first electrodes are formed may be produced.

Examples of a material of the metal lead wire include aluminum, copper, silver, gold, platinum, and nickel.

For example, the metal lead wire can be used in combination by disposing the metal lead wire on the substrate through vapor deposition, sputtering, or pressure bonding, and depositing a layer of ITO or FTO thereon. Alternatively, the metal lead wire can be used in combination by depositing the metal lead wire on ITO or FTO.

<Electron-Transporting Layer>

The electron-transporting layer is a layer configured to transport electrons generated in the below-described photoelectric conversion layer to the first electrode. Therefore, the electron-transporting layer is preferably disposed next to the first electrode.

A shape and size of the electron-transporting layer are not particularly limited and may be appropriately selected depending on the intended purpose.

Moreover, a structure of the electron-transporting layer may be a single layer structure, or multiple layer structure where a plurality of layers are stacked.

The electron-transporting layer includes an electron-transporting material.

The electron-transporting material is not particularly limited, and may be appropriately selected depending on the intended purpose. The electron-transporting material is preferably a semiconductor material.

The semiconductor material is not particularly limited and any of known semiconductor materials may be used. Examples of the semiconductor material include an element semiconductor, and a compound semiconductor.

Examples of the element semiconductor include silicon, and germanium.

Examples of the compound semiconductor include chalcogenide of metal.

Examples of the chalcogenide of metal include oxide of metal (oxide of semiconductor), sulfide of metal, selenide of metal, and a tellurium compound of metal.

Examples of the oxide of metal (oxide of semiconductor) include oxides of titanium, tin, zinc, iron, tungsten, zirconium, hafnium, strontium, indium, cerium, yttrium, lanthanum, vanadium, niobium, tantalum, etc.

Examples of the sulfide of metal include sulfides of cadmium, zinc, lead, silver, antimony, bismuth, etc.

Examples of the selenide of metal include selenides of cadmium, lead, etc.

Examples of the tellurium compound of metal include a tellurium compound of cadmium, etc.

Examples of other compound semiconductors include: phosphides of zinc, gallium, indium, cadmium, etc.; gallium arsenide; copper-indium-selenide; and copper-indium-sulfide. Among the above-listed materials, metal oxide (oxide semiconductor) is preferable, a semiconductor material including at least one selected from titanium oxide, zinc oxide, tin oxide, and niobium oxide is more preferable, and a semiconductor material including tin oxide is particularly preferable.

The above-listed examples may be used alone or in combination. Moreover, a crystal type of the above-mentioned semiconductor is not particularly limited, and may be appropriately selected depending on the intended purpose. The semiconductor may be monocrystalline, polycrystalline, or amorphous.

The electron-transporting layer preferably includes at least one compound selected from the group consisting of a phosphonic acid compound, a boronic acid compound, a sulfonic acid compound, a halogenated silyl compound, and an alkoxysilyl compound on a surface of a film of the electron-transporting material at the side where the photoelectric conversion layer is disposed. Since the electron-transporting layer includes the above-mentioned compound on a surface of the film of the electron-transporting material at the side thereof where the photoelectric conversion layer is disposed, it is expected that physical properties of the interface between the electron-transporting layer and the photoelectric conversion layer can be controlled. In other words, the film of the electron-transporting material is coated with the above-mentioned compound at the side of the surface of the electron-transporting layer where the photoelectric conversion layer is disposed, and therefore the interface resistance between the electron-transporting layer and the photoelectric conversion layer reduces to achieve smooth electron transfer.

The above-mentioned compound may be bonded to the electron-transporting material. Examples of the bond include a covalent bond, and an ionic bond.

The compound is at least one selected from the group consisting of a phosphonic acid compound, a boronic acid compound, a sulfonic acid compound, a halogenated silyl compound, and an alkoxysilyl compound.

The compound preferably includes a nitrogen atom considering compatibility to the below-mentioned photoelectric conversion layer (perovskite layer).

The phosphonic acid compound is not particularly limited as long as the phosphonic acid compound is a compound including a phosphonic acid group, and may be appropriately selected depending on the intended purpose. Specific examples thereof will be listed below.

The boronic acid compound is not particularly limited as long as the boronic acid compound is a compound including a boronic acid group, and may be appropriately selected depending on the intended purpose. Specific examples thereof will be listed below.

The sulfonic acid compound is not particularly limited as long as the sulfonic acid compound is a compound including a sulfonic acid group, and may be appropriately selected depending on the intended purpose. Specific examples thereof will be listed below.

The halogenated silyl compound is not particularly limited as long as the halogenated silyl compound is a compound including a halogenated silyl group, and may be appropriately selected depending on the intended purpose. Specific examples thereof will be listed below.

The alkoxysilyl compound is not particularly limited as long as the alkoxysilyl compound is a compound including an alkoxysilyl group, and may be appropriately selected depending on the intended purpose. Specific examples thereof will be listed below.

A molecular weight of the compound is not particularly limited and may be appropriately selected depending on the intended purpose. For example, the molecular weight of the compound is 100 or greater but 500 or less.

For example, the compound is represented by General Formula (X).

[Chem. 5]

General Formula (X)

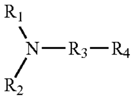

In General Formula (X), $R_1$ and $R_2$ are each a hydrogen atom, an alkyl group, an aryl group, or a heterocycle, where $R_1$ and $R_2$ may be identical or different; $R_3$ is a bivalent alkylene group, a bivalent aryl group, or a bivalent heterocycle; $R_4$ is a phosphonic acid group, a boronic acid group, a sulfonic acid group, a halogenated silyl group, or an alkoxysilyl group; and $R_1$ or $R_2$, $R_3$, and N may form a ring structure together.

Examples of the compound include the following compounds.

[Chem. 6]

(A-01)

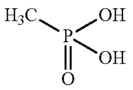

(A-02)

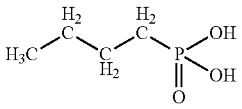

(A-03)

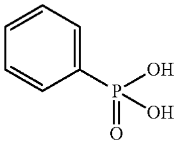

-continued (A-04)

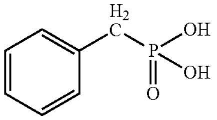

(A-05)

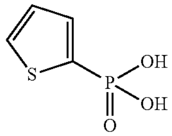

(A-06)

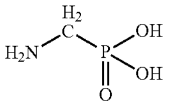

(A-07)

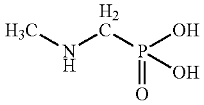

(A-08)

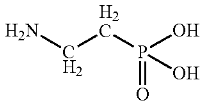

(A-09)

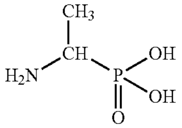

(A-10)

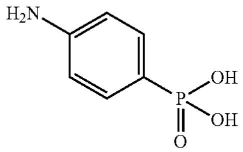

(A-11)

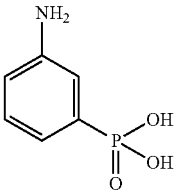

(A-12)

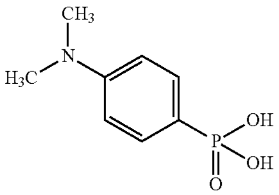

(A-13)

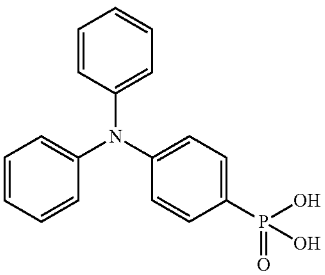

-continued
(A-14)
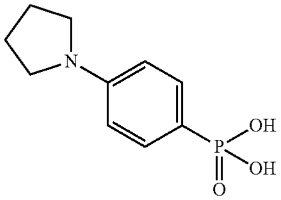
(A-15)
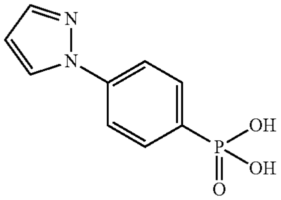
(A-16)
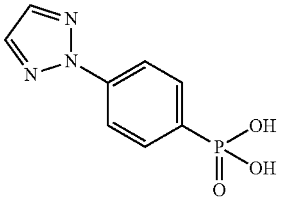
(A-17)
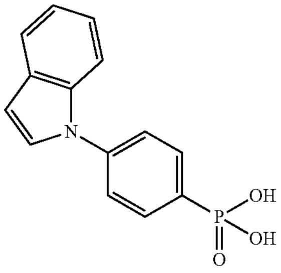
(A-18)
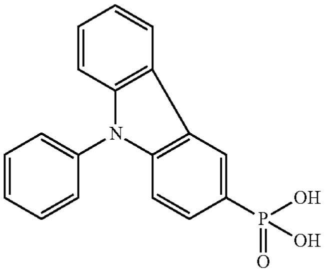
(A-19)
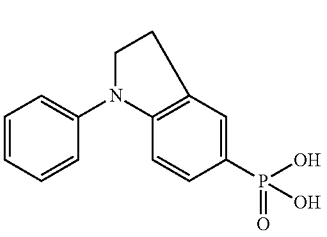
-continued
(A-20)
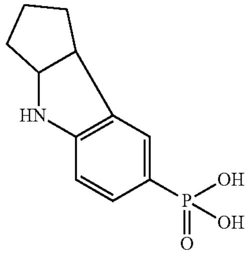
(A-21)
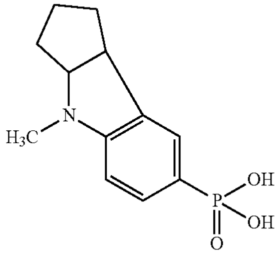
(A-22)
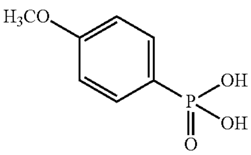
(A-23)
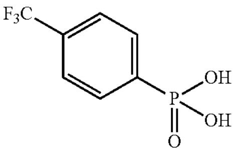
(A-24)
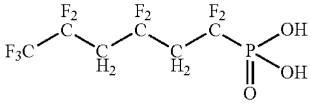
(A-25)
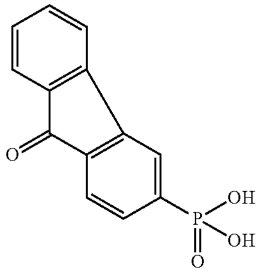
(A-26)
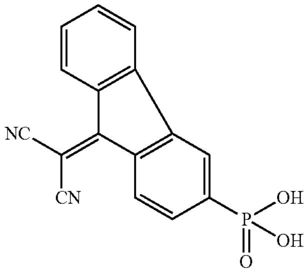

-continued
[Chem. 7]
(A-27)
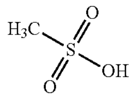
(A-28)
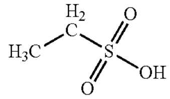
(A-29)
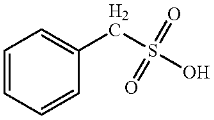
(A-30)
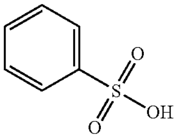
(A-31)
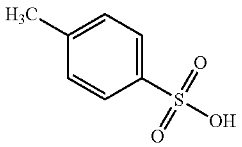
(A-32)
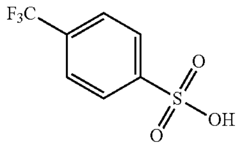
(A-33)
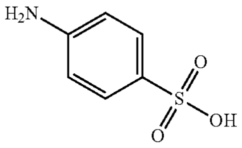
(A-34)
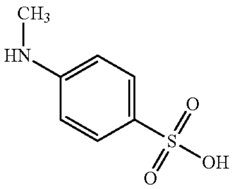
(A-35)
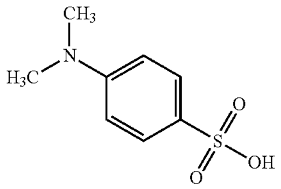
(A-36)
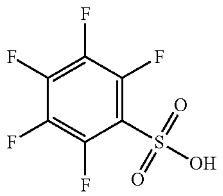
-continued
(A-37)
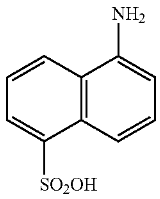
(A-38)
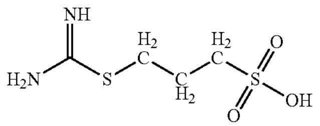
(A-39)
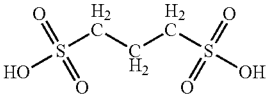
(A-40)
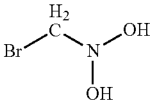
(A-41)
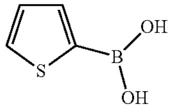
(A-42)
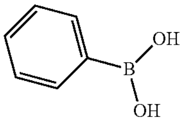
(A-43)
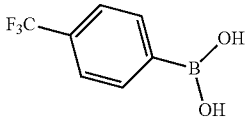
(A-44)
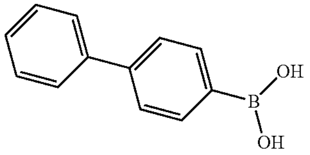
(A-45)
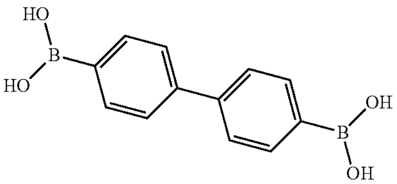
(A-46)
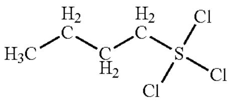
(A-47)
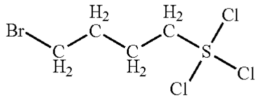

-continued (A-48)

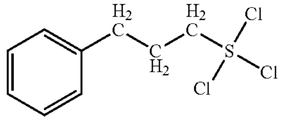

(A-49)

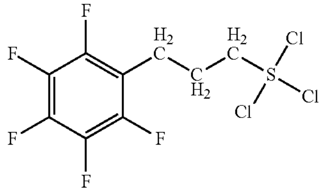

(A-50)

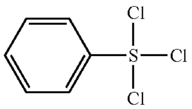

(A-51)

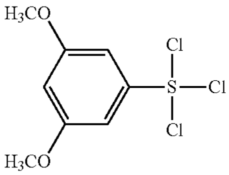

(A-52)

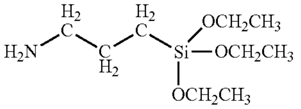

(A-53)

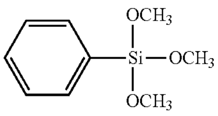

(A-54)

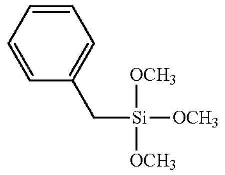

(A-55)

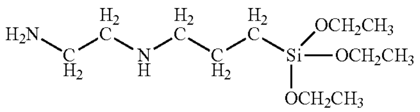

(A-56)

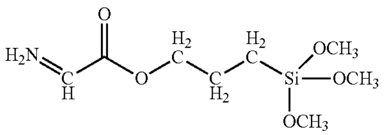

Within the electron-transporting layer, a compound including a substituent reactive with metal oxide, such as phosphonic acid, sulfonic acid, and a halogenated group, may be preferably used to coat the surface of the metal oxide. Specific examples of the compound for covering the surface include, but are not limited to, methylphosphonic acid, phenylphosphonic acid, phenethylphosphonic acid, (1-aminoethyl)phosphonic acid, (2-aminoethyl)phosphonic acid, methanesulfonic acid, benzenesulfonic acid, 2-thienylboronic acid, methyltrichlorosilane, and n-hexyltriethoxysilane.

A thickness of the electron-transporting layer is not particularly limited and may be appropriately selected depending on the intended purpose. The thickness of the electron-transporting layer is preferably 5 nm or greater but 1 micrometer or less, and more 10 nm or greater but 700 nm or less.

A surface of the electron-transporting layer at the side where the photoelectric conversion layer is disposed is preferably as smooth as possible. A roughness factor used as one of indexes representing smoothness is preferably as small as possible. Considering a relationship with the average thickness of the electron-transporting layer, the roughness factor of the surface of the electron-transporting layer at the side where the photoelectric conversion layer is disposed is preferably 20 or less, and more preferably 10 or less. The lower limit of the roughness factor is not particularly limited and may be appropriately selected depending on the intended purpose. For example, the lower limit thereof is 1 or greater.

The roughness factor is a ratio of the actual surface area to an apparent surface area, and is also referred to as the Wenzel roughness factor. The actual surface area can be determined, for example, by measuring a BET specific surface area. The measured PET specific surface area is divided by an apparent surface area to determine a roughness factor.

A method for forming a film of the electron-transporting material of the electron-transporting layer is not particularly limited and may be appropriately selected depending on the intended purpose. Examples of the method include a method where a thin film of the electron-transporting material is formed in vacuum (vacuum film formation method), and a wet film formation method.

Examples of the vacuum film formation method include sputtering, pulsed laser deposition (PLD), ion-beam sputtering, ion-assisted deposition, ion plating, vacuum vapor deposition, atomic layer deposition (ALD), and chemical vapor deposition (CVD).

Examples of the wet film formation method include a sol-gel method. According to the sol-gel method, a solution is subjected to a chemical reaction, such as hydrolysis, polymerization, and condensation, to form a gel, followed by performing a heat treatment to accelerate densification of the gel. When the sol-gel method is used, a coating method of the sol solution is not particularly limited, and may be appropriately selected depending on the intended purpose. Examples of the coating method include dip coating, spray coating, wire bar coating, spin coating, roller coating, blade coating, and gravure coating. Moreover, a wet printing method may be used as the coating method. Examples of the wet printing method include relief printing, offset printing, gravure printing, intaglio printing, rubber plate printing, and screen printing. Moreover, a temperature of a heat treatment performed after applying the sol solution is preferably 80 degrees Celsius or higher, and more preferably 100 degrees Celsius or higher.

A method for applying the compound onto the film of the electron-transporting material is not particularly limited and may be appropriately selected depending on the intended purpose. Examples of the method thereof include a method where a solution including the compound is applied onto a thin film of the electron-transporting material, followed by drying the solution.

The coating method is not particularly limited and may be appropriately selected depending on the intended purpose.

Examples of the coating method include dip coating, spray coating, wire bar coating, spin coating, roller coating, blade coating, and gravure coating.

A temperature for the drying treatment performed after applying the solution is preferably 40 degrees Celsius or higher, and more preferably 50 degrees Celsius or higher.

<Photoelectric Conversion Layer>

The photoelectric conversion layer is not particularly limited as long as the photoelectric conversion layer is a layer that carries out photoelectric conversion, and may be appropriately selected depending on the intended purpose. Examples of the photoelectric conversion layer include a perovskite layer, and a bulk heterojunction layer.

<<Perovskite Layer>>

The perovskite layer is a layer that includes a perovskite compound and is configured to absorb light to sensitize the electron-transporting layer. Therefore, the perovskite layer is preferably disposed next to the electron-transporting layer.

A shape and size of the perovskite layer is not particularly limited and may be appropriately selected depending on the intended purpose.

The perovskite compound is a composite material of an organic compound and an inorganic compound, and is represented by General Formula (3) below.

$$X_\alpha Y_\beta Z_\gamma \qquad \text{General Formula (3)}$$

In General Formula (3), the ratio $\alpha:\beta:\gamma$ is 3:1:1, and $\beta$ and $\gamma$ are each an integer greater than 1, X is a halogen atom, Y is an organic compound including an amino group, and Z is a metal ion.

X in General Formula (3) is not particularly limited and may be appropriately selected depending on the intended purpose. Examples thereof include halogen atoms, such as chloride, bromide, and iodine. The above-listed examples may be used alone or in combination.

Y in General Formula (3) is not particularly limited as long as Y is an organic cation, and may be appropriately selected depending on the intended purpose. Examples thereof include: an alkylamide compound ion, such as methylamine, ethylamine, n-butylamine, and formamidine; and an inorganic alkali metal cation, such as a Sb atom, a Cs atom, an Rb atom, and a K atom. The above-listed examples may be used alone or in combination. The inorganic alkali metal cation and the organic cation may be used in combination. Among the above-listed examples, an organic compound including an amino group is preferable. In case of a perovskite compound of halogenated lead-methyl ammonium, moreover, the peak $\lambda$max of the light absorption spectrum is about 350 nm when the halogen ion is Cl, the peak $\lambda$max of the light absorption spectrum is about 410 nm when the halogen ion is Br, and the peak Amax of the light absorption spectrum is about 540 nm when the halogen ion is I. Since the peak $\lambda$max of the light absorption spectrum sequentially sifts to the longer wavelength side as described, the usable spectrum width (band width) varies.

Z in General Formula (3) is not particularly limited, and may be appropriately selected depending on the intended purpose. Examples thereof include ions of metals, such as lead, indium, antimony, tin, copper, and bismuth. The above-listed examples may be used alone or in combination.

Moreover, the perovskite layer preferably has a layered perovskite structure where layers each formed of halogenated metal and layers each formed by aligning organic cation molecules are alternately laminated.

Moreover, a film thickness of the perovskite layer is preferably 50 nm or greater but 2 micrometers or less, and more preferably 100 nm or greater but 600 nm or less.

A method for forming the perovskite layer is not particularly limited, and may be appropriately selected depending on the intended purpose. Examples thereof include a method where halogenated metal and halogenated alkyl amine or halogenated cesium is dissolved or dispersed to prepare a solution, the solution is applied, and the applied solution is dried.

Moreover, examples of a method for forming the perovskite layer include a two-step precipitation method where a solution obtained by dissolving or dispersing halogenated metal is applied, and dried, and the resultant is immersed in a solution obtained by dissolving halogenated alkyl amine to form a perovskite compound.

Furthermore, examples of the method for forming the perovskite layer include a method where a solution obtained by dissolving or dispersing halogenated metal and halogenated alkyl amine is applied with adding a poor solvent of the perovskite compound (a solvent having low dissolving power against to the perovskite compound), to precipitate crystals. In addition, examples of the method for forming the perovskite layer include a method where halogenated metal is deposited through vapor deposition in an atmosphere filled with gas including methyl amine.

Among the above-listed examples, preferable is the method where a solution obtained by dissolving or dispersing halogenated metal and halogenated alkyl amine with adding a poor solvent of the perovskite compound to precipitate crystals.

A method for applying the solution is not particularly limited, and may be appropriately selected depending on the intended purpose. Examples thereof include immersion, spin coating, spray coating, dip coating, roller coating, and air knife coating. Moreover, the method for applying the solution may be a method where precipitation is performed in a supercritical fluid using carbon dioxide etc.

Moreover, the perovskite layer may include a sensitization compound.

A method for forming the perovskite layer including the sensitization compound is not particularly limited and may be appropriately selected depending on the intended purpose. Examples thereof include a method where the perovskite compound and the sensitization compound are mixed, and a method where the sensitization compound is adsorbed after forming the perovskite layer.

The sensitization dye is not particularly limited as long as the sensitization dye is a compound that can be photoexcited upon application of excitation light, and may be appropriately selected depending on the intended purpose.

Examples of the sensitization dye include a metal complex compound, a coumarin compound, a polyene compound, an indoline compound, a thiophene compound, a cyanine dye, a merocyanine dye, a 9-arylxanthene compound, a triarylmethane compound, a phthalocyanine compound, and a polyphyrin compound.

Examples of the metal complex compound includes metal complex compounds disclosed in Japanese Translation of PCT International Application Publication No. 07-500630, Japanese Unexamined Patent Application Publication No. 10-233238, Japanese Unexamined Patent Application Publication No. 2000-26487, Japanese Unexamined Patent Application Publication No. 2000-323191, and Japanese Unexamined Patent Application Publication No. 2001-59062.

Examples of the coumarin compound include coumarin compounds disclosed in Japanese Unexamined Patent Application Publication No. 10-93118, Japanese Unexamined Patent Application Publication No. 2002-164089, Japanese Unexamined Patent Application Publication No. 2004-95450, and J. Phys. Chem. C, 7224, Vol. 111 (2007).

Examples of the polyene compound include polyene compounds disclosed in Japanese Unexamined Patent Application Publication No. 2004-95450, and Chem. Commun., 4887 (2007).

Examples of the indoline compound include indoline compounds disclosed in Japanese Unexamined Patent Application Publication No. 2003-264010, Japanese Unexamined Patent Application Publication No. 2004-63274, Japanese Unexamined Patent Application Publication No. 2004-115636, Japanese Unexamined Patent Application Publication No. 2004-200068, Japanese Unexamined Patent Application Publication No. 2004-235052, J. Am. Chem. Soc., 12218, Vol. 126 (2004), Chem. Commun., 3036 (2003), and Angew. Chem. Int. Ed., 1923, Vol. 47 (2008).

Examples of the thiophene compound include thiophene compounds disclosed in J. Am. Chem. Soc., 16701, Vol. 128 (2006), and J. Am. Chem. Soc., 14256, Vol. 128 (2006). Examples of the cyanine dye include cyanine dyes disclosed in Japanese Unexamined Patent Application Publication No. 11-86916, Japanese Unexamined Patent Application Publication No. 11-214730, Japanese Unexamined Patent Application Publication No. 2000-106224, Japanese Unexamined Patent Application Publication No. 2001-76773, and Japanese Unexamined Patent Application Publication No. 2003-7359.

Examples of the merocyanine dye include merocyanine dyes disclosed in Japanese Unexamined Patent Application Publication No. 11-214731, Japanese Unexamined Patent Application Publication No. 11-238905, Japanese Unexamined Patent Application Publication No. 2001-52766, Japanese Unexamined Patent Application Publication No. 2001-76775, and Japanese Unexamined Patent Application Publication No. 2003-7360. Examples of the 9-arylxanthene compound include 9-arylxanthene compounds disclosed in Japanese Unexamined Patent Application Publication No. 10-92477, Japanese Unexamined Patent Application Publication No. 11-273754, Japanese Unexamined Patent Application Publication No. 11-273755, and Japanese Unexamined Patent Application Publication No. 2003-31273.

Examples of the triarylmethane compound include triarylmethane compounds disclosed in Japanese Unexamined Patent Application Publication No. 10-93118, and Japanese Unexamined Patent Application Publication No. 2003-31273.

Examples of the phthalocyanine compound and the polyphyrin compound include phthalocyanine compounds and polyphyrin compounds disposed in Japanese Unexamined Patent Application Publication No. 09-199744, Japanese Unexamined Patent Application Publication No. 10-233238, Japanese Unexamined Patent Application Publication No. 11-204821, Japanese Unexamined Patent Application Publication No. 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

Among the above-listed examples, the metal complex compound, the indoline compound, the thiophene compound, and the polyphyrin compound are preferable.

<<Bulk Heterojunction Layer>>

The bulk heterojunction layer includes an organic electron-donating material and an organic electron-withdrawing material.

Since the organic electron-donating material (organic p-type semiconductor) and organic electron-withdrawing material (organic n-type semiconductor) are mixed in the bulk heterojunction layer, the bulk heterojunction, which is a PN junction of nano-scale, is formed. Since the bulk heterojunction is formed, electric current is yielded utilizing photoelectric separation occurring at the junction.

<<<Organic Electron-Donating Material (p-Type Organic Semiconductor)>>>

Examples of the organic p-type semiconductor include conjugated polymers and low molecular weight compound, such as polythiophene or a derivative thereof, an arylamine derivative, a stilbene derivative, oligothiophene or a derivative thereof, a phthalocyanine derivative, porphyrin or a derivative thereof, polyphenylene vinylene or a derivative thereof, polythienylene vinylene or a derivative thereof, a benzodithiophene derivative, and a diketopyrrolopyrrole derivative. The above-listed examples may be used alone or in combination.

Among the above-listed examples, polythiophene or a derivative thereof, which is a π-conjugated conductive polymer, is preferable. The polythiophene and the derivative thereof have advantages that excellent tacticity can be secured, and solubility thereof to a solvent is relatively high.

The polythiophene or derivative thereof is not particularly limited as long as the polythiophene or derivative thereof is a compound having a thiophene skeleton, and may be appropriately selected depending on the intended purpose. Examples thereof include polyalkylthiophene (e.g., poly-3-hexylthiophene), polyalkylisothionaphthene (e.g., poly-3-hexylisothionaphthene, poly-3-octylisothionaphthene, and poly-3-decylisothionaphthene), and polyethylenedioxythiophene.

In recent years, moreover, derivatives, such as PTB7 (poly({4,8-bis[(2-ethylhexyl)oxy]benzo[1,2-b: 4,5-b']dithiophene-2,6-diyl}{3-fluoro-2-[(2-ethylhexyl) carbonyl] thieno[3,4-b]thiophenediyl})), and PCDTBT (poly[N-9"-heptadecanyl-2,7-carbazole-alt-5,5-(4',7'-di-2-thienyl-2',1',3'-benzothiadiazole)]), which are copolymers including benzodithiophene, carbazole, benzotriazole, and thiophene, have been known as a compound capable of yielding excellent photoelectric conversion efficiency.

Not only conjugated polymers, moreover, but also a low molecular weight compound, in which an electron-donating unit and an electron-withdrawing unit are bonded, is known as a compound capable of yielding excellent photoelectric conversion efficiency. Such low molecular weight compounds are suitable used for the present disclosure (see, for example, ACS Appl. Mater. Interfaces 2014, 6, 803-810).

Among the above-mentioned low molecular weight compounds as the organic electron-donating material, a compound represented by General Formula (A) is preferable.

[Chem. 8]

General Formula (A)

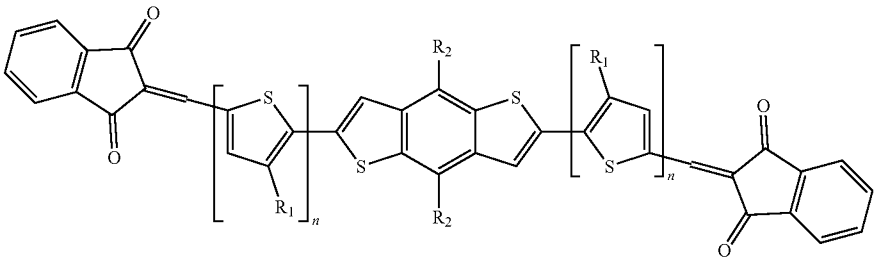

In General Formula (A), n is an integer of from 1 through 3; $R_1$ is a n-butyl group, a n-hexyl group, a n-octyl group, a n-decyl group, and a n-dodecyl group; and $R_2$ is an oxygen atom including a C6-C22 alkyl group, a sulfur atom including a C6-C22 alkyl group, a carbon atom including a C6-C22 alkyl group, or a group represented by General Formula (B). Among the above-listed examples, $R_2$ is preferably an oxygen atom including a C6-C20 alkyl group, a sulfur atom including a C6-C20 alkyl group, a carbon atom including a C6-C20 alkyl group, or a group represented by General Formula (B).

[Chem. 9]

General Formula (B)

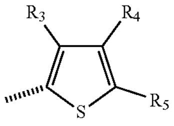

In General Formula (B), $R_3$ and $R_4$ are each a hydrogen atom or a C6-C22 alkyl group; and $R_5$ is an alkyl group that may have a C6-C22 branched chain. Among the above-listed examples, $R_5$ is preferably an alkyl group that may have a C6-C12 branched chain.

More specifically, a low-molecular weight compound as the organic electron-donating material is preferably a compound represented by General Formula (C).

[Chem. 10]

General Formula (C)

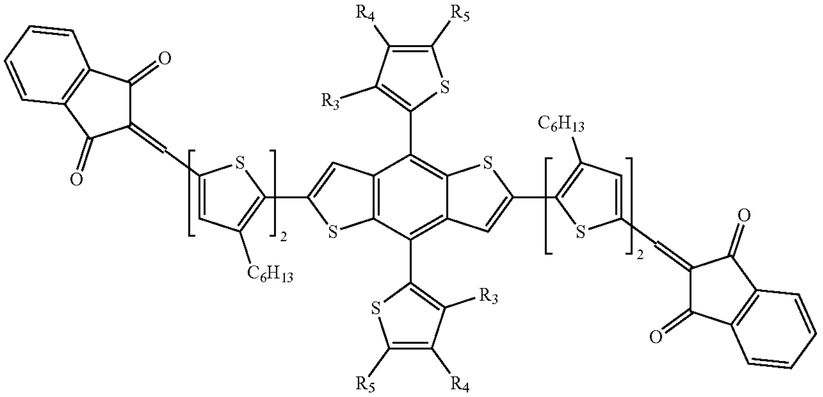

In General Formula (C), $R_3$ and $R_4$ are each a hydrogen atom or a C6-C12 alkyl group, and are each preferably a hydrogen atom or a C6-C10 alkyl group; $R_5$ is an alkyl group that may have a C6-C22 branched chain, and is preferably an alkyl group that may have a C6-C12 branched chain.

Specific examples of the compound represented by General Formula (C) are listed below, but are not limited to the following examples.

TABLE 1

| | Exemplary Compound | | |
|---|---|---|---|
| | $R_3$ | $R_4$ | $R_5$ |
| 1 | H | H | 2-ethylhexyl |
| 2 | H | n-hexyl | n-hexyl |
| 3 | H | H | n-hexyl |
| 4 | n-hexyl | H | n-hexyl |
| 5 | H | H | 2-butyloctyl |
| 6 | H | n-octyl | 2-octyl |
| 7 | H | H | 2-octyl |
| 8 | n-octyl | H | 2-octyl |
| 9 | H | H | 2-decyldodecyl |
| 10 | H | n-dodecyl | n-dodecyl |
| 11 | H | H | n-dodecyl |
| 12 | n-dodecyl | H | n-dodecyl |

<<<Organic Electron-Withdrawing Material (Organic n-Type Semiconductor)>>>

Examples of the organic electron-withdrawing material include an imide derivative, fullerene, and a fullerene derivative. Among the above-listed examples, a fullerene derivative is preferable considering charge separation and charge transportation.

The fullerene derivative may be appropriately synthesized for use, or may be selected from commercial products for use. Examples thereof include PC71BM (phenyl C71 butyric acid methyl ester, available from Frontier Carbon Corporation), PC61BM (phenyl C61 butyric acid methyl ester, available from Frontier Carbon Corporation), PC85BM (phenylC85 butyric acid methyl ester, available from Frontier Carbon Corporation), and ICBA (indene-fullerene bisadduct, available from Frontier Carbon Corporation). In addition to the above, examples thereof also include a fulleropyrrolidine-based fullerene derivative represented by General Formula (D).

[Chem. 11]

General Formula (D)

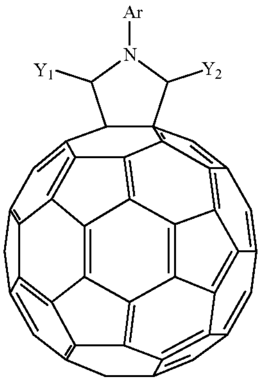

In General Formula (D), $Y_1$ and $Y_2$ may be identical or different, and are each a hydrogen atom, an alkyl group that may include a substituent, an alkenyl group that may include a substituent, an alkynyl group that may include a substituent, an aryl group that may include a substituent, and an aralkyl group that may include a substituent.

Note that, both $Y_1$ and $Y_2$ are not hydrogen atoms at the same time.

Ar is an aryl group that may include a substituent.

Specific examples of the aryl group include a phenyl group, a naphthyl group, an anthryl group, and a phenanthryl group. Among the above-listed examples, a phenyl group is preferable.

A substituent of the aryl group that may include a substituent, which is represented by Ar, is preferably free from an oxygen atom. Examples of the substituent include an aryl group, an alkyl group, a cyano group, an alkoxy group, and an alkoxycarbonyl group.

Among the above-listed substituents, examples of the aryl group include a phenyl group. Examples of the alkyl group, and the alkyl group site of the alkoxy group include C1-C22 alkyl groups, similarly to the below-described alkyl groups represented by $Y_1$ and $Y_2$. The number of the substituents and the substitution sites are not particularly limited. For example, 1 to 3 substituents may be present at appropriate sites of the aryl group represented by Ar.

As the groups represented by $Y_1$ and $Y_2$, the alkyl groups are preferably C1-C22 alkyl groups, more preferably C1-C12 alkyl groups, and particularly preferably C6-C12 alkyl groups. The alkyl groups may be of a straight chain or a branched chain, but the alkyl groups are preferably branched alkyl groups.

The alkyl group may include one or more heterogeneous elements, such as S and O, in the carbon chain thereof.

As the groups represented by $Y_1$ and $Y_2$, the alkenyl groups are preferably C2-C10 alkenyl groups. Particularly preferable specific examples of the alkenyl groups include C2-C4 straight chain or branched chain alkenyl groups, such as vinyl groups, 1-propenyl groups, allyl groups, isopropenyl groups, 1-butenyl groups, 2-butenyl groups, 3-butenyl groups, 1-methyl-2-propenyl groups, and 1,3-butedienyl groups.

As the groups represented by $Y_1$ and $Y_2$, the alkynyl groups are preferably C1-C10 alkynyl groups. Particularly preferable specific examples of the alkynyl groups include C2-C4 straight chain or branched chain alkynyl groups, such as ethynyl groups, 1-propynyl groups, 2-propynyl groups, 1-methyl-2-propynyl groups, 1-butynyl groups, 2-butynyl groups, and 3-butynyl groups.

Examples of the aryl groups as the groups represented by $Y_1$ and $Y_2$ include phenyl groups, naphthyl groups, anthryl groups, and phenanthryl groups.

Examples of the aralkyl groups as the groups represented by $Y_1$ and $Y_2$ include C7-C20 aralkyl groups, such as 2-phenylethyl, benzyl, 1-phenylethyl, 3-phenylpropyl, and 4-phenylbutyl.

As described above, the groups represented by $Y_1$ and $Y_2$ (e.g., the alkyl group, the alkenyl group, the alkynyl group, the aryl group, or the aralkyl group) may include a substituent, or may not include a substituent.

Examples of the substituent that may be included in the groups represented by $Y_1$ and $Y_2$ include an alkyl group, an alkoxycarbonyl group, a polyether group, an alkanoyl group, an amino group, an aminocarbonyl group, an alkoxy group, an alkylthio group, a group represented by —CONHCOR' (where R' is an alkyl group), a group represented by —C(═NR')—R" (where R' and R" are each an alkyl group), and a group represented by —NR'═CR"R'" (where R', R", and R'" are each an alkyl group).

Example of the polyether group, among the above-listed the substituent, include a group represented by $Y_3$—$(OY_4)$n-O—, where $Y_3$ is a monovalent hydrocarbon group, such as an alkyl group, and $Y_4$ is a bivalent aliphatic hydrocarbon group.

Specific examples of the repeating unit represented by —$(OY_4)$n- in the polyether group represented by the above-presented formula include alkoxy chains represented by —$(OCH_2)$n-, —$(OC_2H_4)$n-, and —$(OC_3H_6)$n-, where the repeating number n of the repeating unit is preferably from 1 through 20, and more preferably from 1 through 5. The repeating unit represented by —$(OY_4)$n- may include one identical repeating unit, or may include two or more different repeating units. Among the above-listed repeating units, each of —$OC_2H_4$— and —$OC_3H_6$— may be a straight chain or a branched chain.

Among the above-listed substituents, moreover, the alkyl group, and the alkyl group site (R' or R") in the alkoxycarbonyl group, the alkanoyl group, the alkoxy group, the alkylthio group, the polyether group, the group represented by —CONHCOR', the group represented by —C(═NR')—R", and the group represented by —NR'═CR"R" are each preferably a C1-C22 alkyl group, more preferably a C1-C12 alkyl group, and particularly preferably a C6-C12 alkyl group, similarly to the above-described alkyl group.

The amino group, and the amino group site in the aminocarbonyl group are each particularly preferably an amino group to which one or more C1-C20 alkyl groups are bonded.

Examples of a compound having a preferable performance among the fullerene derivatives represented by General Formula (D) include a compound where Ar is a phenyl group that may include a substituent or may not include a substituent, one of $Y_1$ and $Y_2$ is a hydrogen atom, and the other is an alkyl group including an alkoxycarbonyl group as a substituent, an alkyl group including an alkoxy group as a substituent, an alkyl group including a polyether group as a substituent, an alkyl group including an amino group as a substituent, or a phenyl group that may include a substituent or may not include a substituent.

Among the above-listed compounds, an example of the compound having a particularly preferable performance is a compound where Ar a phenyl group including an phenyl group, a cyano group, an alkoxy group, an alkoxycarbonyl group, or an alkyl group as a substituent, or a phenyl group that does not include a substituent; one of $Y_1$ and $Y_2$ is a hydrogen atom, and the other is an alkyl group including an alkoxycarbonyl group as a substituent, an alkyl group including an alkoxy group as a substituent, an alkyl group including a polyether group as a substituent, a phenyl group, a phenyl group including an alkyl group as a substituent, a phenyl group including an alkoxycarbonyl group as a substituent, or a phenyl group including an alkoxy group as a substituent.

The above-listed compounds are each a compound that includes a group having appropriate polarity introduced into a pyrrolidine skeleton, and having excellent self-organizationability. When a photoelectric conversion layer having a bulk heterojunction structure is formed, therefore, a photoelectric conversion unit having a bulk heterojunction structure having an appropriate layer separation structure can be formed. As a result, electron mobility improves to achieve high conversion efficiency.

The most preferable compound is a compound where Ar is a phenyl group, one of $Y_1$ and $Y_2$ is a hydrogen atom, and the other is an unsubstituted alkyl group (C4-C6 alkyl group), an unsubstituted phenyl group, a 1-naphthyl group, or a 2-naphthyl group.

A formation method of the bulk heterojunction layer is not particularly limited and may be appropriately selected depending on the intended purpose. Examples thereof include spin coating, blade coating, slit die coating, screen printing, bar coating, die coating, transfer printing, dip coating, inkjet printing, spray coating, and vacuum vapor deposition. Among the above-listed methods, the formation method may be appropriately selected depending on intended properties of an organic material film to be produced, such as thickness control, and orientation control.

When spin coating is performed, for example, a concentration of the organic p-type semiconductor and the organic n-type semiconductor is preferably 5 mg/mL or greater but 40 mg/mL or less. Since the concentration is controlled within the above-mentioned range, a uniform organic material film can be easily produced.

In order to remove the organic solvent from the produced organic material film, annealing may be performed under reduced pressure or in an inert atmosphere (e.g., a nitrogen or argon atmosphere). A temperature of the annealing is preferably 40 degrees Celsius or higher but 300 degrees Celsius or lower, and more preferably 50 degrees Celsius or higher but 200 degrees Celsius or lower. Since the annealing is performed, the laminated layer are permeated with each other at the interface thereof to increase an effective area in contact to increase short circuit current. The annealing may be performed after forming an electrode.

The organic solvent is not particularly limited and may be appropriately selected depending on the intended purpose. Examples of the organic solvent include methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, tirhclorobenzene, chloronaphthalene, dimethylformamide, dimethylsulfoxide, N-methylpyrrolidone, and γ-butyrolactone. The above-listed examples may be used alone or in combination. Among the above-listed examples, chlorobenzene, chloroform, and o-dichlorobenzene.

Moreover, 0.1% by mass or greater but 10% by mass or less of an additive may be added to the organic solvent in order to control the phase separation structure between the organic p-type semiconductor and the organic n-type semiconductor. Examples of the additive include diiodoalkane (e.g., 1,8-diiodooctane, 1,6-diiodohexane, and 1,10-diiododecane), alkane diol (e.g., 1,8-octanediol, 1,6-hexanediol, and 1,10-decanediol), 1-chloronaphthalene, and a polydimethylsiloxane derivative.

The average thickness of the photoelectric conversion layer is preferably 50 nm or greater but 400 nm or less, and more preferably 60 nm or greater but 250 nm or less. When the average thickness thereof is 50 nm or greater, light is sufficiently absorbed by the photoelectric conversion layer and thus a sufficient amount of carriers is generated. When the average thickness thereof is 400 nm or less, desirable transfer efficiency of carriers generated by light absorption can be secured.

<Film Including Compound Represented by General Formula (2)>

The photoelectric conversion element of the present disclosure includes a film including a compound represented by General Formula (2) disposed between the photoelectric conversion layer and the hole-transporting layer.

A-X General Formula (2)

In General Formula (2), A is a cationic amino compound represented by General Formula (6) or General Formula (7), a cationic pyridinium compound, a cationic imidazolinium compound, or a cationic pyrrolidinium compound, and X is a halogen ion.

[Chem. 12]

General Formula (6)

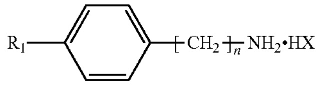

In General Formula (6), $R_1$ is —H, —F, —$CF_3$, or —$OCH_3$, n is 1 or 2, and X is Br or I.

[Chem. 13]

General Formula (7)

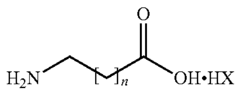

In General Formula (7), n is an integer of 5 or greater but 12 or less, and X is Br or I.

Specific examples of General Formula (6) include, but are not limited to, (E-1) to (E-12) below.

[Chem. 14]

(E-1)

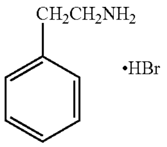

-continued

[Chem. 15]

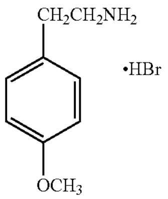

(E-2)

[Chem. 16]

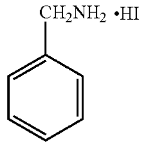

(E-3)

[Chem. 17]

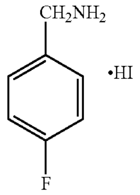

(E-4)

[Chem. 18]

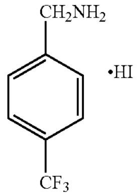

(E-5)

[Chem. 19]

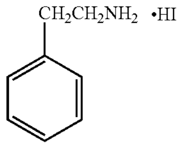

(E-6)

[Chem. 20]

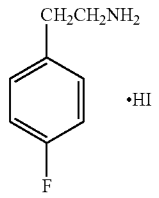

(E-7)

[Chem. 21]

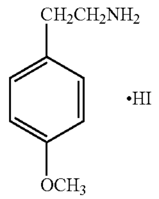

(E-8)

-continued

[Chem. 22]

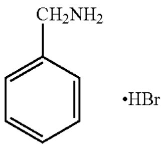

(E-9)

[Chem. 23]

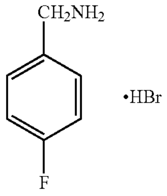

(E-10)

[Chem. 24]

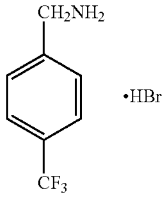

(E-11)

[Chem. 25]

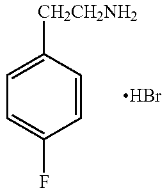

(E-12)

Specific examples of General Formula (7) include 5-aminopentanoic acid hydroiodide, 5-aminopentanoic acid hydrobromide, 6-aminohexanoic acid hydroiodide, 6-aminohexanoic acid hydrobromide, 7-aminoheptanoic acid hydroiodide, 7-aminoheptanoic acid hydrobromide, 8-aminoheptanoic acid hydroiodide, 8-aminoheptanoic acid hydrobromide, 9-aminononaoic acid hydroiodide, 9-aminononaoic acid hydrobromide, 10-aminodecanoic acid hydroiodide, 10-aminodecanoic acid hydrobromide, 11-aminoundecanoic acid hydroiodide, 12-aminoundecanoic acid hydrobromide, 12-aminododecanoic acid hydroiodide, and 12-aminododecanoic acid hydrobromide.

Since the photoelectric conversion element of the present disclosure include the film including a compound represented by General Formula (2) disposed between the photoelectric conversion layer and the hole-transporting layer, physical properties of the interface can be controlled.

When the photoelectric conversion layer is a perovskite layer, the compound represented by General Formula (2) (organic salt or inorganic salt) is preferably a salt that is different from the salt constituting the perovskite layer.

The salt is not particularly limited and may be appropriately selected depending on the intended purpose. When the perovskite compound is used in the photoelectric conversion layer, particularly, the salt preferably includes a halogen atom considering compatibility. Examples of the halogen atom include chlorine, iodine, and bromine.

Particularly when a perovskite compound is used for a photoelectric conversion layer, the organic salt is preferable hydrohalogenic acid salt of amine considering compatibility. Particularly when a perovskite compound is used for a photoelectric conversion layer, the inorganic salt is preferably alkali metal halide considering compatibility. Examples of the alkali metal include lithium, sodium, potassium, rubidium, and cesium.

A is a cationic amino compound represented by General Formula (6) or General Formula (7), a cationic pyridinium compound, a cationic imidazolinium compound, or a cationic pyrrolidinium compound

[Chem. 26]

General Formula (6)

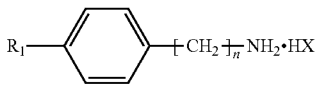

In General Formula (6), $R_1$ is —H, —F, —$CF_3$, or —$OCH_3$, n is 1 or 2, and X is Br or I.

[Chem. 27]

General Formula (7)

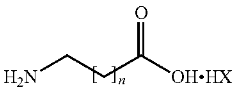

In General Formula (7), n is an integer of 5 or greater but 12 or less, and X is Br or I.

Examples of X in General Formula (2) include halogen anions, such as a bromine (Br) anion, and an iodine (I) anion.

A method for forming a film including the compound (organic salt or inorganic salt) represented by General Formula (2) between the photoelectric conversion layer and the hole-transporting layer is not particularly limited and may be appropriately selected depending on the intended purpose. Examples of the method thereof include a method where a solution including a compound (organic salt or inorganic salt) represented by General Formula (2) is applied onto the photoelectric conversion layer, followed by drying the solution, and then the hole-transporting layer is formed thereon. Examples of the solution include an aqueous solution, and an alcohol solution.

The coating method is not particularly limited and may be appropriately selected depending on the intended purpose. Examples of the coating method include dip coating, spray coating, wire bar coating, spin coating, roller coating, blade coating, and gravure coating. Moreover, a method for applying the solution may be a method where the compound is precipitated in a supercritical fluid using carbon dioxide etc. Moreover, the film thickness of the precipitated layer is not particularly limited. The precipitated layer is a layer where the compound is monomolecularly adsorbed, or a layer comprised of discontinuous islands. A temperature for the drying treatment performed after applying the solution is not particularly limited and may be appropriately selected depending on the intended purpose. A thickness of the film including the compound represented by General Formula (2) (organic salt or inorganic salt) is preferably 0.5 nm or greater but 100 nm or less, and more preferably 1 nm or greater but 50 nm or less.

Moreover, the compound represented by General Formula (2) (organic salt or inorganic salt) does not need to be uniformly distributed at the interface between the photoelectric conversion layer and the hole-transporting layer. For example, the compound represented by General Formula (2) is locally present in a plurality of regions (in a state of islands). When the photoelectric conversion layer is a perovskite layer, moreover, the compound represented by General Formula (2) may be distributed inside the perovskite layer or the hole-transporting layer by allowing the perovskite compound and the hole-transporting material of the hole-transporting layer to react with each other. Specifically, the distribution state of the compound represented by General Formula (2) is not limited as long as there is a region where compound represented by General Formula (2) (organic salt or inorganic salt) is present between the perovskite layer in which the compound represented by General Formula (2) (organic salt or inorganic salt) is not present, and the hole-transporting layer in which the organic salt and the inorganic salt are not present.

<Hole-Transporting Layer>

The hole-transporting layer is a layer configured to transport holes (positive holes) generated in the photoelectric conversion layer to the below-described second electrode. Therefore, the hole-transporting layer is preferably disposed directly next to the photoelectric conversion layer or via the salt.

In order to impart an ability of transporting holes to the hole-transporting layer, for example, a hole-transporting material or a p-type semiconductor material serving as a hole-transporting material is preferably included in the hole-transporting layer.

As the hole-transporting material or the p-type semiconductor material, any of organic hole-transporting compounds known in the art may be used.

Specific examples of the organic hole-transporting compound include an oxadiazole compound, a triphenylmethane compound, a pyrazoline compound, a hydrazine compound, a tetraarylbenzidine compound, a stilbene compound, and a spiro compound. Among the above-listed examples, a spiro compound is more preferable.

The spiro compound is preferably a compound represented by General Formula (10).

[Chem. 28]

General Formula (10)

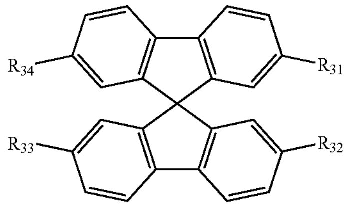

In General Formula (10), $R_{31}$ to $R_{34}$ are each independently a substituted amino group, such as a dimethylamino group, a diphenylamino group, and a naphthyl-4-tolylamino group. Specific examples of the spiro compound include, but are not limited to, (D-1) to (D-20).

[Chem. 29]
(D-1)
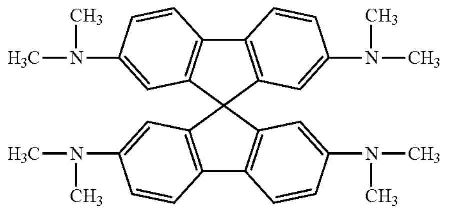
(D-2)
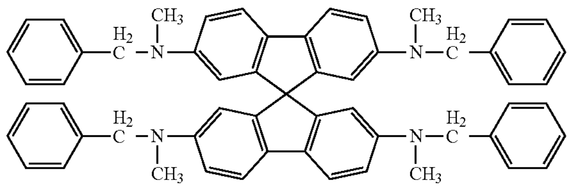
(D-3)
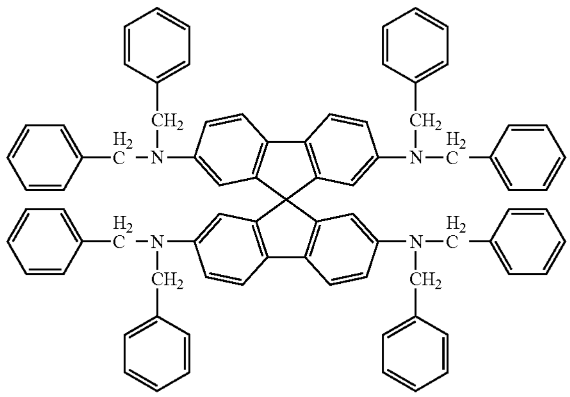
(D-4)
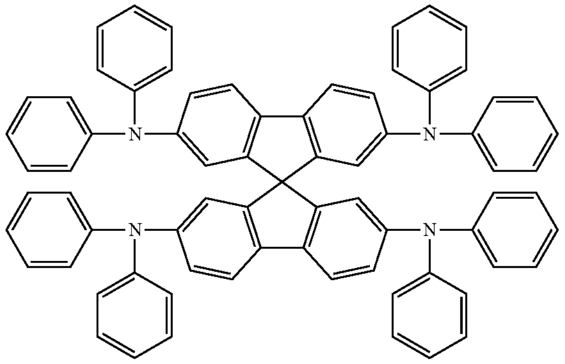
[Chem. 30]
(D-5)
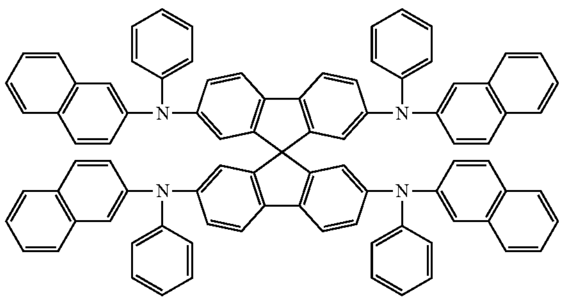
-continued
(D-6)
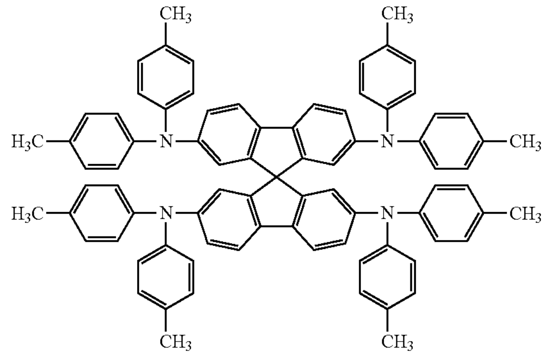
(D-7)
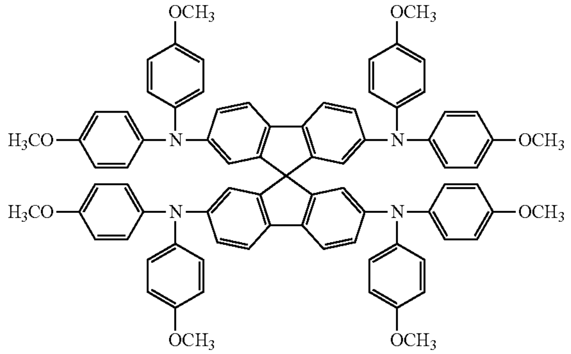
(D-8)
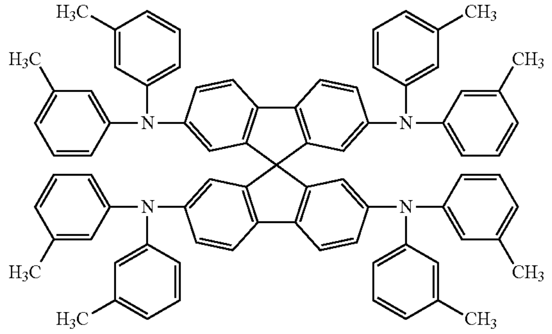
[Chem. 31]
(D-5)
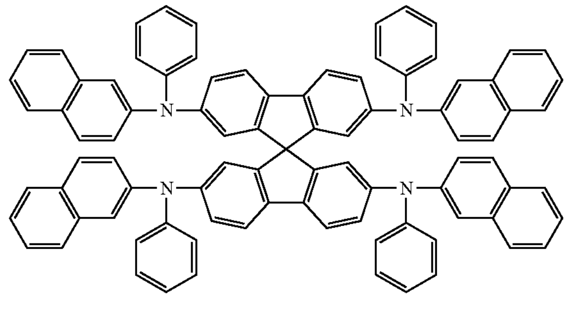

-continued
(D-6)
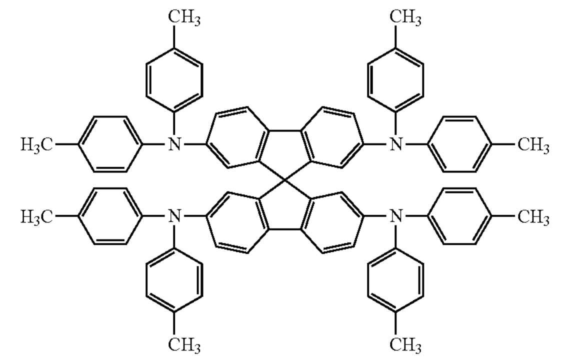
(D-7)
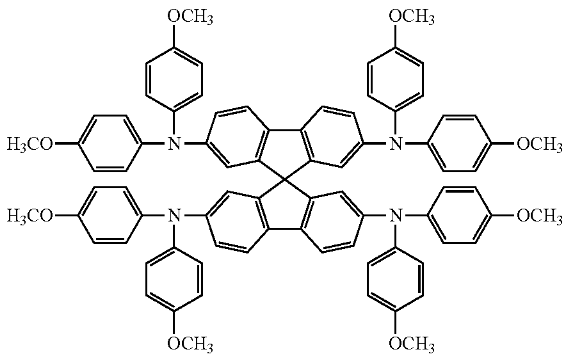
(D-8)
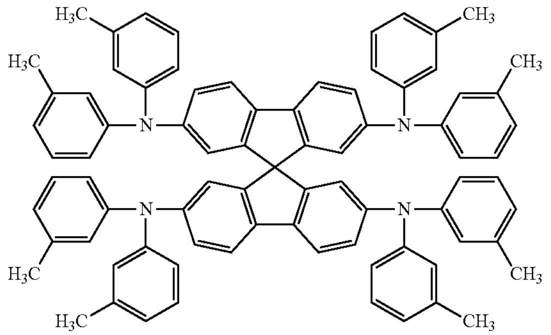
[Chem. 32]
(D-11)
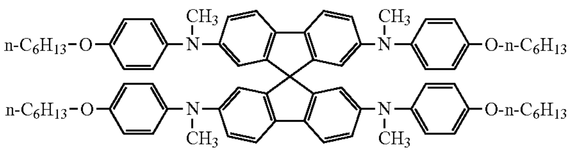
-continued
(D-12)
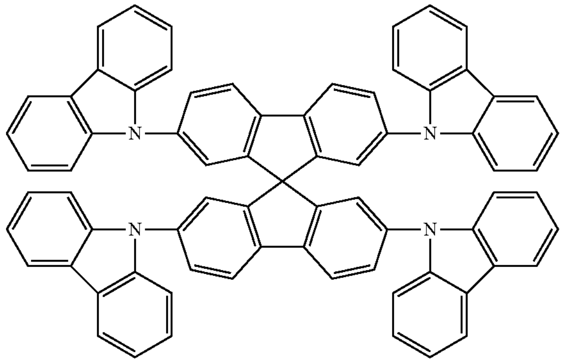
[Chem. 33]
(D-13)
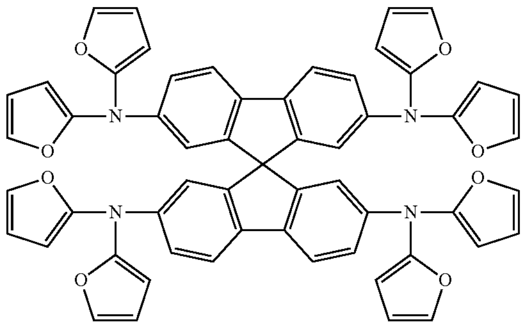
(D-14)
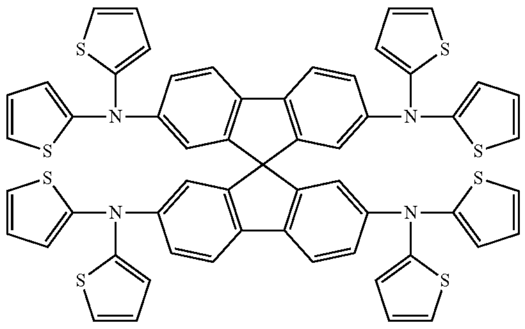
[Chem. 34]
(D-15)
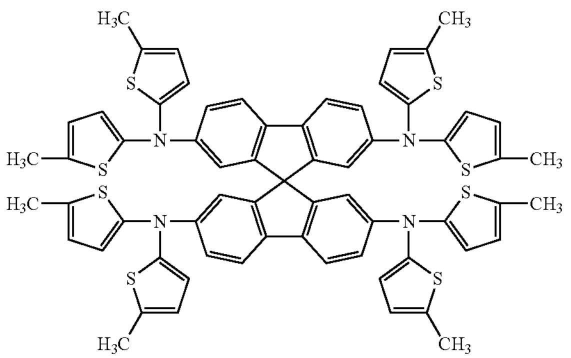

-continued (D-16)

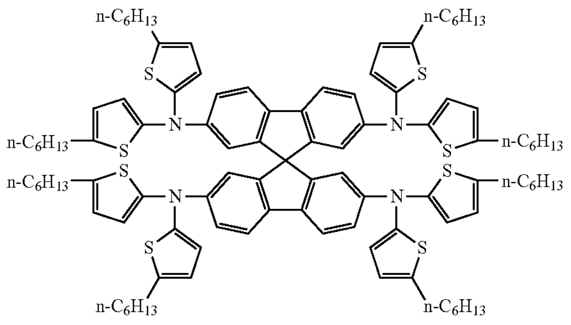

(D-17)

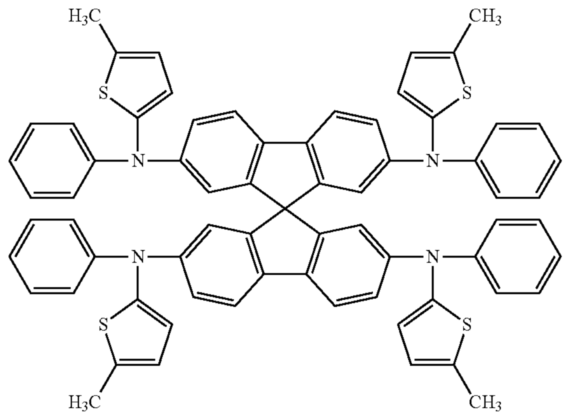

(D-18)

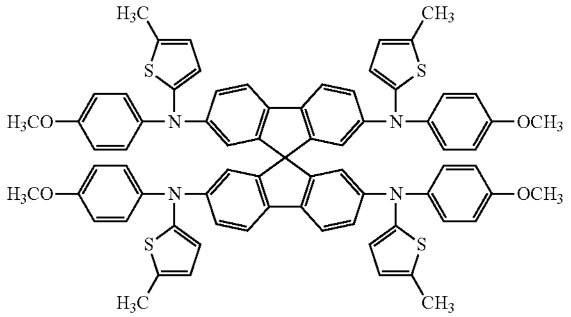

[Chem. 35]

(D-19)

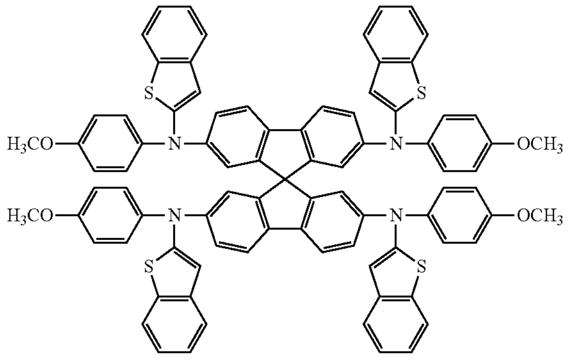

-continued (D-20)

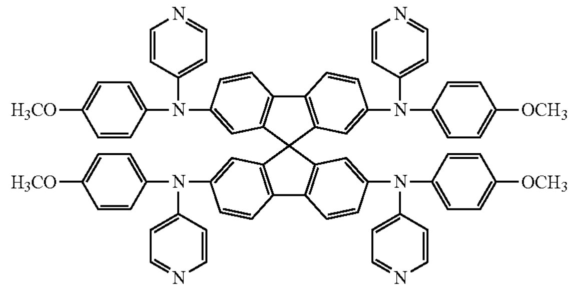

Since the spiro compound has high hole mobility and have two benzidine skeleton molecules spirally bonded together, a nearly spherical electron cloud is formed, and excellent photoelectric conversion properties are exhibited due to excellent hopping conductivity between molecules. Moreover, the spiro compound is dissolved in various organic solvents because of high solubility. Since the spiro compound is amorphous (amorphous substance that does not have a crystal structure), the spiro compound tends to be densely filled in the porous electron-transporting layer.

The hole-transporting layer includes a solid hole-transporting material, and may further include other materials according to the necessity.

The solid hole-transporting material (may be referred to merely as a "hole-transporting material" hereinafter) is not particularly limited as long as the hole-transporting material is capable of transporting holes, and may be appropriately selected depending on the intended purpose. The solid hole-transporting material preferably includes an organic compound.

The hole-transporting layer preferably includes a compound represented by General Formula (1). Since the hole-transporting layer includes a compound represented by General Formula (1), the resistance of the hole-transporting layer can be reduced.

[Chem. 36]

General Formula (1)

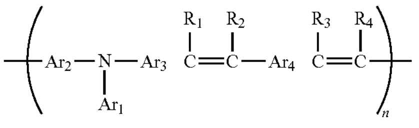

In General Formula (1), $Ar_1$ is an aromatic hydrocarbon group that may include a substituent; $Ar_2$ and $Ar_3$ are each independently a bivalent group of monocyclic, non-condensed polycyclic, or condensed polycyclic aromatic hydrocarbon group that may include a substituent; $Ar_4$ is a bivalent group of benzene, thiophene, biphenyl, anthracene, or naphthalene that may include a substituent; $R_1$ to $R_4$ are each independently a hydrogen atom, an alkyl group, or an aryl group; and n is an integer of 2 or greater.

A weight average molecular weight of the polymer represented by General Formula (1) is an integer of 2,000 or greater.

$Ar_1$ in General Formula (1) is an aromatic hydrocarbon group, and examples thereof include an aryl group.

Examples of the aryl group include a phenyl group, a 1-naphthyl group, and a 9-anthracenyl group. The aryl group may have a substituent. Examples of the substituent include an alkyl group, an alkoxy group, and an aryl group.

$Ar_2$ and $Ar_3$ are each independently a bivalent group of a monocyclic, non-condensed polycyclic, or condensed polycyclic aromatic hydrocarbon group. Examples thereof include an arylene group, and a bivalent heterocyclic group. Examples of the arylene group include 1,4-phenylene, 1,1'-biphenylene, and 9,9'-di-n-hexylfluorene. Example of the bivalent heterocyclic group include 2,5-thiophene. The aryl group may include a substituent. Examples of the substituent include an alkyl group, an alkoxy group, and an aryl group. $Ar_4$ is a bivalent group of benzene, thiophene, biphenyl, anthracene, or naphthalene that may include a substituent. Examples of the substituent include an alkyl group, an alkoxy group, and an aryl group.

$R_1$ to $R_4$ are each independently a hydrogen atom, an alkyl group, or an aryl group. Examples of the alkyl group include a methyl group, and an ethyl group. Examples of the aryl group include a phenyl group, and a 2-naphthyl group. The alkyl group and the aryl group may have a substituent.

The compound represented by General Formula (1) is preferably a compound represented by General Formula (4).

[Chem. 37]

General Formula (4)

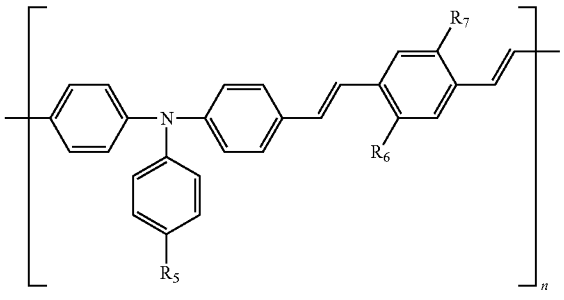

In General Formula (4), $R_5$ is a methyl group or a methoxy group, $R_6$ and $R_7$ are each an alkoxy group, and n is an integer of 2 or greater.

A weight average molecular weight of the compound (polymer) represented by General Formula (1) is preferably 2,000 or greater but 150,000 or less.

The weight average molecular weight can be measured by gel permeation chromatography (GPC).

Specific examples of the compound (polymer) represented by General Formula (1) include, but are not limited to, (A-01) to (A-20) below. In the formulae below, n is an integer of 2 or greater, and is an integer that makes a weight average molecular weight of the polymer having the repeating unit represented by General Formula (1) 2,000 or greater. Examples of substituents present at both terminals of each polymer include a hydrogen atom, an alkyl group that may include a substituent, and an aryl group that may include a substituent.

[Chem. 38]

(A-01)

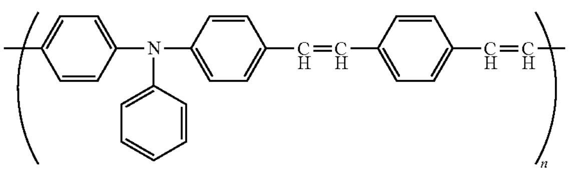

(A-02)

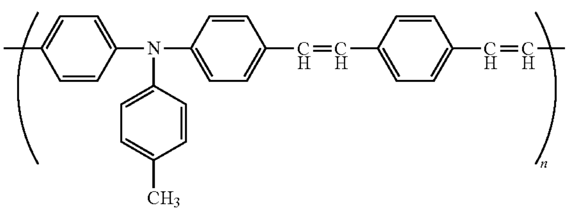

(A-03)

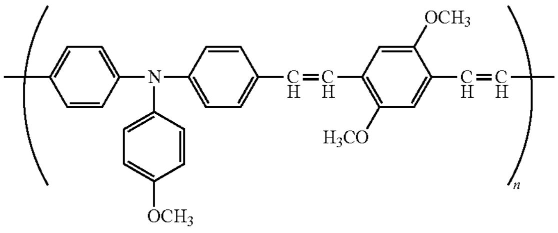

(A-04)

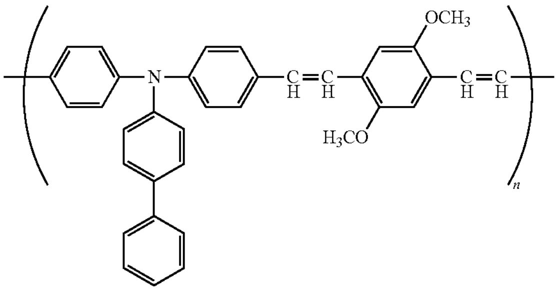

-continued
(A-05)
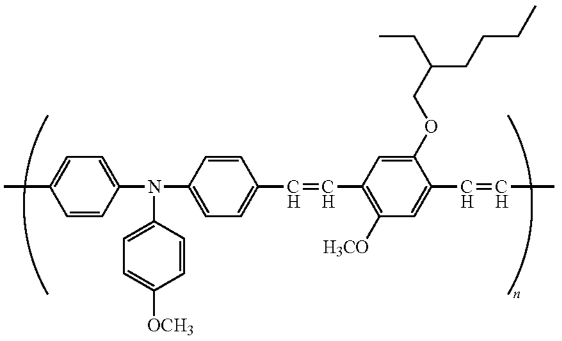
(A-06)
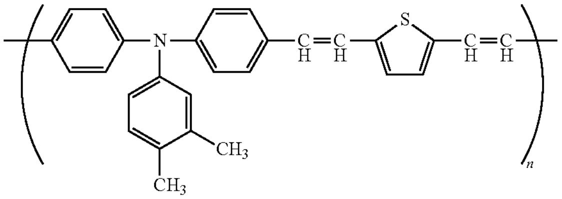
(A-07)
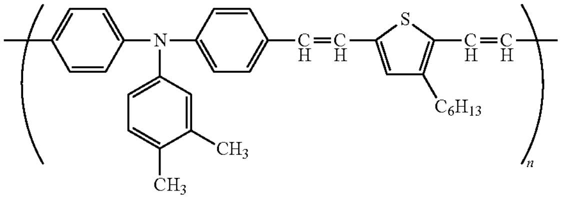
(A-08)
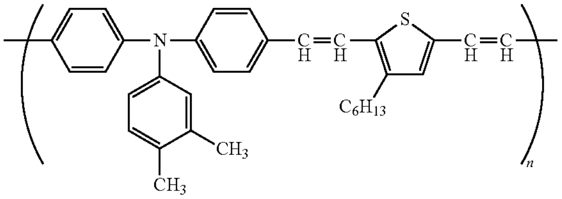
[Chem. 39]
(A-09)
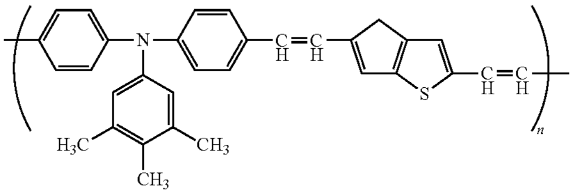
(A-10)
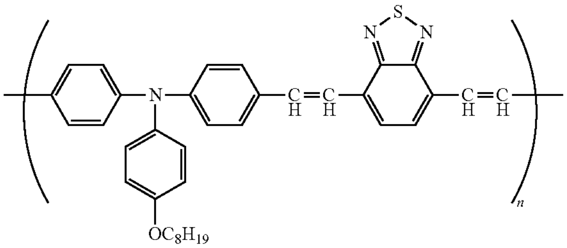
(A-11)
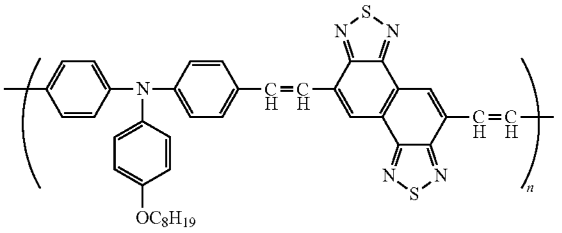
(A-12)
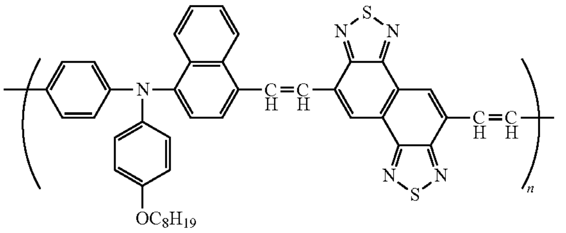
(A-13)
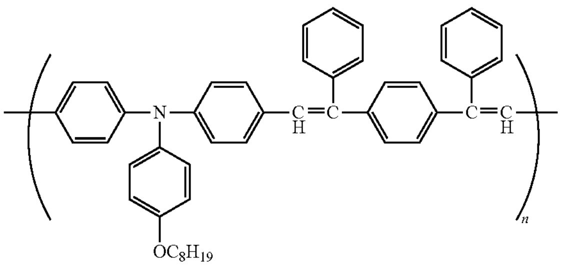
(A-14)
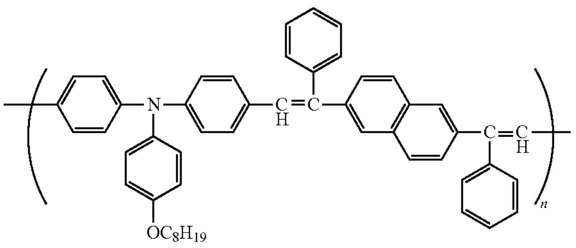

-continued (A-15)

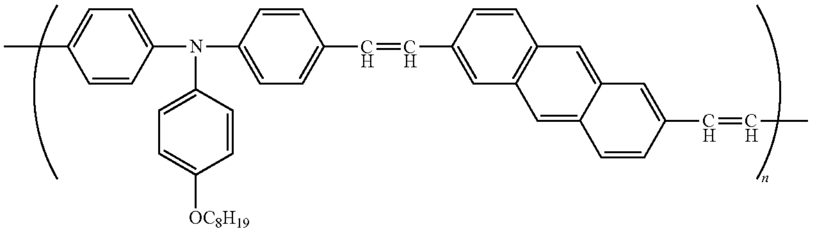

[Chem. 40]

(A-16)

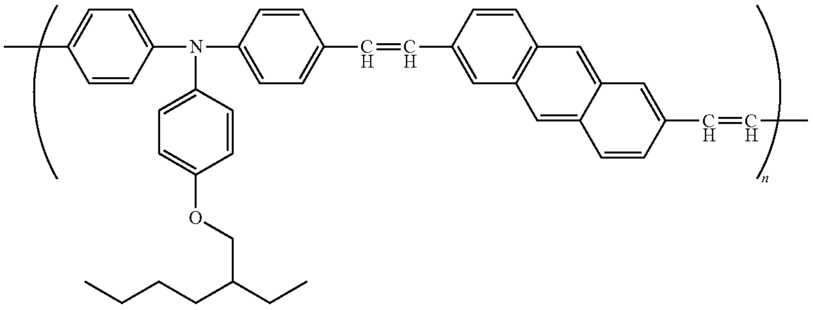

(A-17)

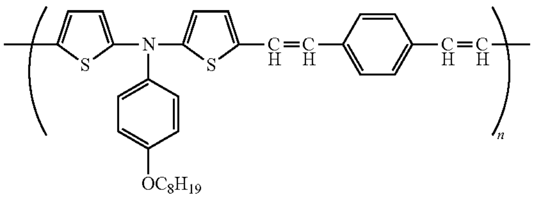

(A-18)

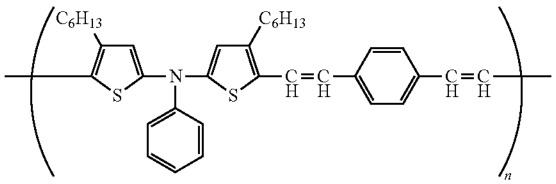

(A-19)

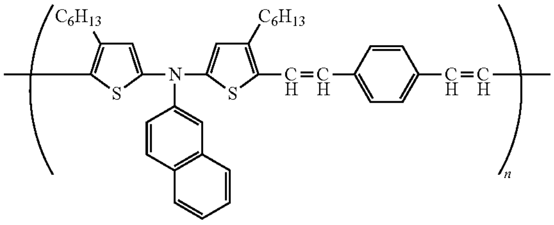

(A-20)

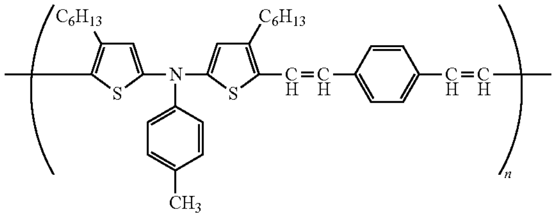

In addition to the compound represented by General Formula (1), a compound represented by General Formula (5) is preferably added.

[Chem. 41]

General Formula (5)

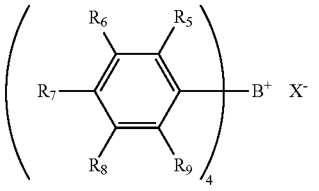

In General Formula (5), $R_5$ to $R_9$ are each a hydrogen atom, a halogen atom, an alkyl group, an alkoxy group, or an aryl group, where $R_5$ to $R_9$ are identical or different; X is a cation; and $R_5$ and $R_6$, or $R_6$ and $R_7$ may form a cyclic structure together.

Examples of the halogen atom include a chlorine atom, a bromine atom, and an iodine atom. Examples of the alkyl group include a C1-C6 alkyl group. The alkyl group may be substituted with a halogen atom.

Examples of the alkoxy group include a C1-C6 alkoxy group.

Examples of the aryl group include a phenyl group.

The cation is not particularly limited and may be appropriately selected depending on the intended purpose. Examples of the cation include an alkali metal cation, a phosphonium cation, an iodonium cation, a nitrogen-containing cation, and a sulfonium cation. The nitrogen-containing cation is an ion having a positive charge on the nitrogen atom. Examples of the nitrogen-containing cation include an ammonium cation, a pyridinium cation, and an imidazolium cation.

Specific examples of the compound represented by General Formula (5) include, but are not limited to, (B-01) to (B-28) below.

[Chem. 42]
(B-01)
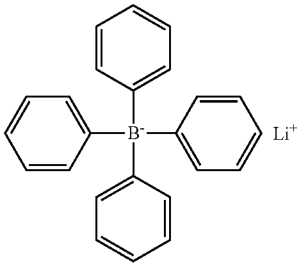
(B-02)
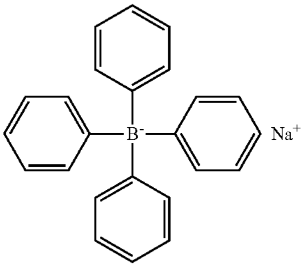
(B-03)
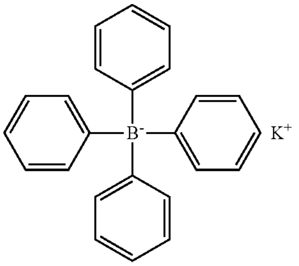
(B-04)
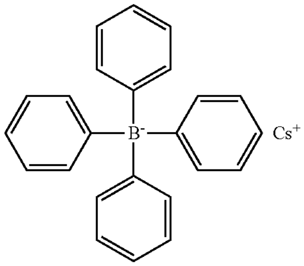
(B-05)
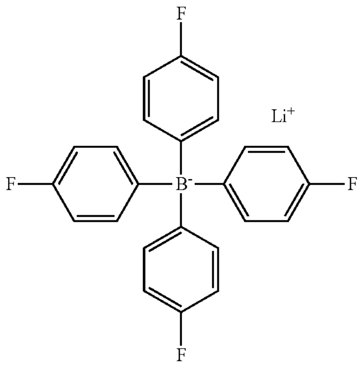
-continued
(B-06)
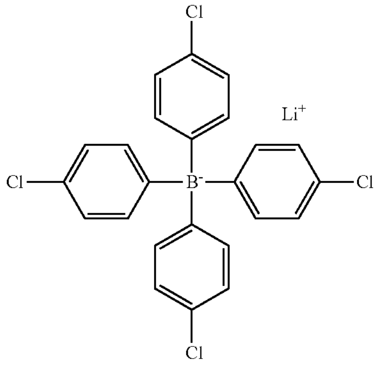
(B-07)
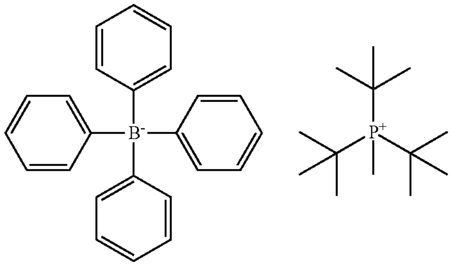
(B-08)
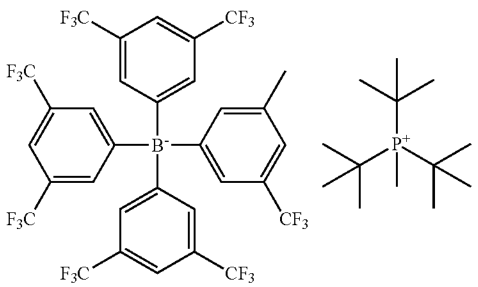
[Chem. 43]
(B-09)
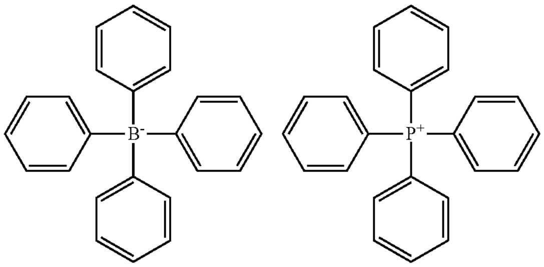
(B-10)
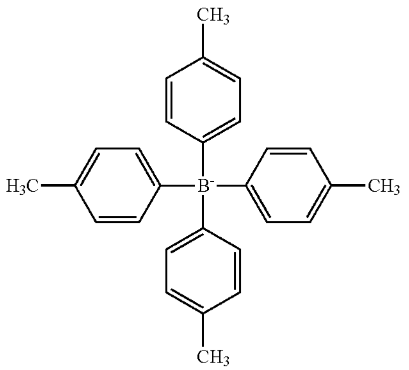

-continued
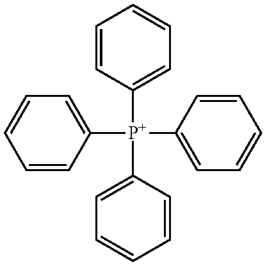
(B-11)
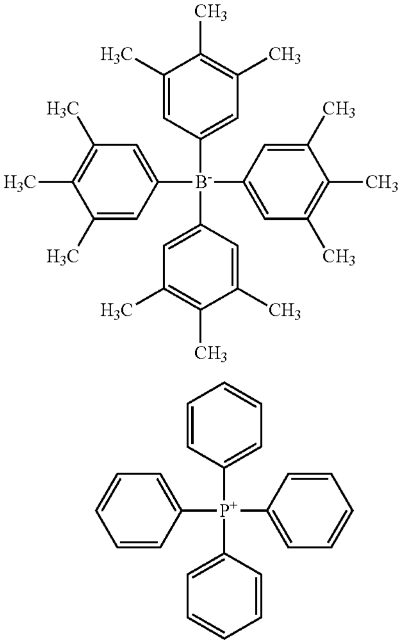
(B-12)
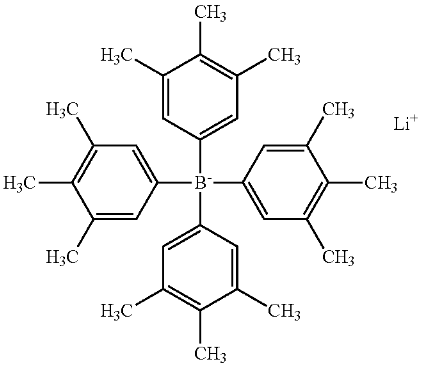
[Chem. 44]
(B-13)
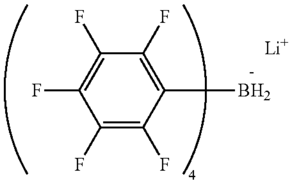
-continued
(B-14)
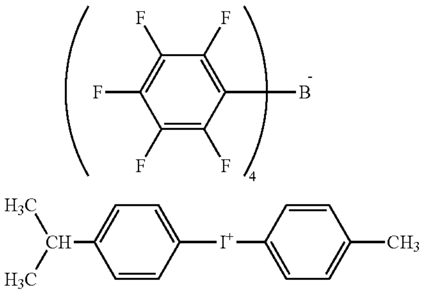
(B-15)
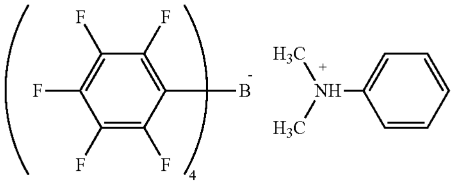
(B-16)
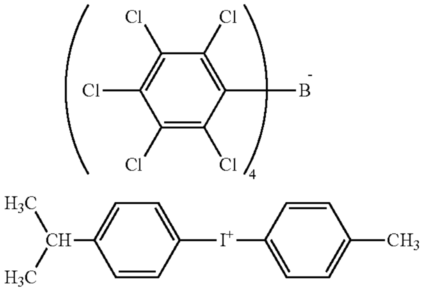
(B-17)
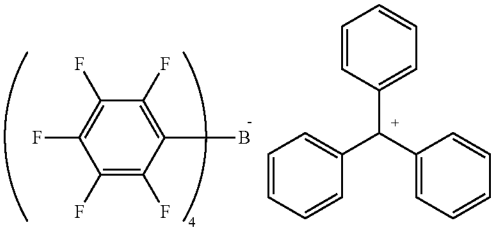
[Chem. 45]
(B-18)
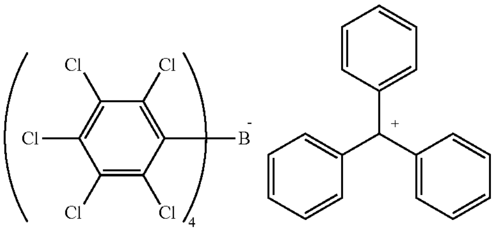
(B-19)
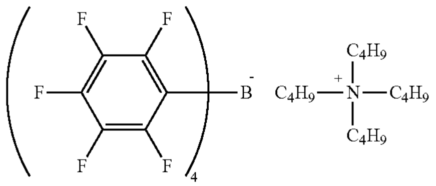

(B-20)

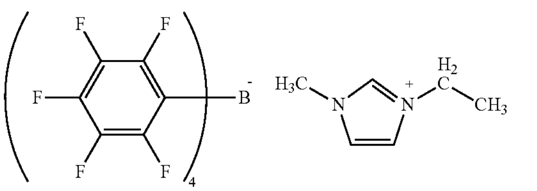

(B-21)

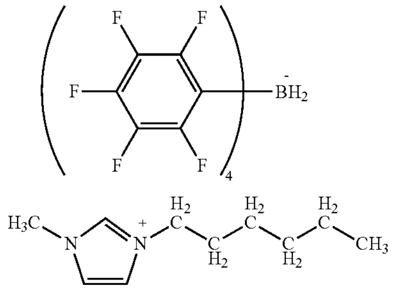

(B-22)

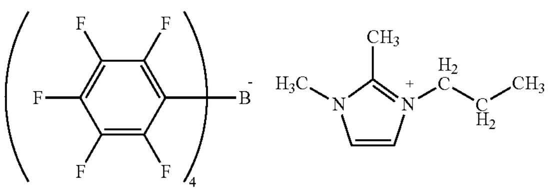

(B-23)

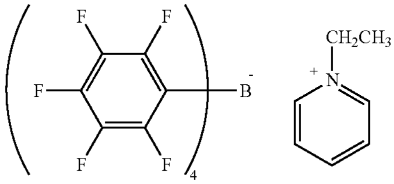

[Chem. 46]

(B-24)

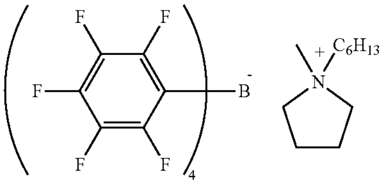

(B-25)

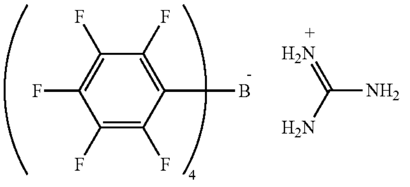

(B-26)

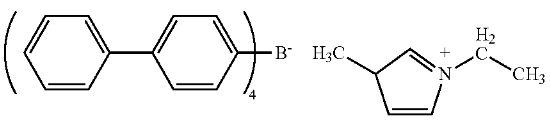

(B-27)

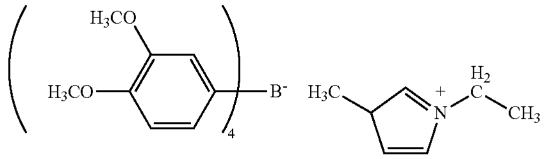

(B-28)

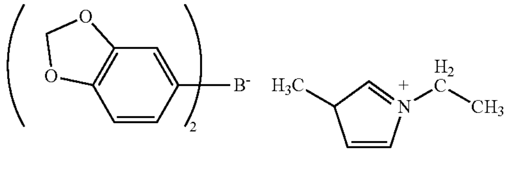

A mass ratio (A:B) of the compound (polymer) A represented by General Formula (1) to the compound B represented by General Formula (5) in the hole-transporting layer is not particularly limited and may be appropriately selected depending on the intended purpose. Considering hole mobility, the mass ratio (A:B) is preferably from 20:1 through 1:1, and more preferably from 10:1 through 1:1.

A film thickness of the hole-transporting layer is preferably 10 nm or greater but 1,000 nm or less, and more preferably 20 nm or greater but 100 nm or less.

For example, the hole-transporting layer further includes another solid hole-transporting material, and may further include other materials according to the necessity. Another solid hole-transporting material (may be referred to merely as a "hole-transporting material" hereinafter) is not particularly limited as long as another solid hole-transporting material is a material capable of transporting holes, and may be appropriately selected depending on the intended purpose. Another solid hole-transporting material preferably includes an organic compound.

When an organic compound is used as a hole-transporting material, for example, the hole-transporting layer includes a plurality of organic compounds.

Examples of the organic compound include a polymer material.

The polymer material used for the hole-transporting layer is not particularly limited and may be appropriately selected depending on the intended purpose. Examples thereof include a polythiophene compound, a polyphenylene vinylene compound, a polyfluorene compound, a polyphenylene compound, a polyarylamine compound, and a polythiadiazole compound. Examples of the polythiophene compound include poly(3-n-hexylthiophene), poly(3-n-octyloxythiophene), poly(9,9'-dioctyl-fluorene-co-bithiophene), poly(3,3'-didodecyl-quarter thiophene), poly(3,6-dioctylthieno[3,2-b]thiophene), poly(2,5-bis(3-decylthiophen-2-yl) thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene). Examples of the polyphenylene vinylene compound include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylene-vinylene)].

Examples of the polyfluorene compound include poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyarylamine compound include poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo (2,1',3) thiadiazole] and poly(3,4-didecylthiophene-co-(1,4-benzo (2,1',3) thiadiazole).

Among the above-listed examples, a polythiophene compound and a polyarylamine compound are preferable considering carrier mobility and ionization potential thereof.

As well as the polymer, the hole-transporting layer may include a low molecular weight compound alone, or a mixture of a low molecular weight compound and a polymer. A chemical structure of the low molecular weight hole-transporting material is not particularly limited. Examples of the low molecular weight hole-transporting material include an oxadiazole compound, a triphenylmethane compound, a pyrazoline compound, a hydrazine compound, a tetraarylbenzidine compound, a stilbene compound, a spirobifluorene compound, and a thiophene oligomer.

Examples of the oxadiazole compound include oxadiazole compounds disclosed in Japanese Examined Patent Application Publication No. 34-5466, and Japanese Unexamined Patent Application Publication No. 56-123544.

Examples of the triphenylmethane compound include triphenylmethane compounds disclosed in Japanese Examined Patent Application Publication No. 45-555.

Examples of the pyrazoline compound include pyrazoline compounds disclosed in Japanese Examined Patent Application Publication No. 52-4188.

Examples of the hydrazine compound include hydrazine compounds disclosed in Japanese Examined Patent Application Publication No. 55-42380.

Examples of the tetraarylbenzidine compound include tetraarylbenzidine compounds disclosed in Japanese Unexamined Patent Application Publication No. 54-58445.

Examples of the stilbene compound include stilbene compounds disclosed in Japanese Unexamined Patent Application Publication No. 58-65440, and Japanese Unexamined Patent Application Publication No. 60-98437.

Examples of the spirobifluorene compound include spirobifluorene compounds disclosed in Japanese Unexamined Patent Application Publication No. 2007-115665, Japanese Unexamined Patent Application Publication No. 2014-72327, Japanese Unexamined Patent Application Publication No. 2001-257012, WO2004/063283, WO2011/030450, WO2011/45321, WO2013/042699, and WO2013/121835.

Examples of the thiophene oligomer include thiophene oligomers disclosed in Japanese Unexamined Patent Application Publication No. 02-250881, and Japanese Unexamined Patent Application Publication No. 2013-033868.

When the mixture of the polymer and the low molecular weight compound is used, a difference in ionization potential between the polymer and the low molecular weight compound is preferably 0.2 eV or less. The ionization potential is energy used to extract one electron from a molecule, and represented by a unit of electron volt (eV). A measurement method of the ionization potential is not particularly limited, but the measurement method thereof is preferably photoelectron spectroscopy.

Other materials included in the hole-transporting layer is not particularly limited and may be appropriately selected depending on the intended purpose. Examples thereof include additives, and oxidants.

The additives are not particularly limited and may be appropriately selected depending on the intended purpose. Examples of the additives include: iodine; metal iodides, such as lithium iodide, sodium iodide, potassium iodide, cesium iodide, calcium iodide, copper iodide, iron iodide, and silver iodide; quaternary ammonium salts, such as tetraalkylammonium iodide, and pyridinium iodide; metal bromides, such as lithium bromide, sodium bromide, potassium bromide, cesium bromide, and calcium bromide; bromates of quaternary ammonium compounds, such as tetraalkylammonium bromide, and pyridinium bromide; metal chlorides, such as copper chloride, and silver chloride; acetic acid metal salts, such as copper acetate, silver acetate, and palladium acetate; metal sulfates, such as copper sulfate, and zinc sulfate; metal complexes, such as ferrocyanide-ferricyanide, ferrocene-ferricinium ion; sulfur compounds, such as sodium polysulfide and alkyl thiol-alkyl disulfide; viologen dyes and hydroquinone; and basic compounds such as pyridine, 4-t-butylpyridine, and benzoimidazole.

An oxidant may be further added. A type of the oxidant for use is not particularly limited and may be appropriately selected depending on the intended purpose. Examples of the oxidant include tris(4-bromophenyl)aluminium hexachloroantimonate, silver hexafluoroantimonate, nitrosonium tetrafluoroborate, silver nitrate, a cobalt complex, and 4-isopropyl-4'-methyldiphenyliodonium tetrakis(pentafluorophenyl) borate. The entire part of the hole-transporting material does not need to be oxidized by addition of the oxidant. The addition of the oxidant is effective as long as at least part of the hole-transporting material is oxidized. Moreover, the oxidant may be removed to the outside of the system after the reaction, or may not be removed.

Since the hole-transporting layer includes the oxidant, the entire organic hole-transporting material or part of the organic hole-transporting material becomes a radical cation, and therefore conductivity is improved to enhance durability and stability of output characteristics.

The average thickness of the hole-transporting layer is not particularly limited and may be appropriately selected depending on the intended purpose. The average thickness of the hole-transporting layer disposed on the photoelectric conversion layer is preferably 0.01 micrometers or greater but 20 micrometers or less, more preferably 0.1 micrometers or greater but 10 micrometers or less, and even more preferably 0.2 micrometers or greater but 2 micrometers or less.

The hole-transporting layer can be directly formed on the photoelectric conversion layer. A production method of the hole-transporting layer is not particularly limited and may be appropriately selected depending on the intended purpose. Examples of the production method include a method where a film is formed in vacuum, such as vacuum vapor deposition, and a wet film formation method. Among the above-listed examples, considering production cost, a wet film formation method is particularly preferable, and a method for applying onto the photoelectric conversion layer is more preferable.

The wet film formation method is not particularly limited and may be appropriately selected depending on the intended purpose. Examples of the wet film formation method include dip coating, spray coating, wire bar coating, spin coating, roller coating, blade coating, and gravure coating. As a wet printing system, moreover, a method, such as relief printing, offset printing, gravure printing, intaglio printing, rubber plate printing, and screen printing, may be used.

Moreover, the hole-transporting layer may be formed in a supercritical fluid or subcritical fluid having lower temperature and pressure than a critical point.

The supercritical fluid is not particularly limited as long as the supercritical fluid exists as a non-condensable high-density fluid in a temperature and pressure region exceeding the limit (critical point) at which gas and a liquid can coexist, the supercritical fluid does not condense even when the supercritical fluid compressed, and the supercritical fluid is a fluid in a state having a temperature and a pressure that are equal to or greater than the critical temperature and the critical pressure. The supercritical fluid may be appropriately selected depending on the intended purpose. The supercritical fluid is preferably a supercritical fluid having a low critical temperature.

The subcritical fluid is not particularly limited as long as the subcritical fluid exists as a high-pressure liquid in a temperature and pressure region near the critical point. The subcritical fluid may be appropriately selected depending on the intended purpose. The compounds listed as the supercritical fluid can be also suitably used as the subcritical fluid.

Examples of the supercritical fluid include carbon monoxide, carbon dioxide, ammonia, nitrogen, water, alcohol solvents, hydrocarbon solvents, halogen solvents, and ether solvents. Examples of the alcohol solvent include methanol, ethanol, and n-butanol.

Examples of the hydrocarbon solvent include ethane, propane, 2,3-dimethylbutane, benzene, and toluene.

Examples of the halogen solvent include methylene chloride and chlorotrifluoromethane. Examples of the ether solvent include dimethyl ether.

The above-listed examples may be used alone or in combination.

Among the above-listed examples, carbon dioxide is preferable because carbon dioxide has a critical pressure of 7.3 MPa and a critical temperature of 31 degrees Celsius, and therefore a supercritical state of carbon dioxide can be easily generated, and the supercritical fluid of carbon dioxide is easily handled due to incombustibility thereof.

The critical temperature and the critical pressure of the subcritical fluid are not particularly limited, and may be appropriately selected depending on the intended purpose. The critical temperature of the subcritical fluid is preferably-273 degrees Celsius or higher but 300 degrees Celsius or lower, and more preferably 0 degrees Celsius or higher but 200 degrees Celsius or lower.

In addition to the supercritical fluid or the subcritical fluid, moreover, an organic solvent or an entrainer may be used in combination. The solubility in the supercritical fluid can be easily adjusted by adding the organic solvent or entrainer.

The organic solvent is not particularly limited and may be appropriately selected depending on the intended purpose. Examples of the organic solvent include a ketone solvent, an ester solvent, an ether solvent, an amide solvent, a halogenated hydrocarbon solvent, and a hydrocarbon solvent.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene. Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

After laminating the hole-transporting material on the photoelectric conversion layer, moreover, a press treatment may be performed. As the press treatment is performed, the hole-transporting material is closely adhered to the photoelectric conversion layer, and therefore power generation efficiency may be improved.

A method of the press treatment is not particularly limited and may be appropriately selected depending on the intended purpose. Examples thereof include press molding using a flat plate, such as infrared spectroscopy (IR) pellet dies, and roller pressing using a roller. The pressure of the press treatment is preferably 10 $kgf/cm^2$ or greater, and more preferably 30 $kgf/cm^2$ or greater.

The duration of the press treatment is not particularly limited and may be appropriately selected depending on the intended purpose. The duration of the press treatment is preferably 1 hour or shorter. Moreover, heat may be applied during the press treatment.

During the press treatment, a release agent may be disposed between a press and the electrode.

The release agent is not particularly limited and may be appropriately selected depending on the intended purpose. Examples of the release agent include fluororesins, such as polyethylene tetrafluoride, polychloroethylene trifluoride, ethylene tetrafluoride-propylene hexafluoride copolymer, a perfluoroalkoxy fluoride resin, polyvinylidene fluoride, ethylene-ethylene tetrafluoride copolymers, an ethylene-chloroethylene trifluoride copolymer, and polyvinyl fluoride. The above-listed examples may be used alone or in combination.

——Film Including Metal Oxide——

After performing the press treatment but before disposing a second electrode, a film including metal oxide may be disposed between the hole-transporting material and the second electrode.

The metal oxide is not particularly limited and may be appropriately selected depending on the intended purpose. Examples of the metal oxide include molybdenum oxide, tungsten oxide, vanadium oxide, and nickel oxide. The above-listed examples may be used alone or in combination. Among the above-listed examples, molybdenum oxide is preferable. A method for disposing the metal oxide on the hole-transporting layer is not particularly limited and may be appropriately selected depending on the intended purpose. Examples of the method include: a method where a film is formed in vacuum, such as sputtering, and vacuum vapor deposition; and a wet film formation method.

The wet film formation method used for forming the film including metal oxide is preferably a method where a paste in which powder or sol of metal oxide is dispersed is prepared, and the paste is applied onto the hole-transporting layer.

The wet film formation method is not particularly limited and may be appropriately selected depending on the intended purpose. Examples of the wet film formation method include dip coating, spray coating, wire bar coating, spin coating, roller coating, blade coating, and gravure coating. As a wet printing method, moreover, various methods, such as relief printing, offset printing, gravure printing, intaglio printing, rubber plate printing, and screen printing, may be used.

The average thickness of the film including metal oxide is not particularly limited and may be appropriately selected depending on the intended purpose. The average thickness thereof is preferably 0.1 nm or greater but 50 nm or less, and more preferably 1 nm or greater but 10 nm or less.

<Second Substrate>

The second substrate is not particularly limited and any of known substrates may be used as the second substrate. Examples thereof include substrates, such as glass, a plastic film, and ceramic. In order to improve adhesion at the contact area between the second substrate and the sealing member, the rough surface texture (convex-concave shapes) may be imparted. A method for imparting the rough surface texture is not particularly limited, and may be appropriately selected depending on the intended purpose. Examples thereof include sand blasting, water blasting, polishing, chemical etching, and laser processing.

As the method for improving adhesion between the second substrate and the sealing member, for example, organic matter deposited on the surface of the second substrate may be removed, or hydrophilicity of the surface thereof may be improved. The method for removing the organic matter deposited on the surface of the second substrate is not particularly limited, and may be appropriately selected depending on the intended purpose. Examples thereof include UV ozone washing, and an enzyme plasma treatment.

<<Sealing Member>>

A sealing member can be used for the photoelectric conversion element of the present disclosure and use of the sealing member can be effective. The sealing member is capable of sealing at least the electron-transporting layer and the hole-transporting layer from the external environment of the photoelectric conversion element. In other words, the photoelectric conversion element of the present disclosure preferably further includes a sealing member configured to seal the photoelectric conversion layer from the external environment of the photoelectric conversion element.

Any of members known in the art can be used as the sealing member, as long as the sealing member is a member capable of suppressing entry of an excessive amount of moisture or oxygen into the internal part of the seal from the external environment. Moreover, the sealing member has an effect of preventing mechanical breakage that may be caused when the photoelectric conversion element is pressed from outside. As long as such an effect can be imparted, any of members known in the art can be used as the sealing member.

The sealing system is roughly classified into "frame sealing" and "plane sealing". The "frame sealing" is sealing where a sealing member is disposed on the peripheral area of the power generation region composed of the photoelectric conversion layer of the photoelectric conversion element photoelectric conversion layer, and is bonded to the second substrate. The "plane sealing" is sealing where a sealing member is disposed on the entire plane of the power generation region, and is bonded to the second substrate. The former "frame scaling" can form a hollow section inside the seal, thus the moisture content or oxygen content inside the seal can be appropriately adjusted. In addition, the second electrode does not come into contact with the sealing member, which leads to an effect that a possibility of the second electrode being peeled off is reduced. Meanwhile, the latter "plane sealing" has an excellent effect of preventing entry of excess water or oxygen from outside, and a large contact area with the sealing member can be secured. Therefore, high sealing strength can be obtained, and the plane sealing is particularly suitable when a flexible substrate is used as the first substrate.

A type of the sealing member is not particularly limited and may be appropriately selected depending on the intended purpose. Examples thereof include a curing resin and a low melting point glass resin. The curing resin is not particularly limited as long as the curing resin is a resin that can be cured with light or heat, and may be appropriately selected depending on the intended purpose. Among the curable resins with light or heat, an acrylic resin and an epoxy resin are preferably used.

As the cured product of the acrylic resin, any of materials known in the art can be used as long as the cured product is a product obtained by curing a monomer or oligomer including an acryl group in a molecule thereof.

As the cured product of the epoxy resin, any of materials known in the art can be used as long as the cured product is a product obtained by curing a monomer or oligomer including an epoxy group in a molecule thereof.

Examples of the epoxy resin include a water-dispersible epoxy resin, a non-solvent epoxy resin, a solid epoxy resin, a heat curable epoxy resin, a curing agent-mixed epoxy resin, and a UV curable epoxy resin. Among the above-listed examples, a heat curable epoxy resin and a UV curable epoxy resin are preferable, and a UV curable epoxy resin is more preferable. Heating may be performed on a UV curable epoxy resin. Heating is preferably performed even after curing the UV curable epoxy resin with UV irradiation.

Examples of the epoxy resin include a bisphenol A epoxy resin, a bisphenol F epoxy resin, a novolac epoxy resin, an alicyclic epoxy resin, a long-chain aliphatic epoxy resin, glycidyl amine epoxy resin, a glycidyl ether epoxy resin, and a glycidyl ester epoxy resin. The above-listed examples may be used alone or in combination.

The epoxy resin is preferably mixed with a curing agent or various additives according to the necessity.

The curing agent is classified into an amine-based curing agent, an acid anhydride-based curing agent, a polyamide-based curing agent, and other curing agents, and may be appropriately selected depending on the intended purpose.

Examples of the amine-based curing agent include: aliphatic polyamine, such as diethylene triamine, and triethylene tetramine; and aromatic polyamine, such as m-phenylene diamine, diaminodiphenylmethane, and diaminodiphenylsulfone.

Examples of the acid anhydride-based curing agent include phthalic anhydride, tetrahydrophthalic anhydride, hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. The above-listed examples may be used alone or in combination.

Examples of the additive include filler, gap agents, polymerization initiators, drying agents (moisture absorbents), curing accelerators, coupling agents, flexibilizers, colorants, flame retardant auxiliaries, antioxidants, and organic solvents. Among the above-listed examples, filler, a gap agent, a curing accelerator, a polymerization initiator, and a drying agent (moisture absorbent) are preferable, and filler and a polymerization initiator are more preferable.

The filler is effective in preventing entry of moisture and oxygen, as well as exhibiting effects of reducing volumetric shrinkage during curing, reducing an amount of outgas generated during curing or heating, improving mechanical strength, controlling thermal conductivity or fluidity, and is very effective in maintaining stable output in various environments. Particularly, output characteristics and durability of the photoelectric conversion element are influenced not only by moisture or oxygen entered but also by outgas generated during curing or heating of the sealing member. The gas generated as outgas during heating significantly affects output characteristics when the photoelectric conversion element is stored in a high temperature environment.

In this case, the filler, the gap agent, or the drying agent are added to the sealing member. As a result, entry of moisture or oxygen can be suppressed by such additives themselves, and an amount of the sealing member to be used can be reduced, and therefore generation of outgas can be reduced. Addition of such additives can be also effective not only for curing, but also when photoelectric conversion element is stored in a high temperature environment.

The filler is not particularly limited, and may be appropriately selected depending on the intended purpose. For example, inorganic filler, such as crystalline or amorphous silica, talc, alumina, aluminum nitride, silicon nitride, calcium silicate, and calcium carbonate, is preferably used. The above-listed examples may be used alone or in combination. The average primary particle diameter of the filler is preferably 0.1 micrometers or greater but 10 micrometers or less, and more preferably 1 micrometer or greater but 5 micrometers or less. When the average primary particle diameter is within the above-mentioned preferable range, entry of moisture or oxygen can be sufficiently suppressed, appropriate viscosity of the sealing member can be obtained, adhesion to a substrate and defoamability can be improved, a width of sealing can be controlled, and desirable processability is obtained.

An amount of the filler is preferably 10 parts by mass or greater but 90 parts by mass or less, and more preferably 20 parts by mass or greater but 70 parts by mass or less, relative to 100 parts by mass of the entire sealing member. When the amount of the filler is within the above-mentioned range, entry of moisture or oxygen can be sufficiently suppressed, appropriate viscosity of the sealing member can be obtained, and desirable adhesion and processability are obtained.

The gas agent is also called a gap controlling agent or a spacer agent, and can control a gap formed at the sealing area. When the sealing member is applied onto the first substrate or the first electrode, the second substrate is placed thereon, and the stacked structure is sealed, a gap at the sealing area matches with the size of the gap agent as the epoxy resin includes the gap agent. As a result, it is possible to easily control the gap of the sealing area. Any of materials known in the art can be used as the gap agent, as long as the material is particles having a uniform particle diameter and has high solvent resistance or heat resistance. The material of the gap agent is preferably a material having high affinity to an epoxy resin and being spherical particles. Specific examples thereof include glass beads, silica particles, and organic resin particles. The above-listed examples may be used alone or in combination. The particle diameter of the gap agent can be selected depending on the gap of the sealing area to be set. The particle diameter thereof is preferably 1 micrometer or greater but 100 micrometers or less, more preferably 5 micrometers or greater but 50 micrometers or less.

Examples of the polymerization initiator include a thermal polymerization initiator that induces polymerization with heat, and a photopolymerization initiator that incudes polymerization with light.

The thermal polymerization initiator is a compound that generates active species, such as radicals or cations, upon application of heat. Specifically, an azo compound, such as 2,2'-azobisbutyronitrile (AIBN), or peroxide, such as benzoyl peroxide (BPO) is used as the thermal polymerization initiator. As the cationic thermal polymerization initiator, benzenesulfonic acid ester or alkyl sulfonium salt may be used.

As the photopolymerization initiator, a cationic photopolymerization initiator is preferably used in case of an epoxy resin. When a cationic photopolymerization initiator is blended in the epoxy resin and light irradiation is performed, the cationic photopolymerization initiator is decomposed to generate strong acid, the acid induces polymerization of the epoxy resin to proceed with a curing reaction. The cationic photopolymerization initiator has advantages that that volumetric shrinkage during curing is small, oxygen inhibition does not occur, and storage stability is high.

Examples of the cationic photopolymerization initiator include aromatic diazonium salt, aromatic iodonium salt, aromatic sulfonium salt, a metallocene compound, and a silanol-aluminum complex.

Moreover, a photoacid generator capable of generating acid upon irradiation of light may be used. The photoacid generator functions as acid that initiates a cationic polymerization. Examples thereof include onium salts such as ionic sulfonium salt-based onium salts and ionic iodonium salt-based onium salts including a cation part and an ionic part. The above-listed examples may be used alone or in combination.

An amount of the polymerization initiator may vary depending on materials for use. The amount of the polymerization initiator is preferably 0.5 parts by mass or greater but 10 parts by mass or less, and more preferably 1 part by mass or greater but 5 parts by mass or less, relative to 100 parts by mass of the entire sealing member. The amount of the polymerization initiator within the above-mentioned range is effective because curing is progressed appropriately, an amount of uncured residues can be reduced, and excessive generation of outgas can be prevented.

The drying agent is also called a moisture absorbent and is a material having a function of physically or chemically adsorbing or absorbing moisture. Inclusion of the drying agent in the sealing member is effective because moisture resistance may be further improved and influence of outgassing can be decreased in some cases.

The drying agent is preferably particulate. Examples thereof include inorganic water-absorbing materials such as calcium oxide, barium oxide, magnesium oxide, magnesium sulfate, sodium sulfate, calcium chloride, silica gel, molecular sieve, and zeolite. Among the above-listed examples, zeolite or calcium oxide is preferable because zeolite or calcium oxide absorbs a large amount of moisture. The above-listed examples may be used alone or in combination.

The curing accelerator is also called a curing catalyst and is used for the purpose of accelerating curing speed. The curing accelerator is mainly used for a heat-curable epoxy resin.

Examples of the curing accelerator include: tertiary amine or tertiary amine salt such as 1,8-diazabicyclo(5,4,0)-undecene-7 (DBU) and 1,5-diazabicyclo(4,3,0)-nonene-5 (DBN); imidazole-based compounds such as 1-cyanoethyl-2-ethyl-4-methylimidazole and 2-ethyl-4-methylimidazole; and phosphine or phosphonium salt such as triphenylphosphine and tetraphenylphosphonium·tetraphenyl borate. The above-listed examples may be used alone or in combination.

The coupling agent has an effect of enhancing a bonding force between molecules, and examples thereof include silane coupling agents. Specific examples thereof include: silane coupling agents such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl) 3-aminopropylmethyldimethoxysilane, N-(2-aminoethyl) 3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl) 3-aminopropyltrimethoxysilane hydrochloride, and 3-methacryloxypropyltrimethoxysilane. The above-listed examples may be used alone or in combination.

As the sealing member, resin compositions that are commercially available as sealing materials, seal materials, or adhesives have been known, and can be effectively used in the present disclosure. Among the above-listed examples, there are epoxy resin compositions that are developed and are commercially available to be used in solar battery cells or organic EL elements, and can be particularly effectively used in the present disclosure. Examples of the commercially available products of the epoxy resin include product names: TB3118, TB3114, TB3124, and TB3125F (all of which are available from ThreeBond), World Rock 5910, World Rock 5920, and World Rock 8723 (all available from Kyoritsu Chemical & Co., Ltd.), and WB90US(P) (available from MORESCO).

Examples of the commercially available products of the acrylic resin include product names: TB3035B and TB3035C (both available from ThreeBond Co., Ltd.), and NICHIBAN UM (available from NICHIBAN Co., Ltd.).

A heat treatment may be performed on the sealing member after curing by UV irradiation etc. In the present disclosure, performing the heat treatment is effective. An amount of uncured components may be reduced by performing the heat treatment. Therefore, the heat treatment is effective for reducing an amount of outgassing that may influence output properties, enhancing sealing performance, and enhancing output properties and retention of output.

Meanwhile, the low melting point glass resin is used by applying the resin, followed by firing to decompose the resin component, and adhering to the glass substrate to seal with melting the resin by IR laser light etc. During the above-described process, the low melting point glass substrate is dispersed inside the metal oxide layer to physically join and therefore high sealing properties can be obtained. Since the resin component is disappeared, outgas is not generated as with a UV curable resin, and therefore use of the low melting point glass resin is effective for improving durability of the photoelectric conversion element. Generally, the low melting point glass resin is commercially available as glass frits or glass pastes, which are effectively used. In the present disclosure, the glass resin having the lower melting point is more preferable.

A temperature of the heat treatment is not particularly limited, and may be freely set depending on a sealing member for use. The temperature is preferably 50 degrees Celsius or higher but 200 degrees Celsius or lower, more preferably 60 degrees Celsius or higher but 150 degrees Celsius or lower, and even more preferably 70 degrees Celsius or higher but 100 degrees Celsius or lower. Duration of the heat treatment is not particularly limited, and may be freely set depending on a sealing member for use. The duration is preferably 10 minutes or longer but 10 hours or shorter, more preferably 20 minutes or longer but 5 hours or shorter, and even more preferably 30 minutes or longer but 3 hours or shorter.

Moreover, a sheet-shaped sealing material may be also effectively used in the present disclosure.

The sheet-shaped sealing material is a product where a resin layer is formed on a sheet in advance. As the sheet, glass or a film having high gas barrier properties may be used. The sheet corresponds to the second substrate of the present disclosure. The sealing member and the substrate can be formed at once by bonding the sheet-shaped sealing member onto the second electrode of the photoelectric conversion element, followed by curing the resin. When the resin layer is formed on the entire surface of the sheet, the sealing system is "plane sealing." The sealing system may be "frame sealing" where a hollow section is provided inside the photoelectric conversion element according to the formation pattern of the resin layer.

Since oxygen is provided in the hollow section inside the sealing, hole-transporting function of the hole-transporting layer can be stably maintained over a long period, which may be effective for improving durability of the photoelectric conversion element. In the present disclosure, the above-described effect can be exhibited as long as oxygen is included in the hollow section created by sealing, but the oxygen concentration in the hollow section inside the sealing is more preferably 5.0% by volume or greater but 21.0% by volume or less, and even more preferably 10.0% by volume or greater but 21.0% by volume or less.

The oxygen concentration in the hollow section can be controlled by performing sealing inside the glove box in which the oxygen concentration is adjusted.

The adjustment of the oxygen concentration can be performed by a method using a gas cylinder including gas having the predetermined oxygen concentration, or a method using a nitrogen gas generating device.

The oxygen concentration inside the glove box can be measured by means of a commercially available oxygen meter or oxygen monitor.

The oxygen concentration inside the hollow section formed by sealing can be measured, for example, by internal vapor analysis (IVA) or atmospheric pressure ionization mass spectrometry (API-MS). Specifically, the photoelectric conversion element is placed in a highly vacuumed chamber or a chamber filled with inert gas, the sealing of the photoelectric conversion element is released inside the chamber to determine all of the components in the gas included the hollow section through mass analysis of gas or moisture inside the chamber, and a ratio of oxygen to a total amount of all of the components is calculated to thereby determine an oxygen concentration.

Gas included inside the sealed photoelectric conversion element other than oxygen is preferably inert gas, and more preferably nitrogen or argon.

When sealing is performed, as well as the oxygen concentration, a dew point inside the glove box is preferably controlled. To adjust the dew point is effective for improving output or durability of the photoelectric conversion element. The dew point is determined as a temperature at which condensation starts when gas including water vapor is cooled.

The dew point is not particularly limited. The dew point is preferably 0 degrees Celsius or lower, and more preferably −20 degrees Celsius or lower. The lower limit of the dew point is preferably −50 degrees Celsius or higher.

A method for forming the sealing section is not particularly limited, and the sealing can be performed according to any of methods known in the art. For example, various methods, such as dispensing, wire bar coating, spin coating, roller coating, blade coating, gravure coating, relief printing, offset printing, intaglio printing, rubber plate printing, and screen printing, can be used.

Moreover, a passivation layer may be disposed between the second electrode and the sealing member. The passivation layer is not particularly limited, as long as the passivation layer is arranged so that the sealing member does not come into contact with the second electrode. The passivation layer may be appropriately selected depending on the intended purpose. For example, aluminium oxide, silicon nitrate, and silicon oxide are preferably used for the passivation layer.

<Other Members>

Other members are not particularly limited and may be appropriately selected depending on the intended purpose.

Examples of the photoelectric conversion element of the present disclosure will be described with reference to drawings hereinafter. However, the present disclosure is not limited to the following embodiments. For example, the number of the following constitutional members, the positions of the following constitutional members, and the shapes of the following constitutional members, which will not be described in the following embodiments, are also included in the scope of the present disclosure.

First Embodiment

FIG. 1A is a schematic view illustrating an example of a solar cell as one embodiment of the photoelectric conversion element.

The solar cell 50 of FIG. 1A includes a first electrode 2, a dense electron-transporting layer 3, a perovskite layer 5 that is a photoelectric conversion layer, a hole-transporting layer 6, and a second electrode 7.

The first electrode 2 is in contact with the dense electron-transporting layer 3. The dense electron-transporting layer 3 is in contact with the perovskite layer 5.

The perovskite layer 5 is in contact with the hole-transporting layer 6. A film (layer) 21 including a compound represented by General Formula (2) is disposed between the perovskite layer 5 and the hole-transporting layer 6.

The hole-transporting layer 6 is in contact with the second electrode 7.

(Photoelectric Conversion Module)

The photoelectric conversion module of the present disclosure includes a plurality of the photoelectric conversion elements of the present disclosure, where the photoelectric conversion elements are electrically connected in series or parallel.

For example, the photoelectric conversion module includes a substrate, and a plurality of the photoelectric conversion elements disposed on the substrate, and preferably further includes a second substrate that is different from the above-mentioned substrate, and a sealing member. The photoelectric conversion module may further include other members according to the necessity.

Examples of the photoelectric conversion module include a photoelectric conversion module.

The photoelectric conversion module is preferably a photoelectric conversion module, in which a plurality of the photoelectric conversion elements of the present disclosure are disposed on the substrate, and the hole-transporting layers in at least two photoelectric conversion elements next to one another are communicated, and the first electrodes, the electron-transporting layers, and the photoelectric conversion layers in the photoelectric conversion elements next to one another are separated with the hole-transporting layer. In such the photoelectric conversion module, the electron-transporting layer, and the photoelectric conversion layer are respectively divided to reduce recombination of electrons due to scattering, and therefore power generation efficiency can be maintained even after being exposed to light of high illuminance over a long period.

The photoelectric conversion module of the present disclosure can be applied to a power supply device by combining with a circuit board configured to control generated electric current. Examples of devices using the power supply device include an electronic desk calculator, and a watch. Moreover, the power supply device including the photoelectric conversion module of the present disclosure can be also used for a mobile phone, an electronic organizer, and electronic paper. Moreover, the power supply device including the photoelectric conversion module of the present disclosure can be also used as a power supply that can be used during night by combining with an auxiliary power supply or a secondary battery enables to elongate continuous usage time of a chargeable or dry cell-charged electronic device. Furthermore, the power supply device including the photoelectric conversion module can be used as a stand-alone power supply that does not need battery replacement or power supply wiring for IoT devices or satellites.

(Solar Cell Module)

The solar cell module of the present disclosure includes a plurality of the photoelectric conversion elements of the present disclosure, where the photoelectric conversion elements are electrically connected in series or parallel.

The solar cell module of the present disclosure is identical to the photoelectric conversion module.

Examples of the photoelectric conversion element of the present disclosure will be described with reference to drawings hereinafter. However, the present disclosure is not limited to the following embodiments. For example, the number of the following constitutional members, the positions of the following constitutional members, and the shapes of the following constitutional members, which will not be described in the following embodiments, are also included in the scope of the present disclosure.

Second Embodiment

<<Structure of Solar Cell Module>>

FIG. 1B is a cross-sectional view illustrating a cross-sectional structure of the solar cell module of the present disclosure. As illustrated in FIG. 1B, the solar cell module 100 includes photoelectric conversion elements on a first substrate 1, where each photoelectric conversion element includes a first electrode 2, a dense electron-transporting layer (dense layer) 3, a porous electron-transporting layer (porous layer) 4, a perovskite layer 5, a layer including a compound represented by General Formula (2) 6, a hole-transporting layer 7, and a second electrode 7. The first electrode 2 and the second electrode 7 have a path electrically connecting with an electrode extracting terminal.

In the solar cell module 100, moreover, a second substrate 11 is disposed to face the first substrate 1 to arrange the photoelectric conversion element between the second substrate 11 and the first substrate 1, and a sealing member 10 is disposed between the first substrate 1 and the second substrate 11.

In the solar cell module 100, the photoelectric conversion element a includes the first electrode 2*a* and the second electrode 8*a*, and the photoelectric conversion element b includes the first electrode 2*b* and the second electrode 8*b*, and the first electrode 2, the dense layer 3, the porous layer 4, and the perovskite layer 5 in the photoelectric conversion elements a and b are separated by the hole-transporting layer 7 between the photoelectric conversion element a and the photoelectric conversion element b. The hole-transporting layer 7 is a continuous layer.

Third Embodiment

<<Structure of Solar Cell Module>>

FIG. 1C is a cross-sectional view illustrating an example of a cross-sectional structure of the solar cell module of the present disclosure. As illustrated in 1C, the solar cell module 101 includes photoelectric conversion elements on a first substrate 1, where each the photoelectric conversion element includes a first electrode 2, a dense electron-transporting layer (dense layer) 3, a perovskite layer 5, a layer 6 including a compound represented by General Formula (2), a hole-transporting layer 7, and a second electrode 8. The first electrode 2 and the second electrode 7 have a path electrically connecting with an electrode extracting terminal.

In the solar cell module 101, moreover, a second substrate 11 is disposed to face the first substrate 1 to arrange the photoelectric conversion element between the second substrate 11 and the first substrate 1, and a sealing member 10 is disposed between the first substrate 1 and the second substrate 11.

In the solar cell module 101, the first electrode 2, the dense layer 3, and the perovskite layer 5 of the photoelectric conversion element a including the first electrode 2*a* and the first electrode 2, the dense layer 3, and the perovskite layer 5 of the second electrode 8*a* and the photoelectric conversion element b including the first electrode 2*b* and the second electrode 8*b* are separated from each other with the hole-transporting layer 7 that is a continuous layer extended between the photoelectric conversion element a and the photoelectric conversion element b.

Fourth Embodiment

<<Structure of Solar Cell Module>>

FIG. 1D is a cross-sectional view illustrating an example of a cross-sectional structure of the solar cell module of the present disclosure. As illustrated in FIG. 1D, the solar cell module 102 includes photoelectric conversion elements on a first substrate 1, where each photoelectric conversion element includes a first electrode 2, a dense electron-transporting layer (dense layer) 3, a porous electron-transporting layer (porous layer) 4, a perovskite layer 5, a layer 6 including a compound represented by General Formula (2), a hole-transporting layer 7, and a second electrode 8. The first electrode 2 and the second electrode 8 have a path electrically connecting with an electrode extracting terminal.

In the solar cell module 102, moreover, a second substrate 11 is disposed to face the first substrate 1 to arrange the photoelectric conversion element between the second substrate 11 and the first substrate 1, and a sealing member 10 is disposed between the first substrate 1 and the second substrate 11.

In the solar cell module 102, the first electrode 2 and the dense layer 3 of the photoelectric conversion element a including the first electrode 2*a* and the second electrode 8*a* and the first electrode 2 and the dense layer 3 of the photoelectric conversion element b including the first electrode 2*b* and the second electrode 8*b* are separated from each other with the porous layer 4, the perovskite layer 5, and the hole-transporting layer 7 that are continuous layers extended between the photoelectric conversion element a and the photoelectric conversion element b.

Fifth Embodiment

<<Structure of Solar Cell Module>>

FIG. 1E is a cross-sectional view illustrating an example of a cross-sectional structure of the solar cell module of the present disclosure. As illustrated in 1E, the solar cell module 103 includes photoelectric conversion elements on a first substrate 1, where each photoelectric conversion element includes a first electrode 2, a dense electron-transporting layer (dense layer) 3, a porous electron-transporting layer (porous layer) 4, a perovskite layer 5, a layer 6 including a compound represented by General Formula (2), a hole-transporting layer 7, and a second electrode 8. The first electrode 2 and the second electrode 8 have a path electrically connecting with an electrode extracting terminal.

In the solar cell module 103, moreover, a second substrate 11 is disposed to face the first substrate 1 to arrange the photoelectric conversion element between the second substrate 11 and the first substrate 1, and a sealing member 10 is disposed between the first substrate 1 and the second substrate 11.

In the solar cell module 103, the first electrode 2, the dense layer 3, and the porous layer 4 of the photoelectric conversion element a including the first electrode 2*a* and the second electrode 8*a*, and the first electrode 2, the dense layer 3, and the porous layer 4 of the photoelectric conversion element b are separated from each other by the perovskite layer 5 and the hole-transporting layer 7 that are continuous layers extended between the photoelectric conversion element a and the photoelectric conversion element b.

Sixth Embodiment

<<Structure of Solar Cell Module>

FIG. 1F is a cross-sectional view illustrating an example of a cross-sectional structure of the solar cell module of the present disclosure. As illustrated in FIG. 1F, the solar cell module 104 includes photoelectric conversion elements on a first substrate, where each photoelectric conversion element includes a first electrode 2, a dense electron-transporting layer (dense layer) 3, a perovskite layer 5, a film (layer) 6 including a compound represented by General Formula (2), a hole-transporting layer 7, and a second electrode 8. The first electrode 2 and the second electrode 8 have a path electrically connecting with an electrode extracting terminal.

In the solar cell module 104, moreover, a second substrate 11 is disposed to face the first substrate 1 to arrange the photoelectric conversion element between the second substrate 11 and the first substrate 1, and a sealing member 10 is disposed between the first substrate 1 and the second substrate 11.

In the solar cell module 104, the first electrode 2 and the dense layer 3 of the photoelectric conversion element a including the first electrode 2*a* and the second electrode 8*a*, and the first electrode 2 and the dense layer 3 of the photoelectric conversion element b including the first electrode 2*b* and the second electrode 8*b* are separated from each other by the perovskite layer 5 and the hole-transporting layer 7 that are continuous layers extended between the photoelectric conversion element a and the photoelectric conversion element b.

Each of the solar cell modules 100 to 104 is sealed with the first substrate 1, the sealing member 10, and the second substrate 11. Therefore, the moisture content or oxygen concentration inside the hollow section between the second electrode 8 and the second substrate 11 can be controlled. Power generation performance or durability can be improved by controlling the moisture content or the oxygen concentration in the hollow sections of the solar cell modules 100 to 104. Specifically, the moisture content or the oxygen concentration inside the hollow section can be controlled because the solar cell module includes a second substrate arranged to face a first substrate with photoelectric conversion elements being between the first substrate and the second substrate, and a sealing member disposed between the first substrate and the second substrate to seal the photoelectric conversion elements. Therefore, power generation performance and durability of the solar cell modules can be improved.

The oxygen concentration in the hollow section is not particularly limited and may be appropriately selected depending on the intended purpose. The oxygen concentration is preferably 0% or greater but 21% or less, more preferably 0.05% or greater but 10% or less, and even more preferably 0.1% or greater but 5% or less.

In each of the solar cell modules 100 to 104, moreover, the second electrode 8 is not in contact with the second substrate 11, and therefore pealing or breakage of the second electrode 8 can be prevented.

Moreover, each of the solar cell modules 100 to 104 includes a through hole configured to electrically connect between the photoelectric conversion element a and the photoelectric conversion element b. In each of the solar cell modules 100 to 104, the second electrode 8*a* of the photoelectric conversion element a and the first electrode 2*b* of the photoelectric conversion element b are electrically connected via the through hole 8 penetrating through the hole-transporting layer 7 to connect the photoelectric conversion element a and the photoelectric conversion element b in series. As described above, a plurality of the photoelectric conversion elements are connected in series, and therefore open circuit is increased.

The through hole 9 may penetrate through the first electrode 2 to reach the first substrate 1. Alternatively, processing may be stopped when the through hole 9 reaches inside the first electrode 2 so that the through hole 9 does not reach the first substrate 1. When a shape of the through hole 9 is a pore penetrating through the first electrode 2 to reach the first substrate 1, and a total opening area of the pore is excessively large relative to the area of the through hole 9, the resistance value increases as the cross-sectional film area of the first electrode 2 reduces, which may lower a photoelectric conversion efficiency. Therefore, the total opening area of the pore relative to the area of the through hole 9 is preferably 5/100 or greater but 60/100 or less.

Moreover, a formation method of the through hole is not particularly limited and may be appropriately selected depending on the intended purpose. Examples thereof include sand blasting, water blasting, polishing, chemical etching, laser processing, and a method using sand paper. Among the above-listed examples, laser processing is preferable. According to the laser processing, a fine hole can be formed without using sand, etching, or a resist, and processing can be performed cleanly with excellent reproducibility. Another reason why the laser processing is preferable is that, when the through hole 8 is formed, at least one selected from the group consisting of the dense layer 3, the porous layer 4, the perovskite layer 5, the layer 6 including a compound represented by General Formula (2), the hole-transporting layer 7, and the second electrode 8 can be removed through impact peeling by laser processing. As a result, it is not necessary to dispose a mask when layers are laminated, and the removal of the layer and formation of the fine through hole can be easily performed at once.

The perovskite layer of the photoelectric conversion element a may be extended to the perovskite layer of the photoelectric conversion element b, or the perovskite layer of the photoelectric conversion element a may be separated from the perovskite layer of the photoelectric conversion element b. When the perovskite layers are separated, a distance between the perovskite layer of the photoelectric conversion element a and the perovskite layer of the photoelectric conversion element b is preferably 1 micrometer or greater but 100 micrometers or less, and more preferably 5 micrometers or greater but 50 micrometers or less. When the distance between the perovskite layer of the photoelectric conversion element a and the perovskite layer of the photoelectric conversion element b is 1 micrometer or greater but 100 micrometers or less, the porous titanium oxide layer or the perovskite layer is divided to reduce recombination of electrons due to scattering, and therefore power generation efficiency can be maintained even after being exposed to light of high illuminance over a long period. Specifically, among at least two photoelectric conversion elements disposed next one another, a distance between the electron-transporting layer and perovskite layer of one photoelectric conversion element and the electron-transporting layer and perovskite layer of another photoelectric conversion element is 1 micrometer or greater but 100 micrometers or less, and therefore power generation efficiency can be maintained even after being exposed to light of high illuminance over a long period.

The distance between the electron-transporting layer and perovskite layer of one photoelectric conversion element and the electron-transporting layer and perovskite layer of another photoelectric conversion element among at least two photoelectric conversion elements disposed next one another means the minimum distance between the peripheries (edges) of the electron-transporting layers and the perovskite layers of the photoelectric conversion elements disposed next one another.

The solar cell module of the present disclosure can be applied to a power supply device by combining with a circuit board configured to control generated electric current. Examples of devices using the power supply device include an electronic desk calculator, and a watch. Moreover, the power supply device including the photoelectric conversion elements of the present disclosure can be also used for a mobile phone, an electronic organizer, and electronic paper. Moreover, the power supply device including the photoelectric conversion elements of the present disclosure can be also used as a power supply that can be used during night by combining with an auxiliary power supply or a secondary battery enables to elongate continuous use time of a chargeable or dry cell-charged electronic device. Furthermore, the power supply device including the photoelectric conversion elements can be used as a stand-alone power supply that does not need battery replacement or power supply wiring for IoT devices or satellites.

(Electronic Device)

The electronic device of the present disclosure includes the photoelectric conversion element of the present disclosure, or the photoelectric conversion module, or the solar cell module of the present disclosure, or any combination thereof and a device driven by electricity generated through photoelectric conversion performed by the photoelectric conversion element, or the photoelectric conversion module, or the solar cell module, or any combination thereof. The electronic device may further include other devices according to the necessity.

(Power Supply Module)

The power supply module of the present disclosure includes the photoelectric conversion element of the present disclosure, or the photoelectric conversion module, or the solar cell module of the present disclosure, or any combination thereof, and a power supply integrated circuit (IC). The power supply module may further include other devices according to the necessity.

Next, a specific embodiment of the electronic device including the photoelectric conversion module of the present disclosure, the solar cell module of the present disclosure, or a combination thereof, and a device driven by the power generated by the photoelectric conversion module and/or the solar cell module will be described.

FIG. 2 is a block diagram illustrating a mouse of a personal computer as an example of the electronic device of the present disclosure.

As illustrated in FIG. 2, the photoelectric conversion module is combined with the power supply IC, and the electricity storage device, and the electric power supplied is connected to the power source of the control circuit of the mouse. As a result, the electricity storage device can be charged when the mouse is not used, and the charged electricity can be used to drive the mouse, and therefore the mouse that does not need wiring or replacement of a battery can be obtained. Moreover, the weight of the mouse can be reduced as it is not necessary to mount a battery. Therefore, the mouse as the electronic device of the present disclosure is effective.

FIG. 3 is a schematic external view illustrating an example of the mouse of FIG. 2. As illustrated in FIG. 3, the photoelectric conversion module, the power supply IC, and the electricity storage device are mounted inside the mouse, but the upper part of the photoelectric conversion elements is covered with a transparent casing to allow light to reach the photoelectric conversion elements of the photoelectric conversion module. Moreover, the entire casing of the mouse may be formed of a transparent resin. The arrangement of the photoelectric conversion elements is not limited to the arrangement illustrated in FIG. 3. For example, the photoelectric conversion elements may be arranged in a position where the photoelectric conversion elements can be irradiated with light even when the mouse is covered with a hand, and such an arrangement may be preferable in some cases.

Next, another embodiment of the electronic device including the photoelectric conversion module of the present disclosure, and a device driven by electric power generated by the photoelectric conversion module will be described.

FIG. 4 is a block view illustrating a keyboard for a personal computer as an example of the electronic device of the present disclosure.

As illustrated in FIG. 4, the photoelectric conversion elements of the photoelectric conversion module are combined with the power supply IC, and the electricity storage device, and the supplied electricity can be transmitted to a power source of the control circuit of the keyboard. As a result, the electricity storage device can be charged when the keyboard is not used, and the charged electricity can be used to drive the keyboard, and therefore the keyboard that does not need wiring or replacement of a battery can be obtained. Moreover, the weight of the keyboard can be reduced as it is not necessary to mount a battery. Therefore, the keyboard as the electronic device of the present disclosure is effective.

FIG. 5 is a schematic external view illustrating an example of the keyboard illustrated in FIG. 4.

As illustrated in FIG. 5, the photoelectric conversion elements of the photoelectric conversion module, the power supply IC, and the electricity storage device are mounted inside the keyboard, but the upper part of the photoelectric conversion elements is covered with a transparent casing to allow light to reach the photoelectric conversion elements. Moreover, the entire casing of the keyboard may be formed of a transparent resin. The arrangement of the photoelectric conversion elements is not limited to the arrangement illustrated in FIG. 5. In case of a small keyboard having a small space in which the photoelectric conversion element is mounted, as illustrated in FIG. 6, the photoelectric conversion element may be embedded as part of keys, and such an arrangement is effective.

Next, yet another embodiment of the electronic device including the photoelectric conversion module of the present disclosure, and a device driven by electric power generated by the photoelectric conversion module will be described.

FIG. 7 is a block view illustrating a sensor as an example of the electronic device of the present disclosure.

As illustrated in FIG. 7, the photoelectric conversion elements of the photoelectric conversion module are combined with the power supply IC and the electricity storage device, and the supplied electricity is transmitted to the power source of the sensor circuit. As a result, the sensor module can be composed without connecting to an external power source and without performing replacement of a battery. The sensing target may be a temperature and humidity, illuminance, motions of humans, $CO_2$, acceleration, UV, noise, geomagnetism, or pressure. The sensor module can be applied for various sensors and is effective. As illustrated in FIG. 7, the sensor module is configured to sense a target to be measured on a regular basis and to transmit the read data to a personal computer (PC) or a smartphone through wireless communication.

It is expected that use of sensors is significantly increased as the internet of things (IoT) society approaches. To replace batteries of numerous sensors one by one is time consuming and is not realistic. Moreover, the fact that a sensor is installed at a position such as a ceiling and a wall where a cell is not easily replaced also makes workability bad. Moreover, supplying electric power by the photoelectric conversion element is also a significantly large advantage. Furthermore, the photoelectric conversion module of the present disclosure has advantages that high output can be obtained with light of low illuminance, a high degree of freedom in installation can be achieved because the output has low dependency to the light incident angle.

Next, yet another embodiment of the electronic device including the photoelectric conversion module of the present disclosure, and a device driven by electric power generated by the photoelectric conversion module will be described.

FIG. 8 is a block view illustrating a turntable as an example of the electronic device of the present disclosure.

As illustrated in FIG. 8, the photoelectric conversion element is combined with the power supply IC and the electricity storage device, and the supplied electricity is transmitted to the power source of the turntable circuit. As a result, the turntable can be composed without connecting to an external power source and without performing replacement of a battery. The turntable is used, for example, in a display case in which products are displayed. Wiring of a power supply degrades appearance of the display, and moreover displayed products need to be removed at the time of replacing a battery cell, which is time-consuming. Use of the photoelectric conversion module of the present disclosure is effective because the above-mentioned problems can be solved.

The photoelectric conversion module of the present disclosure, the electronic device including a device driven by electric power generated by the photoelectric conversion module, and the power supply module have been described above, but the embodiments described above are only a part of the present disclosure, and use of the photoelectric conversion module of the present disclosure is not limited to the embodiments described above.

<Use>

The photoelectric conversion module of the present disclosure can function as a self-sustaining power supply, and a device can be driven by the electric power generated through photoelectric conversion performed by the photoelectric conversion module. The photoelectric conversion module of the present disclosure can generate power upon irradiation of light. Therefore, the electronic device does not need to connect with a power source, or perform battery replacement. Therefore, the electronic device can be driven in a place where there is no power supply facility, the electronic device can be worn or carried, and the electronic device can be driven without replacement of a battery cell even in a place where a battery cell is not easily replaced. Moreover, when a dry battery cell is used, the electronic device becomes heavy by a weight of the dry battery cell, or the electronic device becomes large by a size of the dry battery cell. Therefore, there may be a problem in installing the electronic device on a wall or ceiling, or transporting the electronic device. Since the photoelectric conversion module of the present disclosure is light and thin, it can be freely installed, and can be worn and carried, which is advantageous.

As described above, the photoelectric conversion module of the present disclosure can be used as a self-sustaining power supply, and can be used in combination with various electronic devices. For example, the photoelectric conversion module of the present disclosure can be used in combination with a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a human detection sensor), transmitters (e.g., a beacon and a global positioning system (GPS)), and numerous electronic devices (e.g., an auxiliary lamp and a remote controller).

Moreover, the photoelectric conversion element or the photoelectric conversion module can be used in a flexible device by imparting flexibility to the photoelectric conversion element or the photoelectric conversion module.

The photoelectric conversion module of the present disclosure is widely applied because the photoelectric conversion element can generate electricity particularly with light of low illuminance and can generate electricity indoors and in dimmed or shaded places. Moreover, the photoelectric conversion element is highly safe because liquid leakage found in the case of a dry battery cell does not occur, and accidental ingestion found in the case of a button battery cell does not occur. Furthermore, the photoelectric conversion module can be used as an auxiliary power supply for the purpose of prolonging a continuous operation time of a charge-type or dry cell-type electronic equipment. By using the photoelectric conversion module of the present disclosure and a device driven by the electric power generated by the photoelectric conversion in combination, as described above, an electronic device that is light in weight and easy to use, has a high degree of freedom in installation, does not require replacement of a battery cell, is highly safe, and is effective in decreasing environmental loads can be obtained.

FIG. 9 illustrates a basic structural view of the electronic device in which the photoelectric conversion module of the present disclosure and the device driven by the electric power generated by the photoelectric conversion. The electronic device can generate electricity when the photoelectric conversion module is irradiated with light, and can extract electric power. A circuit of the device can be driven by the generated electric power.

Since the output of the photoelectric conversion element varies depending on circumferential illuminance, the electronic device illustrated in FIG. 9 may not be stably driven in some cases. In this case, as illustrated in FIG. 10, a power supply IC for a photoelectric conversion element can be incorporated between the photoelectric conversion element and the circuit of the device in order to supply stable voltage to a side of the circuit, and such arrangement is effective.

However, the photoelectric conversion element of the photoelectric conversion module has the following problem. That is, desired electric power cannot be obtained when light of sufficient illuminance is not applied, although the photoelectric conversion element can generate electric power as long as light of sufficient illuminance is applied. In this case, as illustrated in FIG. 11, an electricity storage device, such as a capacitor, is mounted between the power supply IC and a device circuit to store the excessive electric power from the photoelectric conversion element in the electricity storage device. As a result, the electricity stored in the electricity storage device can be supplied to the device circuit even when illuminance of light is too low, or light is not applied to the photoelectric conversion element, and the electronic device can be stably driven.

As described above, the electronic device can be driven in the environment where a power supply is not available, does not require replacement of a battery, and can be stably driven by using the power supply IC or the electricity storage device in the electronic device including the photoelectric conversion module of the present disclosure and the device circuit in combination. Therefore, the advantages obtained by using the photoelectric conversion element can be maximized.

Meanwhile, the photoelectric conversion module of the present disclosure can be also used as a power supply module and use of the photoelectric conversion module as the power supply module is effective. As illustrated in FIG. 12, for example, a DC power supply module capable of supplying electricity generated through photoelectric conversion performed by the photoelectric conversion element of the photoelectric conversion module at a constant voltage level with the power supply IC when the photoelectric conversion module of the present disclosure is connected with the power supply IC for the photoelectric conversion element.

As illustrated in FIG. 13, furthermore, the electricity storage device is combined with the power supply IC. As a result, the electricity generated by the photoelectric conversion element of the photoelectric conversion module can be stored in the electricity storage device, which enables to constitute a power supply module capable of supplying electricity even when illuminance of light is too low, or light is not applied to the photoelectric conversion element.

The power supply module of the present disclosure as illustrated in FIGS. 12 and 13 can be used as a power supply module that does not need to replace a battery cell, unlike a primary battery cell known in the art.

EXAMPLES

The present disclosure will be described below by way of Examples, but should not be construed as being limited to these Examples in any way.

Production Example 1

<Synthesis of Polymer Compound (A-05)>

Polymer Compound (A-05) was synthesized according to the following reaction scheme.

[Chem. 47]

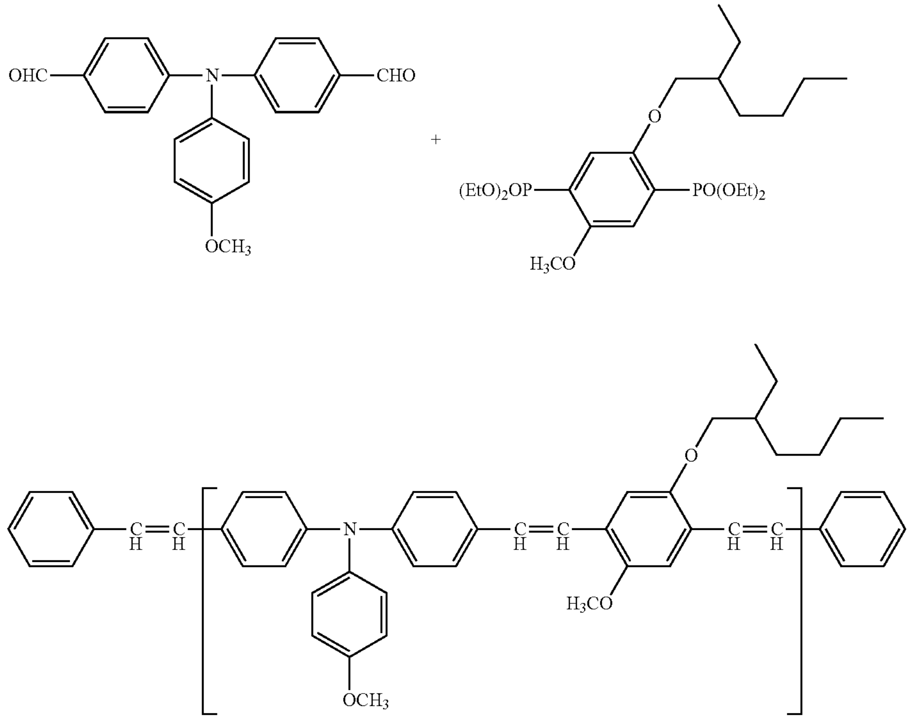

A 100 mL four-necked flask was charged with 0.66 g (2.0 mmol) of the above-represented dialdehyde compound, and 1.02 g (2.0 mmol) of diphosphonate. After purging with nitrogen, 75 mL of tetrahydrofuran was added to the flask. To the resultant solution, 6.75 mL (6.75 mmol) of a 1.0 mol·dm$^{-3}$ potassium t-butoxide tetrahydrofuran solution was added by dripping, followed by stirring for 2 hours at room temperature. Thereafter, diethyl benzylphosphonate, and benzaldehyde were sequentially added, and the resultant mixture was stirred for 2 hours. To the resultant, about 1 mL of acetic acid was added to complete the reaction, and the resultant solution was washed with water. After removing the solvent from the solution under reduced pressure, the resultant was purified through reprecipitation using tetrahydrofuran and methanol, to thereby obtain 0.95 g of Polymer Compound (A-05). The number average molecular weight of Polymer Compound (A-05) determined by polystyrene conversion measured by gel permeation chromatography was 8,500, and the weight average molecular weight thereof was 20,000. The ionization potential measured by means of a photoelectron spectrometer AC-2 available from RIKEN KEIKI CO., LTD. was 5.20 eV. The values of the ionization potential described hereinafter are all values measured by AC-2.

Production Example 2

<Synthesis of Polymer Compound (A-01)>

Polymer Compound (A-01) was synthesized in the same manner as the synthesis of Polymer Compound (A-05), except that the corresponding dialdehyde compound and the corresponding diphosphonate compound for synthesizing Polymer Compound (A-01) were used.

Production Example 3

<Synthesis of Polymer Compound (A-03)>

Polymer Compound (A-03) was synthesized in the same manner as the synthesis of Polymer Compound (A-05), except that the corresponding dialdehyde compound and the corresponding diphosphonate compound for synthesizing Polymer Compound (A-03) were used.

Production Example 4

<Synthesis of Polymer Compound (A-04)>

Polymer Compound (A-04) was synthesized in the same manner as the synthesis of Polymer Compound (A-05), except that the corresponding dialdehyde compound and the corresponding diphosphonate compound for synthesizing Polymer Compound (A-04) were used.

Production Example 5

<Synthesis of Polymer Compound (A-07)>

Polymer Compound (A-07) was synthesized in the same manner as the synthesis of Polymer Compound (A-05), except that the corresponding dialdehyde compound and the corresponding diphosphonate compound for synthesizing Polymer Compound (A-07) were used.

Production Example 6

<Synthesis of Polymer Compound (A-08)>

Polymer Compound (A-08) was synthesized in the same manner as the synthesis of Polymer Compound (A-05), except that the corresponding dialdehyde compound and the corresponding diphosphonate compound for synthesizing Polymer Compound (A-08) were used.

Production Example 7

<Synthesis of Polymer Compound (A-09)>

Polymer Compound (A-09) was synthesized in the same manner as the synthesis of Polymer Compound (A-05), except that the corresponding dialdehyde compound and the corresponding diphosphonate compound for synthesizing Polymer Compound (A-09) were used.

Production Example 8

<Synthesis of Polymer Compound (A-11)>

Polymer Compound (A-11) was synthesized in the same manner as the synthesis of Polymer Compound (A-05), except that the corresponding dialdehyde compound and the corresponding diphosphonate compound for synthesizing Polymer Compound (A-11) were used.

Example 1

<Production of Solar Cell Module 1>

First, a liquid obtained by dissolving 0.36 g of a titanium diisopropoxide bis(acetylacetone) isopropyl alcohol solution (75%) in 10 mL of isopropyl alcohol was applied onto a FTO glass substrate by spin coating, followed by drying for 3 minutes at 120 degrees Celsius. Thereafter, the resultant was fired for 30 minutes at 450 degrees Celsius, to thereby produce a first electrode and a dense electron-transporting layer (dense layer) formed of titanium oxide on the first substrate. The dense layer was formed to have the average thickness of from 10 micrometers through 40 micrometers.

Next, a dispersion liquid obtained by diluting a titanium oxide paste (product name: MPT-20, available from Greatcell Solar Materials Limited) with α-terpineol was applied onto the dense layer by spin coating, followed by drying for 3 minutes at 120 degrees Celsius. Thereafter, the resultant was fired for 30 minutes at 550 degrees Celsius.

Subsequently, a 0.1 M (M=mol/$dm^3$) acetonitrile solution obtained by dissolving lithium bis(trifluoromethanesulfonyl)imide (product number: 38103, available from KANTO CHEMICAL CO., INC.) was applied onto the obtained film by spin coating, followed by firing for 30 minutes at 450 degrees Celsius, to thereby produce a porous electron-transporting layer (porous layer). The porous layer was formed to have the average thickness of 150 nm.

Next, a solution was prepared by adding lead (II) iodide (0.5306 g), lead (II) bromide (0.0736 g), methylamine bromide (0.0224 g), and formamidine iodide (0.1876 g) to N,N-dimethylformamide (0.8 mL), and dimethyl sulfoxide (0.2 mL), and heating and stirring at 60 degrees Celsius. The prepared solution was applied onto the porous layer while adding chlorobenzene (0.3 mL), to thereby form a perovskite film. Thereafter, the film was dried for 30 minutes at 150 degrees Celsius, to thereby produce a perovskite layer. The perovskite layer was formed to have the average thickness of from 200 nm through 350 nm. Moreover, a 1 mM isopropyl alcohol solution obtained by dissolving therein 2-phenylethylammonium bromide as a compound represented by General Formula (2) was applied onto the formed perovskite layer by spin coating, to thereby form a film including a compound represented by General Formula (2).

Next, a hole-transporting compound represented by (D-07) (available from Merck KGaA) was weighed and collected by 73.6 mg, lithium trifluoromethane sulfonyl (Li-TFSI, available from Tokyo Chemical Industry Co., Ltd.) was weighed and collected by 2.4 mg, t-butyl pyridine (tBP, available from Sigma-Aldrich Japan) was weighed and collected by 6.8 mg, and the hole-transporting compound, the Li-TSDI, and the t-butyl pyridine were dissolved in 3.0 mL of chlorobenzene. The obtained solution was applied onto the laminate obtained in the above-described manner by spin coating, to thereby produce a hole-transporting layer. The hole-transporting layer was formed to have the average thickness (the region above the perovskite layer) of 50 nm through 120 nm. Moreover, gold (100 nm) was deposited on the obtained laminate by vacuum vapor deposition, to thereby form a second electrode. In the manner as described above, Solar Cell Module 1 was obtained.

<Evaluation of Solar Cell Characteristics>

Characteristics (initial characteristics) of Solar Cell Module 1 obtained were evaluated by means of a solar cell test system (product name: As-510-PV03, available from NF CORPORATION) with being irradiated with light by a solar simulator (AM 1.5, 100 mW/$cm^2$). The result is presented in Table 2.

<Retention Rate of Conversion Efficiency>

The conversion efficiency of the initial characteristics of Solar Cell Module 1 was determined as n (%). After irradiating Solar Cell Module 1 (AM 1.5, 100 mW/$cm^2$) for 500 hours continuously, the retention rate of the conversion efficiency of the characteristics of Solar Cell Module 1 was determined as ηx (%). The result is presented in Table 2.

The conversion efficiency retention rate ηx (%) being 80% or greater was determined as an excellent effect. The conversion efficiency retention rate ηx (%) was more preferably 90% or greater.

Examples 2 to 8

A solar cell module was produced in the same manner as in Example 1, except that the compound represented by General Formula (1) was replaced with the compound presented in Table 2. The evaluation results are presented in Table 2.

Examples 9 to 12

A solar cell module was produced in the same manner as in Example 1, except that 2-phenylethylammonium bromide (1 mM isopropyl alcohol solution) was replaced with the compound presented in Table 2. The evaluation results are presented in Table 2.

Examples 13 to 16

A solar cell module was produced and evaluated in the same manner as in Example 1, except that 40 microliters of cesium iodide (1.5 M dimethyl sulfoxide solution) was added to the perovskite precursor solution. The evaluation results are presented in Tables 2 and 3.

Example 17

A solar cell was produced and evaluated in the same manner as in Example 1, except that the dense electron-transporting layer (dense layer) was replaced with tin oxide. The evaluation results are presented in Table 3. The film formation method was as follows. First, a tin oxide colloid solution (available from Alfa Aesar) was applied onto an ITO glass substrate, followed by heating and drying for 1 hour at 100 degrees Celsius. Next, a 0.1 mM (M=mol/$dm^3$) ethanol solution obtained by dissolving (1-aminoethyl)phosphonic acid (available Aldrich) was applied onto the film of tin oxide by spin coating, followed by drying for 10 minutes at 70 degrees Celsius.

Examples 18 to 21

A solar cell module was produced and evaluated in the same manner as in Example 1, except that the compound represented by General Formula (1) was replaced with the compound represented in Table 3. The evaluation results are presented in Table 3

Examples 22 to 33

A solar cell module was produced and evaluated in the same manner as in Example 18, except that the hole-transporting material, the additive, and the material of the film disposed between the perovskite layer and the hole-transporting layer were changed to the compounds presented in Table 3. The evaluation results are presented in Table 3.

Comparative Example 1

A solar cell module was produced and evaluated in the same manner as in Example 1, except that 2-phenylethylammonium bromide was not added. The evaluation results are presented in Table 3.

Comparative Example 2

A solar cell module was produced and evaluated in the same manner as in Example 1, except that 2-phenylethylammonium bromide was replaced with Compound A below. The evaluation results are presented in Table 3.

[Chem. 48]

Compound A

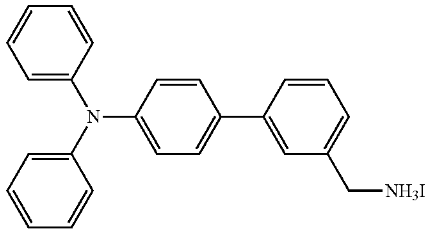

Comparative Example 3

A solar cell module was produced and evaluated in the same manner as in Example 24, except that 2-phenylethylammonium bromide was not added. The evaluation results are presented in Table 3.

Comparative Example 4

A solar cell module was produced and evaluated in the same manner as in Example 25, except that 2-phenylethylammonium bromide was not added. The evaluation results are presented in Table 3.

Comparative Example 5

A solar cell module was produced and evaluated in the same manner as in Example 27, except that 2-phenylethylammonium bromide was replaced with Compound A below. The evaluation results are presented in Table 3.

[Chem. 49]

Compound A

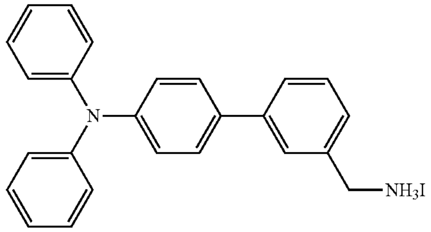

TABLE 2

| | Polymer compound | Additive | Compound included in film between perovskite layer and hole-transporting layer | Evaluation result η | ηx (%) |
|---|---|---|---|---|---|
| Ex. 1 | D-07 | LiTFSI tBP | 2-phenylethylammonium bromide (1 mM-isopropyl alcohol solution) | 15.7 | 92.0 |
| Ex. 2 | D-10 | LiTFSI tBP | 2-phenylethylammonium bromide (1 mM-isopropyl alcohol solution) | 15.9 | 93.0 |

TABLE 2-continued

| | Polymer compound | Additive | Compound included in film between perovskite layer and hole-transporting layer | Evaluation result η | ηx (%) |
|---|---|---|---|---|---|
| Ex. 3 | P3HT | LiTFSI tBP | 2-phenylethylammonium bromide (1 mM-isopropyl alcohol solution) | 10.2 | 83.0 |
| Ex. 4 | PTAA | LiTFSI tBP | 2-phenylethylammonium bromide (1 mM-isopropyl alcohol solution) | 11.4 | 84.0 |
| Ex. 5 | A-07 | LiTFSI tBP | 2-phenylethylammonium bromide (1 mM-isopropyl alcohol solution) | 10 | 82.0 |
| Ex. 6 | A-09 | LiTFSI tBP | 2-phenylethylammonium bromide (1 mM-isopropyl alcohol solution) | 10.2 | 83.0 |
| Ex. 7 | A-11 | LiTFSI tBP | 2-phenylethylammonium bromide (1 mM-isopropyl alcohol solution) | 10.5 | 84.0 |
| Ex. 8 | A-08 | LiTFSI tBP | 2-phenylethylammonium bromide (1 mM-isopropyl alcohol solution) | 10.1 | 81.0 |
| Ex. 9 | A-07 | LiTFSI tBP | 2-phenylethylammonium iodide (1 mM-isopropyl alcohol solution) | 10.9 | 80.0 |
| Ex. 10 | A-07 | LiTFSI tBP | 6-aminopentanoic acid hydrobromide (1 mM-isopropyl alcohol solution) | 10.5 | 82.0 |
| Ex. 11 | A-07 | LiTFSI tBP | tetramethylammonium bromide (1 mM-ethanol solution) | 10.5 | 83.0 |
| Ex. 12 | A-07 | LiTFSI tBP | N-methylpyridinium bromide (10 mM-acetonitrile solution) | 10 | 81.0 |
| Ex. 13 | A-07 | LiTFSI tBP | 2-phenylethylammonium bromide (1 mM-isopropyl alcohol solution) | 10.5 | 89.0 |
| Ex. 14 | A-11 | LiTFSI tBP | 2-phenylethylammonium bromide (1 mM-isopropyl alcohol solution) | 10.9 | 81.0 |
| Ex. 15 | A-07 | LiTFSI tBP | tetramethylammonium bromide (1 mM-ethanol solution) | 10.3 | 82.0 |

TABLE 3

| | Polymer compound | Additive | Compound included in film between perovskite layer and hole-transporting layer | Evaluation result η (%) | ηx (%) |
|---|---|---|---|---|---|
| Ex. 16 | A-07 | LiTFSI tBP | 5-aminopentanoic acid hydrobromide (1 mM-isopropyl alcohol solution) | 11.2 | 88.0 |
| Ex. 17 | A-07 | LiTFSI tBP | 2-phenylethylammonium bromide (1 mM-isopropyl alcohol solution) | 11.4 | 87.0 |
| Ex. 18 | A-01 | LiTFSI tBP | 2-phenylethylammonium bromide (1 mM-isopropyl alcohol solution) | 12.8 | 81 |
| Ex. 19 | A-03 | LiTFSI tBP | 2-phenylethylammonium bromide (1 mM-isopropyl alcohol solution) | 14.3 | 80 |
| Ex. 20 | A-04 | LiTFSI tBP | 2-phenylethylammonium bromide (1 mM-isopropyl alcohol solution) | 13.2 | 82 |
| Ex. 21 | A-05 | LiTFSI tBP | 2-phenylethylammonium bromide (1 mM-isopropyl alcohol solution) | 13.3 | 84 |
| Ex. 22 | D-07 | B-14 | 2-phenylethylammonium bromide (1 mM-isopropyl alcohol solution) | 17.7 | 92 |
| Ex. 23 | P3HT | B-14 | 2-phenylethylammonium bromide (1 mM-isopropyl alcohol solution) | 15.3 | 90 |
| Ex. 24 | PTAA | B-14 | 2-phenylethylammonium bromide (1 mM-isopropyl alcohol solution) | 16.1 | 92 |
| Ex. 25 | A-05 | B-14 | 2-phenylethylammonium bromide (1 mM-isopropyl alcohol solution) | 17.9 | 95 |
| Ex. 26 | A-05 | B-14 | 2-phenylethylammonium iodide (1 mM-isopropyl alcohol solution) | 17.6 | 96 |
| Ex. 27 | A-05 | B-14 | E-2 (1 mM-isopropyl alcohol solution) | 18.1 | 92 |
| Ex. 28 | A-05 | B-14 | E-3 (1 mM-isopropyl alcohol solution) | 16.2 | 89 |
| Ex. 29 | A-05 | B-14 | E-5 (1 mM-isopropyl alcohol solution) | 16.3 | 88 |
| Ex. 30 | A-05 | B-14 | E-7 (1 mM-isopropyl alcohol solution) | 17.5 | 90 |
| Ex. 31 | A-05 | B-14 | E-8 (1 mM-isopropyl alcohol solution) | 18.1 | 91 |
| Ex. 32 | A-05 | B-14 | E-9 (1 mM-isopropyl alcohol solution) | 16.8 | 89 |

TABLE 3-continued

| | Polymer compound | Additive | Compound included in film between perovskite layer and hole-transporting layer | Evaluation result η (%) | ηx (%) |
|---|---|---|---|---|---|
| Ex. 33 | A-05 | B-14 | E-11 (1 mM-isopropyl alcohol solution) | 17.2 | 90 |
| Comp. Ex. 1 | D-07 | LiTFSI tBP | isopropyl alcohol | 15.2 | 48 |
| Comp. Ex. 2 | D-07 | LiTFSI tBP | Compound A | 15.3 | 63 |
| Comp. Ex. 3 | PTAA | LiTFSI tBP | isopropyl alcohol | 15.8 | 47 |
| Comp. Ex. 4 | A-05 | B-14 | isopropyl alcohol | 16.8 | 49 |
| Comp. Ex. 5 | A-05 | B-14 | Compound A | 16.9 | 68 |

In Tables 2 and 3, the abbreviations represent as follows.

"η" is photoelectric conversion efficiency.

"PTAA" in Example 4, Example 24, and Comparative Example 3 means poly[bis(4-phenyl) (2,4,6-trimethylphenyl)amine](available from Merck KGaA).

It was found from Examples 1 to 33 and Comparative Examples 1 to 5 that the photoelectric conversion element that could maintain power generation efficiency even after being exposed to light of high illuminance over a long period was obtained when the film including the compound represented by General Formula (2) was disposed the photoelectric conversion layer and the hole-transporting layer.

For example, embodiments of the present disclosure are as follows.

<1> A photoelectric conversion element, including:

a first electrode;

a photoelectric conversion layer, where the photoelectric conversion layer has a perovskite structure;

a hole-transporting layer;

a second electrode; and a film including a compound represented by General Formula (2) disposed between the photoelectric conversion layer and the hole-transporting layer, A-X General Formula (2)

where, in General Formula (2), A is a cationic amino compound represented by General Formula (6) or General Formula (7), a cationic pyridinium compound, a cationic imidazolinium compound, or a cationic pyrrolidinium compound, and X is a halogen ion,

[Chem. 50]

General Formula (6)

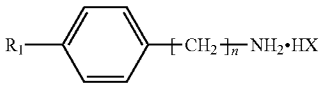

where, in General Formula (6), $R_1$ is —H, —F, —$CF_3$, or —$OCH_3$, n is 1 or 2, and X is Br or 1,

[Chem. 51]

General Formula (7)

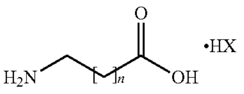

where, in General Formula (7), n is an integer of 5 or greater but 12 or less, and X is Br or I.

<2> The photoelectric conversion element according to <1>, wherein the photoelectric conversion layer includes a compound represented by General Formula (3), $X_\alpha Y_\beta Z_\gamma$ General Formula (3)

where, in General Formula (3), a ratio α:β:γ is 3:1:1, and β and γ are each an integer greater than 1, X is a halogen atom, Y is an organic compound including an amino group, and Z is a metal ion.

<3> The photoelectric conversion element according to <1> or <2>, wherein the photoelectric conversion layer includes at least one selected from the group consisting of a Sb atom, a Cs atom, a Rb atom, and a K atom.

<4> The photoelectric conversion element according to any one of <1> to <3>, further including an electron-transporting layer, wherein the electron-transporting layer includes tin oxide.

<5> The photoelectric conversion element according to any one of <1> to <4>, wherein the hole-transporting layer includes a compound represented by General Formula (1),

[Chem. 52]

General Formula (1)

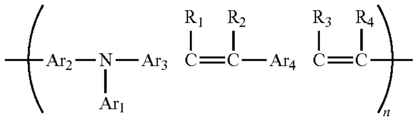

where, in General Formula (1), $Ar_1$ is an aromatic hydrocarbon group that may include a substituent; $Ar_2$ and $Ar_3$ are each independently a bivalent group of a monocyclic, non-condensed polycyclic, or condensed polycyclic aromatic hydrocarbon group that may include a substituent; $Ar_4$ is a bivalent group of benzene, thiophene, biphenyl, anthracene, or naphthalene that may include a substituent; $R_1$ to Ra are each independently a hydrogen atom, an alkyl group, or an aryl group; and n is an integer of 2 or greater.

<6> The photoelectric conversion element according to any one of <1> to <5>, wherein the compound represented by General Formula (1) is a compound represented by General Formula (4),

[Chem. 53]

General Formula (4)

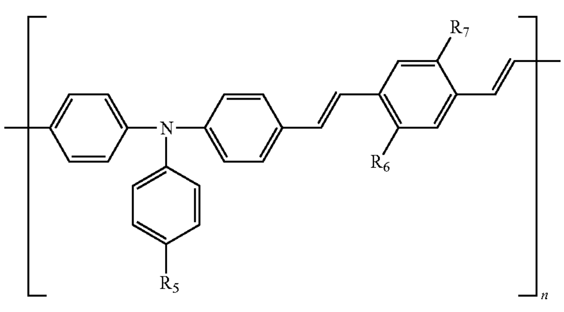

where, in General Formula (4), $R_5$ is a methyl group or a methoxy group, $R_6$ and $R_7$ are each an alkoxy group, and n is an integer of 2 or greater.

<7> The photoelectric conversion element according to any one of <1> to <6>, wherein the hole-transporting layer includes a compound represented by General Formula (5),

[Chem. 54]

General Formula (5)

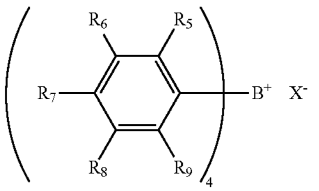

where, in General Formula (5), $R_5$ to $R_9$ are each a hydrogen atom, a halogen atom, an alkyl group, an alkoxy group, or an aryl group, where $R_5$ to $R_9$ may be identical or different, and X is a cation.

<8> A solar cell module, including a plurality of the photoelectric conversion elements according to any one of <1> to <7>, where the photoelectric conversion elements are connected in series or parallel.

<9> A photoelectric conversion module including a plurality of the photoelectric conversion elements according to any one of <1> to <7>, where the photoelectric conversion elements are connected in series or parallel.

<10> An electronic device, including:

the photoelectric conversion element according to any one of <1> to <7>, or the solar cell module according to <8>, or the photoelectric conversion module according to <9>, or any combination thereof; and a device driven by electricity generated through photoelectric conversion performed by the photoelectric conversion element according to any one of <1> to <7>, the solar cell module according to <8>, or the photoelectric conversion module according to <9>.

<11> An electronic device, including:

the photoelectric conversion element according to any one of <1> to <7>, or the solar cell module according to <8>, or the photoelectric conversion module according to <9>, or any combination thereof;

a storage cell configured to store electricity generated through photoelectric conversion performed by the photoelectric conversion element according to any one of <1> to <7>, the solar cell according to <8>, or the photoelectric conversion module according to <9>; and a device driven by electricity generated through photoelectric conversion performed by the photoelectric conversion module, or electricity stored in the storage cell, or both.

<12> A power supply module, including:

the photoelectric conversion element according to any one of <1> to <7>, the solar cell module according to <8>, or the photoelectric conversion module according to <9>, or any combination thereof; and a power supply IC.

The photoelectric conversion element according to any one of <1> to <7>, the photoelectric conversion module according to <8>, the photoelectric conversion module according to <9>, the electronic device according to <10> or <11>, and the power supply module according to <12> can solve the above-described various problems existing in the art, and can achieve the object of the present disclosure.

REFERENCE SIGNS LIST

2: first electrode
3: dense electron-transporting layer (dense layer)
5: perovskite layer
6: hole-transporting layer
7: second electrode
21: film including compound represented by General Formula (2)
50: solar cell

The invention claimed is:

1. A photoelectric conversion element, comprising:

a first electrode;

a photoelectric conversion layer, where the photoelectric conversion layer has a perovskite structure;

a hole-transporting layer;

a second electrode; and a film including a compound represented by General Formula (2) disposed between the photoelectric conversion layer and the hole-transporting layer, A-X General Formula (2)

where, in General Formula (2), A is a cationic amino compound represented by General Formula (6), General Formula (7), a cationic imidazolinium compound, or a cationic pyrrolidinium compound, General Formula (7)

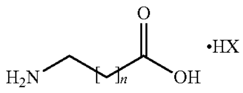

where, in General Formula (7), n is an integer of 5 or greater but 12 or less, and X is Br or I, General Formula (6)

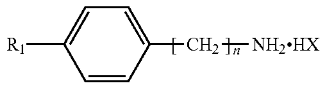

where, in General Formula (6), $R_1$ is —H, —F, —$CF_3$, or —$OCH_3$, n is 1 or 2, and X is Br or I, and wherein the hole-transporting layer comprises a compound represented by General Formula (4) and a compound represented by General Formula (5);

General Formula (4)

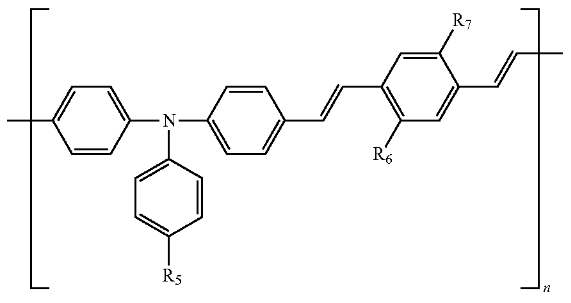

where, in General Formula (4), $R_5$ is a methyl group or a methoxy group, $R_6$ and $R_7$ are each an alkoxy group, and n is an integer of 2 or greater, General Formula (5)

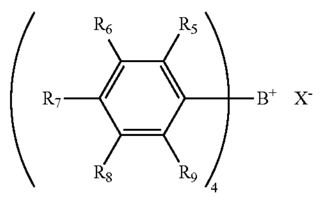

where, in General Formula (5), $R_5$ to $R_9$ are each a hydrogen atom, a halogen atom, an alkyl group, an alkoxy group, or an aryl group, where $R_5$ to $R_9$ may be identical or different, and X is a cation.

2. The photoelectric conversion element according to claim 1, wherein the photoelectric conversion layer includes a compound represented by General Formula (3), $X_\alpha Y_\beta Z_\gamma$ General Formula (3)

where, in General Formula (3), a ratio $\alpha:\beta:\gamma$ is 3:1:1, and $\beta$ and $\gamma$ are each an integer greater than 1, X is a halogen atom, Y is an organic compound including an amino group, and Z is a metal ion.

3. The photoelectric conversion element according to claim 1, wherein the photoelectric conversion layer includes at least one selected from the group consisting of a Sb atom, a Cs atom, a Rb atom, and a K atom.

4. The photoelectric conversion element according to claim 1, further comprising an electron-transporting layer, wherein the electron-transporting layer includes tin oxide.

5. A solar cell module, comprising a plurality of the photoelectric conversion elements according to claim 1, where the photoelectric conversion elements are connected in series or parallel.

6. The photoelectric conversion element according to claim 1, where in General Formula (2), A is a compound represented by General Formula (7).

7. The photoelectric conversion element according to claim 1, where in General Formula (2), A is a cationic imidazolinium compound.

8. The photoelectric conversion element according to claim 1, where in General Formula (2), A is a cationic pyrrolidinium compound.

9. An electronic device, including the solar cell module according to claim 5; and a device driven by electricity generated through photoelectric conversion performed by the solar cell module.

10. A power supply module, including the solar cell module according to claim 5; and a power supply IC.

11. The photoelectric conversion element according to claim 2, where in General Formula (2), A is a compound represented by General Formula (7).

12. The photoelectric conversion element according to claim 3, where in General Formula (2), A is a compound represented by General Formula (7).

13. The photoelectric conversion element according to claim 4, where in General Formula (2), A is a compound represented by General Formula (7).

14. The photoelectric conversion element according to claim 1, wherein the compound represented by General Formula (2) is a compound represented by E-2 or E-8, (E-2)

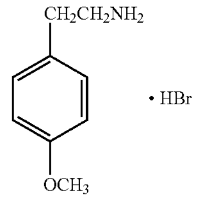

(E-8)

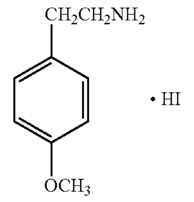

wherein the compound represented by General Formula (4) is a compound represented by A-05, (A-05)

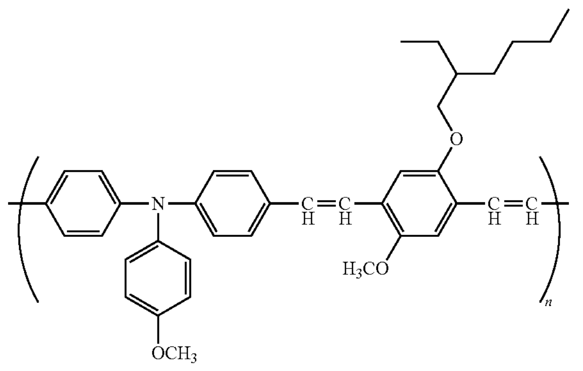

and wherein the compound represented by General Formula (5) is a compound represented by (B-14)

(B-14)

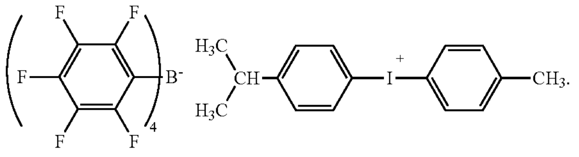

15. The photoelectric conversion element according to claim 1, wherein the compound represented by General Formula (7) is employed and comprises 5-aminopentanoic acid hydroiodide, 5-aminopentanoic acid hydrobromide, 6-aminohexanoic acid hydroiodide, 6-aminohexanoic acid hydrobromide, 7-aminoheptanoic acid hydroiodide, 7-aminoheptanoic acid hydrobromide, 8-aminoheptanoic acid hydroiodide, 8-aminoheptanoic acid hydrobromide, 9-aminononaoic acid hydroiodide, 9-aminononaoic acid hydrobromide, 10-aminodecanoic acid hydroiodide, 10-aminodecanoic acid hydrobromide, 11-aminoundecanoic acid hydroiodide, 12-aminoundecanoic acid hydrobromide, 12-aminododecanoic acid hydroiodide, or 12-aminododecanoic acid hydrobromide.

* * * * *